(12) United States Patent
Davis et al.

(10) Patent No.: US 8,545,049 B2
(45) Date of Patent: Oct. 1, 2013

(54) SYSTEMS, METHODS, AND DEVICES FOR SEALING LED LIGHT SOURCES IN A LIGHT MODULE

(75) Inventors: Matthew A. Davis, Orange, CA (US); Reed Alan Bradford, Peachtree City, GA (US); Ellis Patrick, Sharpsburg, GA (US)

(73) Assignee: Cooper Technologies Company, Houston, TX (US)

( * ) Notice: Subject to any disclaimer, the term of this patent is extended or adjusted under 35 U.S.C. 154(b) by 435 days.

(21) Appl. No.: 12/954,074

(22) Filed: Nov. 24, 2010

(65) Prior Publication Data

US 2011/0157891 A1 Jun. 30, 2011

Related U.S. Application Data

(60) Provisional application No. 61/264,522, filed on Nov. 25, 2009, provisional application No. 61/359,060, filed on Jun. 28, 2010.

(51) Int. Cl.
  *F21V 5/04* (2006.01)
(52) U.S. Cl.
  USPC ..................................... 362/244; 362/249.02
(58) Field of Classification Search
  USPC ................ 362/218, 217.02, 237, 244, 249.02
  See application file for complete search history.

(56) References Cited

U.S. PATENT DOCUMENTS

| | | | |
|---|---|---|---|
| 2,254,961 A | 9/1941 | Harris | |
| 2,394,992 A | 2/1946 | Franck | |
| 2,908,197 A | 10/1959 | Wells et al. | |
| 3,596,136 A | 7/1971 | Fischer | |
| 3,647,148 A | 3/1972 | Wince | |
| 3,927,290 A | 12/1975 | Denley | |
| 4,345,308 A | 8/1982 | Mouyard et al. | |
| 4,734,836 A | 3/1988 | Negishi | |

(Continued)

FOREIGN PATENT DOCUMENTS

| | | |
|---|---|---|
| EP | 1431653 | 6/2004 |
| GB | 718425 | 11/1954 |

(Continued)

OTHER PUBLICATIONS

Timinger, "Tailored Optical Surfaces Step up Illumination Design," Europhonics; Aug./Sep. 2002.

(Continued)

*Primary Examiner* — David V Bruce
(74) *Attorney, Agent, or Firm* — King & Spalding LLP

(57) ABSTRACT

A light module includes one or more LEDs coupled to a circuit board, a lens disposed over at least one LED, and an adhesive layer disposed between each LED and the lens. A flange extends from at least one side of the lens. The adhesive layer fixes the lens in an optical alignment over the corresponding LED. The adhesive layer includes at least one of a non-permeable layer with an adhesive material on the top and bottom surfaces, a gas-permeable layer with an adhesive material on the top and bottom surfaces, a deposited material, and an over mold material. An alignment tool including one or more optical recesses and one or more alignment features is used in the assembly of at least one of an optical assembly and a light module that includes the optical assembly. The alignment tool facilitates precise alignment of the lenses over the LEDs.

45 Claims, 34 Drawing Sheets

(56) References Cited

U.S. PATENT DOCUMENTS

| | | | |
|---|---|---|---|
| 4,860,177 A | 8/1989 | Simms | |
| 4,907,044 A | 3/1990 | Schellhorn et al. | |
| 4,941,072 A | 7/1990 | Yasumoto | |
| 5,102,558 A | 4/1992 | McDougall et al. | |
| 5,636,057 A | 6/1997 | Dick et al. | |
| 5,924,788 A | 7/1999 | Parkyn, Jr. | |
| 5,939,996 A | 8/1999 | Kniveton et al. | |
| 6,045,240 A | 4/2000 | Hochstein | |
| 6,050,707 A | 4/2000 | Kondo et al. | |
| 6,227,685 B1 | 5/2001 | McDermott | |
| 6,273,596 B1 | 8/2001 | Parkyn, Jr. | |
| 6,341,466 B1 | 1/2002 | Kehoe et al. | |
| 6,345,800 B1 | 2/2002 | Herst et al. | |
| 6,441,558 B1 | 8/2002 | Muthu et al. | |
| 6,461,008 B1 | 10/2002 | Pederson | |
| 6,502,956 B1 | 1/2003 | Wu | |
| 6,536,923 B1 | 3/2003 | Merz | |
| 6,560,038 B1 | 5/2003 | Parkyn et al. | |
| 6,582,103 B1 | 6/2003 | Popovich et al. | |
| 6,598,998 B2 | 7/2003 | West et al. | |
| 6,639,733 B2 | 10/2003 | Minano | |
| 6,784,357 B1 | 8/2004 | Wang | |
| 6,785,053 B2 | 8/2004 | Savage, Jr. | |
| 6,837,605 B2 | 1/2005 | Reill | |
| 6,850,001 B2 | 2/2005 | Takekuma | |
| 6,895,334 B2 | 5/2005 | Yabe | |
| 6,942,361 B1 | 9/2005 | Kishimura et al. | |
| 6,948,838 B2 | 9/2005 | Kunstler | |
| 6,965,715 B2 | 11/2005 | Lei | |
| 6,997,580 B2 | 2/2006 | Wong | |
| 7,070,310 B2 | 7/2006 | Pond et al. | |
| 7,073,931 B2 | 7/2006 | Ishida | |
| 7,102,172 B2 | 9/2006 | Lynch et al. | |
| 7,104,672 B2 | 9/2006 | Zhang | |
| 7,153,015 B2 | 12/2006 | Brukilacchio | |
| 7,172,319 B2 | 2/2007 | Holder | |
| 7,181,378 B2 | 2/2007 | Benifez | |
| 7,204,627 B2 | 4/2007 | Ishida | |
| 7,278,761 B2 | 10/2007 | Kuan | |
| 7,281,820 B2 | 10/2007 | Bayat et al. | |
| 7,322,718 B2 | 1/2008 | Setomoto et al. | |
| D563,036 S | 2/2008 | Miyairi et al. | |
| 7,329,029 B2 | 2/2008 | Chaves et al. | |
| 7,339,200 B2 | 3/2008 | Amano et al. | |
| 7,347,599 B2 | 3/2008 | Minano et al. | |
| 7,348,723 B2 | 3/2008 | Yamaguchi et al. | |
| 7,352,011 B2 | 4/2008 | Smits et al. | |
| 7,374,322 B2 | 5/2008 | Steen et al. | |
| 7,410,275 B2 | 8/2008 | Sommers et al. | |
| D577,852 S | 9/2008 | Miyairi et al. | |
| 7,460,985 B2 | 12/2008 | Benitez | |
| 7,461,948 B2 | 12/2008 | Van Voorst Vader et al. | |
| 7,507,001 B2 | 3/2009 | Kit | |
| 7,572,654 B2 | 8/2009 | Chang | |
| 7,582,913 B2 | 9/2009 | Huang et al. | |
| 7,618,162 B1 | 11/2009 | Parkyn et al. | |
| 7,618,163 B2 | 11/2009 | Wilcox | |
| 7,625,102 B2 | 12/2009 | Koike et al. | |
| 7,651,240 B2 | 1/2010 | Bayat et al. | |
| 7,674,018 B2 | 3/2010 | Holder et al. | |
| 7,748,872 B2 | 7/2010 | Holder et al. | |
| 7,775,679 B2 | 8/2010 | Thrailkill et al. | |
| 7,777,405 B2 | 8/2010 | Steen et al. | |
| 7,809,237 B2 | 10/2010 | Pozdnyakov et al. | |
| 7,841,750 B2 | 11/2010 | Wilcox et al. | |
| 7,854,536 B2 | 12/2010 | Holder et al. | |
| 7,942,559 B2 | 5/2011 | Holder et al. | |
| 7,972,035 B2 | 7/2011 | Boyer | |
| 7,972,036 B1 | 7/2011 | Schach et al. | |
| 7,993,036 B2 | 8/2011 | Holder et al. | |
| 8,007,140 B2 | 8/2011 | Zhang et al. | |
| 8,025,428 B2 | 9/2011 | Duguay et al. | |
| 8,210,722 B2 | 7/2012 | Holder et al. | |
| 2002/0034081 A1 | 3/2002 | Serizawa | |
| 2002/0196623 A1 | 12/2002 | Yen | |
| 2003/0067787 A1 | 4/2003 | Serizawa | |
| 2003/0099115 A1 | 5/2003 | Reill | |
| 2004/0037076 A1 | 2/2004 | Katoh et al. | |
| 2004/0070855 A1 | 4/2004 | Benitez et al. | |
| 2004/0105171 A1 | 6/2004 | Minano et al. | |
| 2004/0105261 A1 | 6/2004 | Ducharme | |
| 2004/0105264 A1 | 6/2004 | Spero | |
| 2004/0189933 A1 | 9/2004 | Sun et al. | |
| 2004/0207999 A1 | 10/2004 | Suehiro | |
| 2004/0218388 A1 | 11/2004 | Suzuki | |
| 2004/0222947 A1 | 11/2004 | Newton et al. | |
| 2004/0228127 A1 | 11/2004 | Squicciarini | |
| 2005/0073849 A1 | 4/2005 | Rhoads et al. | |
| 2005/0207165 A1 | 9/2005 | Shimizu et al. | |
| 2006/0034082 A1 | 2/2006 | Park | |
| 2006/0039143 A1 | 2/2006 | Katoh | |
| 2006/0081863 A1 | 4/2006 | Kim et al. | |
| 2006/0083003 A1 | 4/2006 | Kim et al. | |
| 2006/0138437 A1 | 6/2006 | Huang et al. | |
| 2006/0238884 A1 | 10/2006 | Jang | |
| 2006/0245083 A1 | 11/2006 | Chou et al. | |
| 2006/0250803 A1 | 11/2006 | Chen | |
| 2006/0255353 A1 | 11/2006 | Taskar | |
| 2006/0285311 A1 | 12/2006 | Chang et al. | |
| 2007/0019416 A1 | 1/2007 | Han | |
| 2007/0058369 A1 | 3/2007 | Parkyn et al. | |
| 2007/0063210 A1 | 3/2007 | Chiu | |
| 2007/0066310 A1 | 3/2007 | Haar | |
| 2007/0076414 A1 | 4/2007 | Holder | |
| 2007/0081340 A1 | 4/2007 | Chung et al. | |
| 2007/0091615 A1 | 4/2007 | Hsieh et al. | |
| 2007/0183736 A1 | 8/2007 | Pozdnyakov | |
| 2007/0201225 A1 | 8/2007 | Holder | |
| 2007/0205425 A1 | 9/2007 | Harada | |
| 2008/0013322 A1 | 1/2008 | Ohkawa | |
| 2008/0025044 A1 | 1/2008 | Park et al. | |
| 2008/0100773 A1 | 5/2008 | Hwang | |
| 2008/0174996 A1 | 7/2008 | Lu | |
| 2008/0239722 A1 | 10/2008 | Wilcox | |
| 2008/0273327 A1 | 11/2008 | Wilcox et al. | |
| 2009/0027884 A1* | 1/2009 | Chou | 362/240 |
| 2010/0014290 A1 | 1/2010 | Wilcox | |
| 2010/0172135 A1 | 7/2010 | Holder et al. | |
| 2010/0238669 A1 | 9/2010 | Holder et al. | |

FOREIGN PATENT DOCUMENTS

| | | |
|---|---|---|
| GB | 794670 | 5/1958 |
| GB | 815609 | 7/1959 |
| JP | 06-177424 | 6/1994 |
| JP | 11/154766 | 9/1997 |
| JP | 2001-517855 | 9/1998 |
| JP | 2005-062461 | 3/2005 |
| KR | 10-2006-0033572 | 4/2006 |
| KR | 10-2006-0071033 | 6/2006 |
| KR | 10-0729825 | 6/2007 |
| KR | 10-2008-0097912 | 11/2008 |
| WO | WO 9624802 | 8/1996 |
| WO | WO 98/33007 | 7/1998 |
| WO | WO 03044870 | 5/2003 |
| WO | WO 2004/068909 | 8/2004 |
| WO | WO 2005/041254 | 5/2005 |
| WO | WO 05/057082 | 6/2005 |
| WO | WO 2005/057082 | 6/2005 |
| WO | WO 2005/093316 | 10/2005 |
| WO | WO 2007/100837 | 9/2007 |
| WO | WO 2008/144672 | 11/2008 |
| WO | WO 2010/19810 | 2/2010 |
| WO | WO 2011/098515 | 8/2011 |

OTHER PUBLICATIONS

International Search Report and Written Opinion of PCT/US2010/058048; mailed on Aug. 9, 2011.

Streetworks fixture from Cooper Lighting and 2 Ies files, Aug. 14, 2001.

Bisberg, *LED Magazine*, The 5mm Package Versus the Power LED: Not a Light choice for the Luminaire Designer, pp. 19-21, Dec. 2005.

*LED Magazine*, p. 36 Oct. 2005.

International Search Report and Written Opinion for WO 2010/019810 mailed Sep. 30, 2009.
International Search Report and Written Opinion for WO 2008/144672 mailed Nov. 27, 2008.
ISR and Written Opinion of ISA, PCT/US07/05118 mailed Mar. 11, 2008.
Bortz, "Optimal Design of a Non imaging Projection Lens for Use with an LED Light Source and a Rectangular Sheet." SPIE, pp. 130-138, vol. 4092, USA, published 2000.
International Search Report for PCT/US08/64168 mailed on Aug. 15, 2008.
Extended Search Report for EP Application No. 11006191 mailed Nov. 7, 2011.
Extended Search Report for EP Application No. 11006189 mailed Nov. 7, 2011.
Extended Search Report for EP Application No. 11006190 mailed Nov. 7, 2011.
Ries, Harold & Julius Muschaweck, *Tailored Freeform Optical Surfaces*, Optical Society of America, vol. 19, No. 3, Mar. 2002.
Extended Search Report for EP Application No. 08755907.6 mailed May 10, 2012.
Jolley L.B.W. et al., The Therory and Design of Illuminating Engineering Equipment, 1931.
Order; Case No. 11-CV-34-JPS; United States District Court Eastern District of Wisconsin; Jun. 8, 2012; (referencing U.S. Patent Nos. 7,674,018 and 7,993,036).
International Search Report for PCT/US11/049388 mailed on Apr. 9, 2012.
Timinger, Andreas, "Optical Design for LED-Street Lamps," Conference Paper, Solid-State and Organic Lighting (SOLED), Karlsruhe, Germany, Jun. 21, 2010.
Order, Case No. 11-CV-34-JPS; United States District Court Eastern District of Wisconsin; filed Oct. 31, 2012.
LED's Magazine; High-Power Led's; multi-watt LED light Engines Offer Challenges and Opportunities; ledmagazine.com Oct. 2005.
Timinger, "Tailored Optical Surfaces Step up Illumination Design," Europhonics; Aug./Sep. 2002 (color copy).
Ruud Lighting's Notice Pursuant to 35 U.S.C. §282; Civil Action 2:11-cv-00034-JPS; Oct. 12, 2012.

* cited by examiner

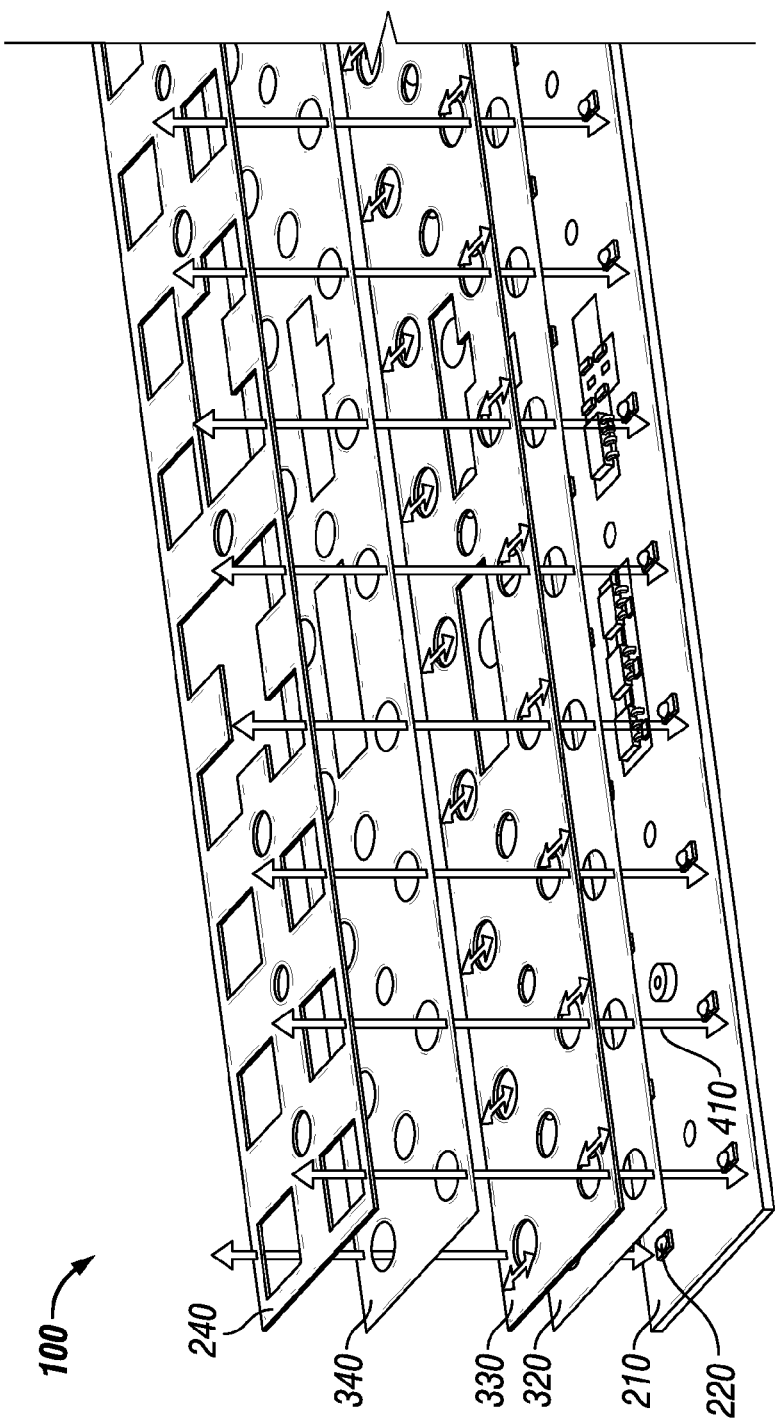

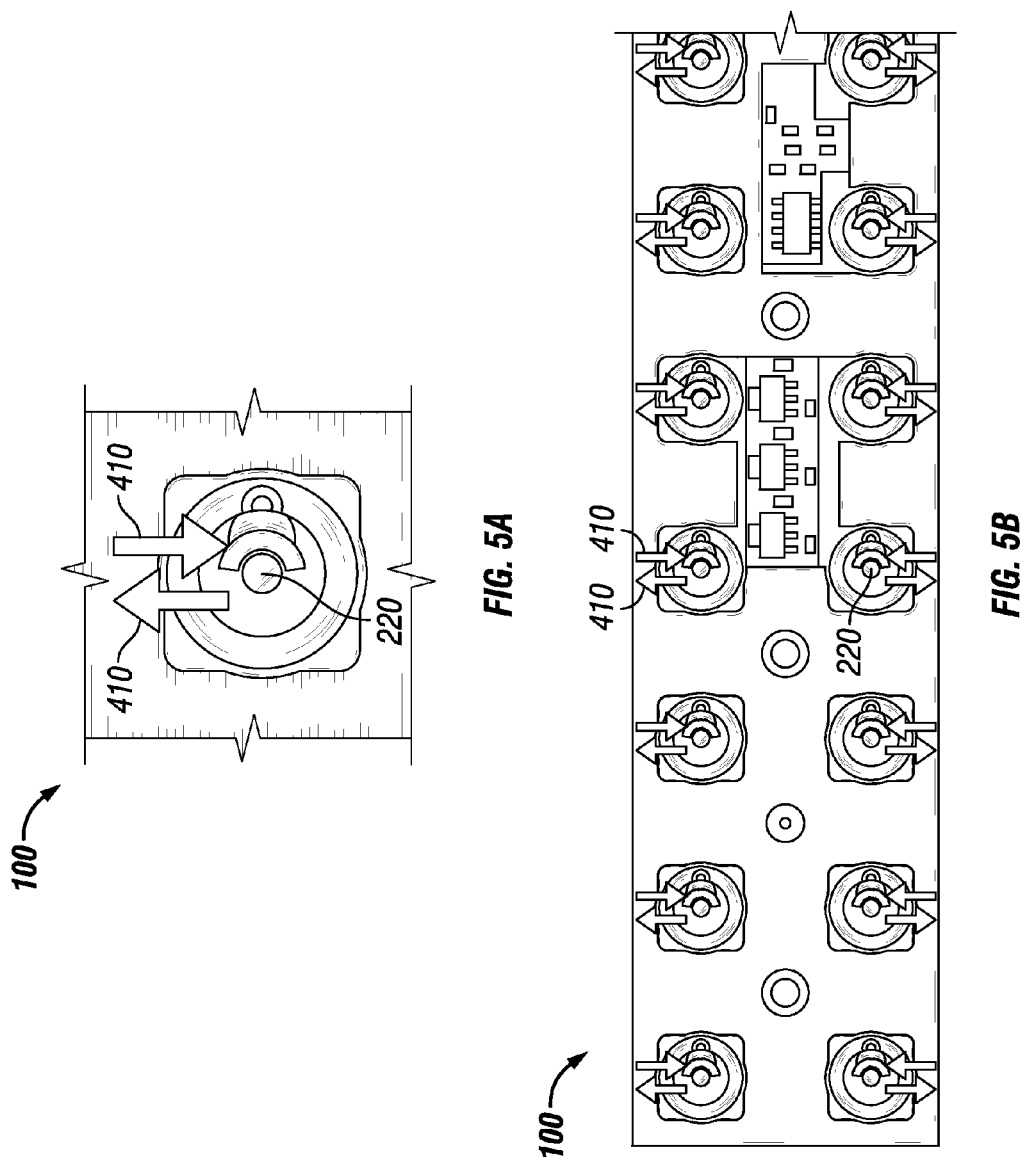

SYSTEMS, METHODS, AND DEVICES FOR SEALING LED LIGHT SOURCES IN A LIGHT MODULE

CROSS-REFERENCE TO RELATED APPLICATIONS

This application claims priority to U.S. Provisional Patent Application No. 61/264,522, entitled "Systems, Methods, and Devices for Sealing LED Light Sources in a Light Module," filed Nov. 25, 2009, and to U.S. Provisional Patent Application No. 61/359,060, entitled "Systems, Methods, and Devices for an Air Permeable LED Light Module," filed Jun. 28, 2010, the entirety of both of which are incorporated by reference herein.

TECHNICAL FIELD

Embodiments of the invention relate generally to light emitting diode ("LED") light module construction, and more particularly to systems, methods, and devices for providing air permeable passages between the LED light sources of the light module and the surrounding environment.

BACKGROUND

There are many advantages to the use of light emitting diode (LED) die packages as light sources in light fixtures to produce light efficiently. Many light fixtures have incorporated arrays of LED light sources often configured in a bar-shaped housing or module (also referred to as a "light bar" or "LightBAR™").

A light bar is connected to or includes a heat dissipating carrier to which the LEDs are thermally coupled. This heat dissipating carrier to which the LEDs are attached is typically made of extruded or die-cast bar of metal, such as a heat conductive aluminum alloy, and may provide heat dissipation to allow proper cooling of the LED, or may have an additional heat sink or other heat dissipating means attached. Alternatively, the heat dissipating carrier is fabricated using other thermally conductive materials. In most light bars, the printed circuit board connects the LEDs to a power source. Often, the circuit board is laminated to the extruded or die-cast bar. The light bars may further include circuitry to drive the LEDs included in one or more arrays of LED light sources. Typically, the LED arrays are made up of LED die packages that each include an LED light source with a lens (or primary optic), where each of the LED die packages are in turn associated with an optical system (or secondary optic) to control and/or maximize the light emitted from the LED die package. In other configurations, the LED light source may only have one over-optic to refract light. The light bars may further include circuitry to drive the LEDs included in the array. Each of the secondary optics aligned with the LED light source may be varied in shape and/or individually rotated to create a beam pattern for the array that is unique from the devices themselves, including all degrees of freedom, e.g. separately determined translation, tilt, and yaw for each lens. The array may include similarly colored LEDs, white or otherwise, or various colored LEDs.

Light bars are often shown as a rectangular flat bar, but can assume any two dimensional planar shape, such as square, circular, hexagonal, triangular or an arbitrary freeform shape. The light bar, either individually or combined with other light bars, can be the basis of a luminaire that is used for street lighting, pathway lighting, parking structure lighting, decorative lighting, and any other type of spread beam applications. With the heat sink and power incorporated on or into the light bar, the light bar can be incorporated into existing luminaires or integrated into new luminaire designs.

Light bars provide the ability to generate a particular beam pattern with an array of LEDs which are mounted on a flat or planar plate, which most likely would be parallel to the street or floor. Light bars also provide thermal and electrical distribution required for the LEDs as well as provide means for protecting the array of LEDs from environmental damage. Conventional methods of sealing against water and dust intrusion for the coupling of the LED die package and the secondary optical system have included the use of elastomers (e.g., vulcanized seals). However, the process of sealing against water and dust intrusion has also limited the amount of air flow to and from the LED die package. The LED die package is tightly sealed between the circuit board on the bottom, the acrylic over-optic on the top, and elastomers around the perimeter of the LED die package and the over-optic between the over-optic and the circuit board. This substantially air-tight seal prevents gas exchange from the LED die package and the volume created by the over-optic. Further, it prevents heat and contaminants from exiting that same area. These issues can lead to degradation of the LED die package and premature failure.

SUMMARY

One exemplary embodiment of the invention includes a light module. The light module can include a plurality of light emitting diodes ("LEDs"), at least one lens, and an adhesive layer. The LEDs can be coupled to a circuit board. Each lens can be disposed over at least one LED of the plurality of LEDs. Each lens can include a flange extending from at least one side of the lens. The adhesive layer can be disposed between each LED and the lens. The adhesive layer can fix the lens in an optical alignment over the corresponding LED.

Another exemplary embodiment of the invention includes a light module. The light module can include a plurality of LED die packages, at least one secondary lens, and an over mold material. The LED die packages can include an LED and a primary lens. The LED die packages can be coupled to a circuit board. Each secondary lens can be disposed over at least one LED of the plurality of LEDs. Each secondary lens can include a flange extending from at least one side of the secondary lens. The over mold material can be disposed over at least a portion of the circuit board and at least a portion of the flange of each secondary lens. The over mold material can harden to fix the secondary lens in an optical alignment over the LED die package.

Another exemplary embodiment of the invention includes a method of manufacturing a light module. The method can include providing a plurality of LED die packages, providing at least one secondary lens, and injecting an over mold material. The LED die packages can include an LED and a primary lens. The LED die packages can be coupled to a circuit board. Each secondary lens can be disposed over at least one LED of the plurality of LEDs. Each secondary lens can include a flange extending from at least one side of the secondary lens. The over mold material can be injected over at least a portion of the circuit board and at least a portion of the flange of each secondary lens. The over mold material can harden to fix the secondary lens in an optical alignment over the LED die package.

Another exemplary embodiment of the invention includes a method of manufacturing a light module. The method can include providing a plurality of LED die packages, providing at least one secondary lens, and depositing an adhesive layer.

The LED die packages can include an LED and a primary lens. The LED die packages can be coupled to a circuit board. Each secondary lens can be disposed over at least one LED of the plurality of LEDs. Each secondary lens can include a flange extending from at least one side of the secondary lens. The adhesive layer can be deposited between each LED die package and the secondary lens. The adhesive layer can fix the secondary lens in an optical alignment over the LED die package.

Another exemplary embodiment of the invention includes a method of manufacturing a light module. The method can include providing a plurality of LED die packages, providing at least one secondary lens, and providing an adhesive layer. The LED die packages can include an LED and a primary lens. The LED die packages can be coupled to a circuit board. Each secondary lens can be disposed over at least one LED of the plurality of LEDs. Each secondary lens can include a flange extending from at least one side of the secondary lens. The adhesive layer can be disposed between each LED die package and the secondary lens. The adhesive layer can fix the secondary lens in an optical alignment over the LED die package.

Another exemplary embodiment of the invention includes a light module. The light module can include a plurality of LEDs, at least one lens, and a gas-permeable layer. The LEDs can be coupled to a circuit board. Each lens can be disposed over at least one LED of the plurality of LEDs. Each lens can include a flange extending from at least one side of the lens. The gas-permeable layer can be disposed between the circuit board and each lens. The gas-permeable layer can include a top side and a bottom side, where the bottom side can include a first adhesive material and the top side can include a second adhesive material. The first adhesive material can adhere the gas-permeable layer to the circuit board and the second adhesive material can fix the lens in an optical alignment over the corresponding LED.

Another exemplary embodiment of the invention includes a light module. The light module can include a plurality of LEDs, at least one lens, and a tape layer. The LEDs can be coupled to a circuit board. Each lens can be disposed over at least one LED of the plurality of LEDs. Each lens can include a flange extending from at least one side of the lens. The tape layer can be disposed between the circuit board and each lens. The tape layer can include a top side and a bottom side, where the bottom side can include a first adhesive material and the top side can include a second adhesive material. The first adhesive material can adhere the tape layer to the circuit board.

Another exemplary embodiment of the invention includes a light module. The light module can include a plurality of LEDs, at least one lens, a first layer, a second layer, a first adhesive material, a second adhesive material, and a third adhesive material. The LEDs can be coupled to a circuit board. Each lens can be disposed over at least one LED of the plurality of LEDs. Each lens can include a flange extending from at least one side of the lens. The first layer can be disposed between the circuit board and each lens. The first layer can include a plurality of first openings and a plurality of first apertures. Each first opening can be configured to be disposed around at least a portion of one of the LEDs. Each first aperture can be in fluid communication with one of the first openings and can extend outside of a footprint of the lens disposed over the associated first opening. The second layer can be disposed between the first layer and each lens. The second layer can include a plurality of second openings and a plurality of third openings. Each second opening can be configured to be disposed around at least a portion of one of the LEDs and substantially vertically aligned with one of the plurality of first openings. Each third opening can be vertically aligned with one of the plurality of first openings. The first adhesive material can be disposed between the first layer and the circuit board and can adhere the first layer to the circuit board. The second adhesive material can be disposed between the first layer and the second layer and can adhere the first and second layers together. The third adhesive material can be disposed above the second layer.

Another exemplary embodiment of the invention includes a light module. The light module can include a circuit board, a conformal coating, a plurality of LEDs, at least one lens, a first layer, a first adhesive material, and a second adhesive material. The circuit board can include a top surface. The conformal coating can be applied to a portion of the top surface of the circuit board, thereby creating at least one air channel on the top surface of the circuit board. The LEDs can be coupled to a circuit board. Each lens can be disposed over at least one LED of the plurality of LEDs. Each lens can include a lens cavity and a flange extending from at least one side of the lens. At least one lens cavity can be in fluid communication with at least one of the air channels. The first layer can be disposed between the circuit board and each lens. The first layer can include a plurality of first openings and a plurality of second openings. Each first opening can be configured to be disposed around at least a portion of one of the LEDs. Each second opening can be vertically aligned with and in fluid communication with at least one of the air channels. The first adhesive material can be disposed between the first layer and the circuit board and can adhere the first layer to the conformal coating on the top surface of the circuit board. The second adhesive material can be disposed above the first layer.

Another exemplary embodiment of the invention includes a light module. The light module can include a circuit board, at least one air channel, a plurality of LEDs, at least one lens, a first layer, a first adhesive material, and a second adhesive material. The circuit board can include a top surface. The air channel can be etched into the top surface of the circuit board. The LEDs can be coupled to a circuit board. Each lens can be disposed over at least one LED of the plurality of LEDs. Each lens can include a lens cavity and a flange extending from at least one side of the lens. At least one lens cavity can be in fluid communication with at least one of the air channels. The first layer can be disposed between the circuit board and each lens. The first layer can include a plurality of first openings and a plurality of second openings. Each first opening can be configured to be disposed around at least a portion of one of the LEDs. Each second opening can be vertically aligned with and in fluid communication with at least one of the air channels. The first adhesive material can be disposed between the first layer and the circuit board and can adhere the first layer to the top surface of the circuit board. The second adhesive material can be disposed above the first layer.

Another exemplary embodiment of the invention includes a method of manufacturing an optical assembly. The method can include providing an alignment tool. The alignment tool can include one or more optical recesses and one or more first alignment features. The method also can include inserting an optic into one or more of the optical recesses. The method also can include adhesively coupling an adhesive layer to the optics. The adhesive layer can include one or more second alignment features. The first and second alignment features can be substantially vertically aligned when the adhesive layer is adhesively coupled to the optics. The method also can include compressing the adhesive layer to at least the optics.

The method also can include removing at least the compressed adhesive layer and the optics from the alignment tool.

Another exemplary embodiment of the invention includes a method of manufacturing a light module. The method can include providing an alignment tool. The alignment tool can include one or more optical recesses and one or more first alignment features. The method also can include placing an optical assembly into the alignment tool. The optical assembly can include one or more second alignment features and one or more optics coupled to at least an adhesive layer. Each optic can be inserted into a corresponding optical recess. The first and second alignment features can be substantially vertically aligned. The method also can include adhesively coupling a circuit board to the adhesive layer of the optical assembly. The circuit board can include one or more third alignment features. The first, second, and third alignment features can be substantially vertically aligned. The method also can include compressing the circuit board to at least the optical assembly.

Another exemplary embodiment of the invention includes an alignment tool. The alignment tool can include a platform having a top surface. The platform can include one or more alignment features and one or more optical recesses. The alignment features and the optical recesses can be positioned on the top surface. The optical recesses can be configured to receive an optic.

Another exemplary embodiment of the invention includes a light module. The light module can include a circuit board, a plurality of light emitting diodes (LEDs), at least one lens, an adhesive layer, and at least one air channel. The circuit board can include a top surface. The LEDs can be coupled to the circuit board. Each lens can be disposed over at least one LED of the plurality of LEDs and can include a lens cavity. The adhesive layer can be disposed between the circuit board and each lens and can include a plurality of first openings where each first opening can be configured to be disposed substantially around at least a portion of one of the LEDs. At least one air channel can be formed substantially along the top surface of the circuit board. The air channels can extend from at least one lens cavity to an edge of the light module. The air channels can provide fluid communication between at least one lens cavity and an outside environment located exterior to the light module.

BRIEF DESCRIPTION OF THE DRAWINGS

The foregoing and other features and aspects of the invention are best understood with reference to the following description of certain exemplary embodiments, when read in conjunction with the accompanying drawings, wherein:

FIG. 4 is an exploded view of a portion of the LED light bar of FIG. 3 showing representative air paths between the LED die package and the outside environment in accordance with the exemplary embodiment of FIG. 3;

FIGS. 5A and 5B are a pair of top plan views of a portion of the LED light bar of FIG. 3 showing representative air paths between the LED die package and the outside environment in accordance with the exemplary embodiment of FIG. 3;

Figure 1:
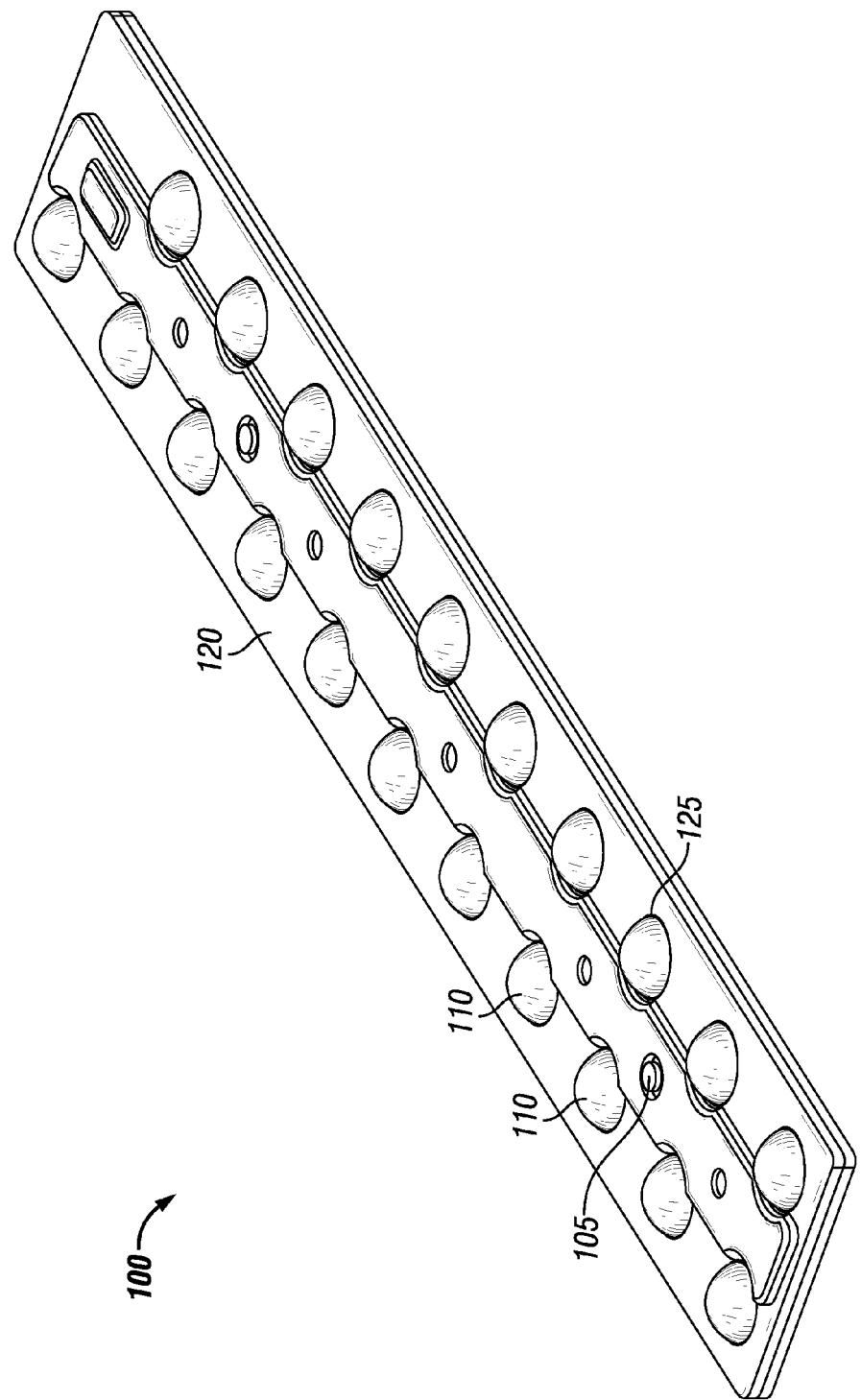
FIG. 1 is a perspective view of a complete LED light bar including one or more optics in accordance with embodiments of the present invention.

The drawings illustrate only exemplary embodiments of the invention and are therefore not to be considered limiting of its scope, as the invention may admit to other equally effective embodiments.

BRIEF DESCRIPTION OF EXEMPLARY EMBODIMENTS

Some exemplary embodiments of the present invention are directed to an LED light bar having air permeable cavities, sections or layers to allow air to transition between the area surrounding the LED and the exterior of the light bar. Some of these exemplary embodiments of the invention also are directed to fixing optical components over LED die packages for light modules such as LED light bars incorporated into light fixtures while maintaining environmental protection for the light bar. For instance, in some exemplary embodiments of the invention, a high performance adhesive "sandwich" layer is added to the substrate of a printed circuit board such that the adhesive layer locates the optical component, particularly in the vertical (or "Z") axis, relative to the light source, seals the optic to the substrate containing the LED die packages (e.g., circuit board), and/or provides one or more air pathways for allowing air to transition between the area surrounding the LED and the exterior of the light bar. This high performance adhesive "sandwich" layer is fabricated is various manners, which are described below. In another embodiment of the invention, an adhesive material, such as silicone, is applied to the substrate of a printed circuit board that seals the optic relative to the light source. In some exemplary embodiments, the application of the adhesive and placement of the optics are accomplished manually using a fixture for placement. Alternatively, according to some exemplary embodiments, the application of the adhesive and placement of the optics are automated by a computer controlled machine, including placing the optics on a tape and reel feeder (or magazine) with a "pick and place" machine. In yet another exemplary embodiment of the invention, an injection molded material is used to rigidly fix the array of optics as one solid piece. The seal or bond provided by the various exemplary embodiments of the invention may be such that the seal or bond satisfies ingress protection (IP) standards established to ensure component protection from various environmental elements (e.g., water, dirt, etc.).

The systems and methods described herein may provide several advantages including providing better weatherproofing seals between the optical components and LED die packages and more accurate alignment of the optical components and LED die packages when attaching and sealing an existing optic to a PC board maintaining the existing relationship between the optic and the LED. The systems, methods, and apparatuses described herein allow for better consistency in large scale manufacturing of light bars as well as achieve a more robust light bar that is more weather resistant, environmentally resilient, and in some cases, submersible.

According to some exemplary embodiments, a primary lens is disposed over and around one or more LEDs or LED die packages and a secondary lens is disposed over and around one or more primary lens. The term "optic" refers to either the primary or the secondary lens.

Embodiments of the invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to persons having ordinary skill in the art. Like numbers refer to like elements throughout.

Embodiments of the invention also are described below with reference to block diagrams and flowchart illustrations of systems, methods, and apparatuses. It will be understood that each block of the block diagrams and flowchart illustrations, and combinations of blocks in the block diagrams and flowchart illustrations, can be implemented manually or by special purpose hardware-based computer systems that perform the specified functions, elements or steps, or combinations of special purpose hardware and computer instructions. With respect to computer program instructions, they may be loaded onto a general purpose computer, special purpose computer such as a CNC machine, or other programmable data processing apparatus to produce a machine, such that the instructions which execute on the computer or other programmable data processing apparatus create means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means that implement the function specified in the flowchart block or blocks. The computer program instructions may also be loaded onto a computer or other programmable data-processing apparatus to cause a series of operational elements or steps to be performed on the computer or other programmable apparatus to produce a computer-implemented process such that the instructions that execute on the computer or other programmable apparatus provide elements or steps for implementing one or more functions specified in the flowchart block or blocks.

Figure 2:
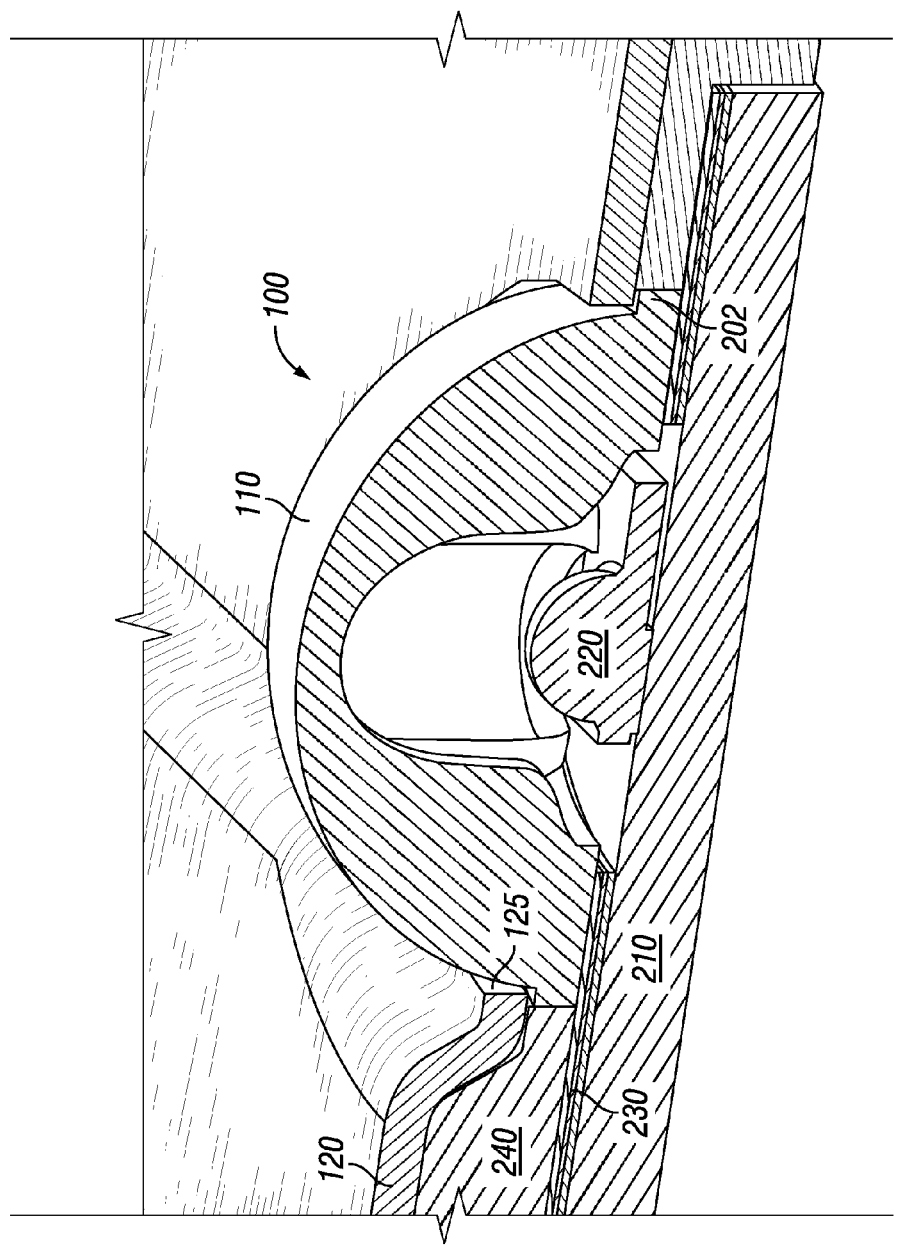
FIG. 2 is a cross-sectional view of a portion of a complete LED light bar in accordance with one embodiment of the present invention.

FIG. 1 is a perspective view of a complete LED light bar 100 including one or more optics 110 in accordance with exemplary embodiments of the present invention. FIG. 2 is a cross-sectional view of a portion of a complete LED light bar 100 in accordance with one exemplary embodiment of the present invention. Referring to FIGS. 1 and 2 and in accordance with the exemplary embodiment illustrated in FIG. 2, the complete light bar 100 includes a common substrate 210, one or more LEDs or LED die packages 220 mounted to the common substrate 210, an adhesive layer 230, a gap filler 240, one or more optics 110, and a cover 120.

According to some exemplary embodiments, the common substrate 210, hereinafter referred to as a printed circuit board or PC board, includes one or more sheets of ceramic, metal, laminate, circuit board, Mylar®, or another material. The PC board 210 also includes several apertures 212 for receiving screws 105 (FIG. 1). According to one exemplary embodiment, the apertures 212 lie axially and centrally along the length of the PC board 210; however, these apertures 212 can lie in a different pattern in other exemplary embodiments. The PC board 210 provides a convenient means to provide power to the LEDs 220 and are known to people having ordinary skill in the art. However, other means for conveying power to the LEDs 220 also are contemplated herein, for example, connectors, sockets, plugs, direct wiring, and other means known to people having ordinary skill in the art.

Each LED or LED die package 220 includes at least one chip of semi-conductive material that is treated to create a positive-negative ("p-n") junction. When the LED or LED die package 220 is electrically coupled to a power source, such as a driver 310 (FIG. 3), current flows from the positive side to the negative side of each junction, causing charge carriers to release energy in the form of incoherent light.

The adhesive layer 230 is disposed between the surface of the PC board 210 and at least a flange portion 202 of one or more optics 110 that are disposed over each LED or LED die package 220. One example of the adhesive layer 230 is a high performance, double-sided tape. The adhesive layer 230 includes multiple layers, also referred to as a sandwich of layers, according to some exemplary embodiments, while in other exemplary embodiments, the adhesive layer 230 includes a single layer. A bottom surface 232 of the adhesive layer 230 adheres to the surface of the substrate 210, while at least a portion of a top surface 234 of the adhesive layer 230 adheres to at least the flange portion 202 of one or more optics 110. In certain exemplary embodiments, the adhesive layer 230 protects the LEDs or LED die packages 220 and the PC board 210 from environmental contaminants. In some exemplary embodiments, the adhesive layer 230 includes one or more gas-permeable layers that allows air and/or other gases to permeate therethrough. Specifically, the adhesive layer 230 facilitates the exchange of air or gas between the area surrounding the LED or LED die packages 220 and the exterior of the light bar 100. Some examples of gas-permeable layers include, but are not limited to, Tyvek®, high density polyethylene, burlap, canvas, silicone, and other gas-permeable materials known to people having ordinary skill in the art.

The gap filler 240 is disposed between the adhesive layer 230 and the cover 120 and positioned adjacent to the flange portion 202. The gap filler 240 adheres to at least a portion of the top surface 234 of the adhesive layer 230. According to some exemplary embodiments, the gap filler 240 provides additional sealing and weather proofing benefits. However, in some exemplary embodiments, these benefits are achieved by the adhesive layer 230 without the use of the gap filler 240, thereby making the gap filler 240 optional. The gap filler 240 is fabricated using Tyvek®, however, other materials, including, but not limited to, high density polyethylene, burlap, canvas, and other thermoplastics and other non-woven materials known to people having ordinary skill in the art, can be used for fabricating the gap filler 240.

The optic 110 includes the flange portion 202 and is disposed over the LED or LED die package 220. The optic 110 receives the light emitted from the LED or LED die package 220 and distributes the light to a desired illumination area. The optic 110 can be disposed over either a single LED or LED die package 220 or multiple LEDs or multiple LED die packages 220. According to some exemplary embodiments, the optic 110 is designed to receive light from the LED or LED die package 220 that the optic 110 is disposed over and direct light to the desired illumination area in a predetermined manner, which includes one or more of direction, pattern, and intensity. Each optic 110 used in the light bar 100 is designed the same according to some exemplary embodiments, while one or more optics 110 are designed differently than another optic 110 used in the same light bar 100 in accordance with other exemplary embodiments. The optic 110 is fabricated using an acrylic material; however, the optic 110 can be fabricated using other transparent or translucent material, such as glass.

The cover 120 is disposed over at least a portion of the flange portion 202 of each optic 110 and the gap filler 240, if utilized. In the embodiments where the gap filler 240 is not used, the cover is disposed over at least a portion of the flange portion 202 of each optic 110 and the adhesive layer 230. The cover 120 includes one or more apertures 125 that allow for a portion of the optics 110 to extend beyond the surface of the cover 120. The cover 120 is fabricated using a metal or metal alloy; however, other suitable materials can be used in other exemplary embodiments.

Figure 3:
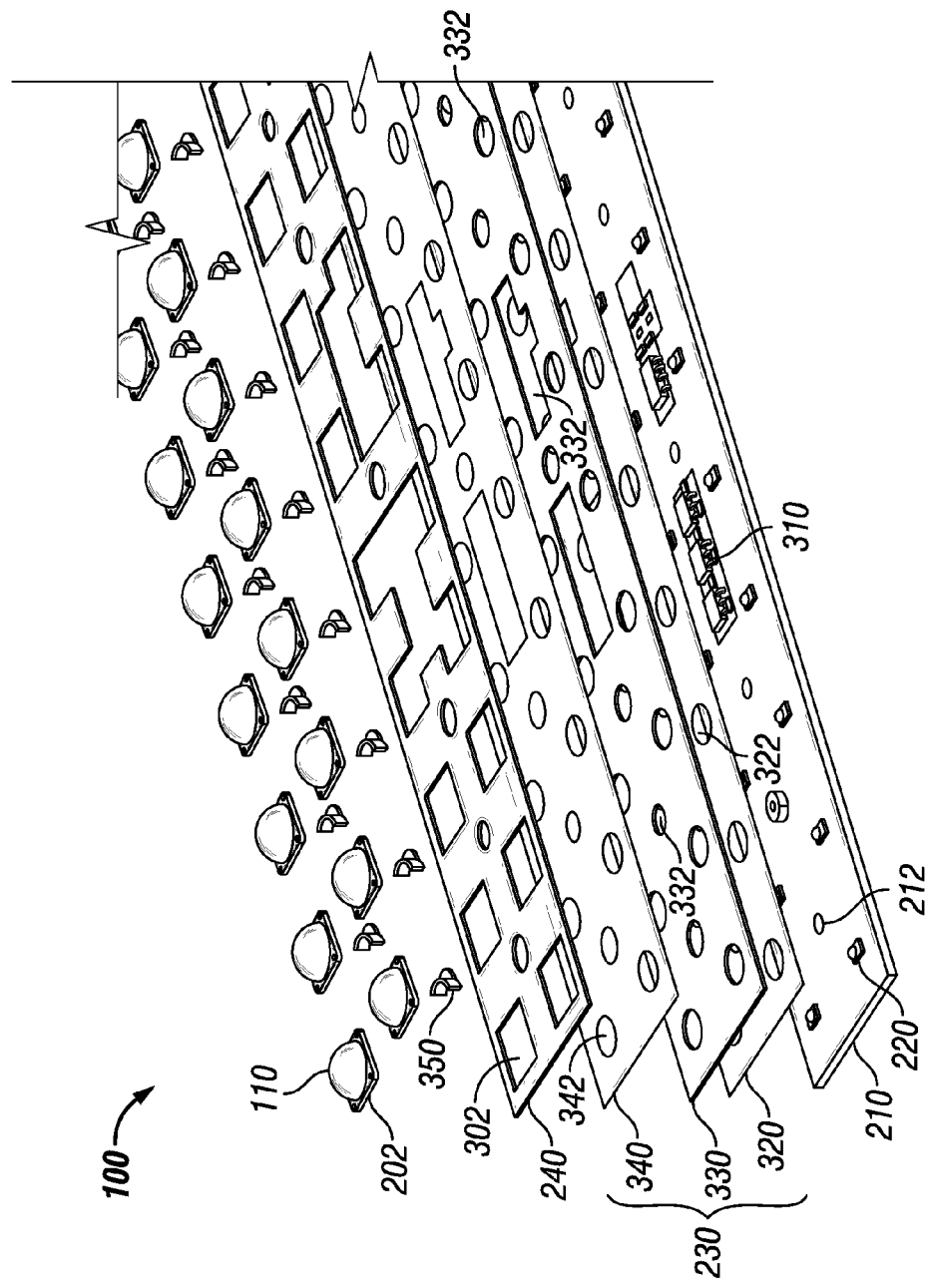
FIG. 3 is an exploded view of an LED light bar without the cover in accordance with one exemplary embodiment of the present invention.

FIGS. 3-7 present an exemplary embodiment for an LED light bar 100 having one or more air permeable layers that provide a pathway for air to enter and exit the area surrounding each LED die package 220. FIG. 3 is an exploded view of the LED light bar 100 without the cover 120 in accordance with one exemplary embodiment of the present invention. Referring now to FIG. 3, the exemplary LED light bar 100 includes the PC board 210, one or more LEDs or LED die packages 220 mounted to the PC board 210, the adhesive layer 230, the gap filler 240, and one or more optics 110. Although these component have been previously described, further descriptions of certain components are provided in further detail below in accordance with the exemplary embodiments shown in FIGS. 3-7.

According to FIG. 3, the adhesive layer 230 includes a sandwich of layers to adhere at least the flange portion 202 of one or more optics 110 that are disposed over each LED or LED die package 220 and the PC board 210. The adhesive layer includes three layers; however, greater or fewer number of layers are used to form the adhesive layer 230 in other exemplary embodiments. The sandwich of layered materials includes a material layer 330. This material layer 330 is fabricated using a gas-permeable material according to some exemplary embodiments. According to one example, the material layer 330 is fabricated using Tyvek®; however, other gas-permeable materials including, but not limited to, high density polyethylene, burlap, canvas, silicone, and other gas-permeable materials are used to fabricate the material layer 330. The material layer 330 includes several openings 332 for receiving therethrough the LED or LED die packages 220, the LED drivers 310 and for providing an opening about the apertures 212 in the PC board 210 for receiving screws 105 (FIG. 1).

The adhesive layer 230 also includes a first adhesive material 320 on the bottom side of the material layer 330 and a second adhesive material 340 on the top side of the material layer 330. These adhesive materials 320, 340 are fabricated using a gas-permeable material according to some exemplary embodiments. According to one example, the adhesive materials 320, 340 are fabricated using an acrylic adhesive; however, other gas-permeable materials including, but not limited to, silicone adhesives and other gas-permeable adhesives are used to fabricate the adhesive materials 320, 340. The material used to fabricate the first adhesive material 320 is the same material that is used to fabricate the second adhesive material 340. However, the first adhesive material 320 is fabricated using a different material than used to fabricate the second adhesive material 340 according to other exemplary embodiments. In one exemplary embodiment, the adhesive materials 320, 340 are a viscous or semi-viscous material that is applied to the material layer 330 and has substantially the same shape as the material layer 330. For example, the material layer 330 includes several openings 332 for receiving therethrough the LED or LED die packages 220, the LED drivers 310, and for providing an opening about the apertures 212 in the PC board 210 for receiving screws 105 (FIG. 1). Thus, the application of the viscous or semi-viscous material on the material layer 330 to form both the first and second adhesive materials 320, 340 also forms matching openings 322, 342 in both the first adhesive material 320 and the second adhesive material 340, respectively. The openings 322, 332, and 342 are all vertically aligned. In an alternative embodiment, the first and second adhesive materials 320, 340 are laminated onto the bottom side and the top side of the material layer 330. After the first and second adhesive materials 320, 340 are applied onto the material layer 330, they are die cut to provide openings 322, 332, and 342 in each of the adhesive materials 320, 340 and the material layer 330. Although openings 322, 332, and 342 are illustrated as being round-shaped, the openings 322, 332, and 342 can be any geometric or non-geometric shape according to other exemplary embodiments.

The first adhesive material 320 on the bottom side of the material layer 330 allows the material layer 330 to adhere to the PC board 210. The second adhesive material 340 on the top side of the material layer 330 allows multiple optics 110 and a layer of the gap filler 240, if used, to adhere to the material layer 330. The second adhesive material 340 provides a seal around the perimeter of each optic 110. As shown in FIG. 3, the gap filler 240 includes several square apertures 302. These apertures 302 are aligned with the round openings 332, 322, and 342 of the material layer 330 and the adhesive materials 320, 340, respectively. The apertures 302 in the gap filler 240 are square to clear the square perimeter of the exemplary flange portion 202 of the optic 110. The gap filler 240 is applied over the second adhesive material 340 to prevent the collection of dust and contaminants and to add to the mechanical structure of the adhesive materials 320, 340 and the material layer 330. Those of ordinary skill in the art will recognize however, that the size and shape of the openings 322, 332, and 342 in the material layer 330 and the adhesive materials 320, 340 and the apertures 302 in the gap filler 240 can be adjusted based on the shape of the LED or LED die package 220 and the optic 110 being used in the particular lighting application.

As previously mentioned and in accordance with one exemplary embodiment, the optic 110 is made of acrylic and can represent one or more optical devices disposed over each LED or LED die package 220. In addition, in certain exemplary embodiments, the light bar 100 also includes multiple mirrors 350. According to some exemplary embodiments, each mirror is disposed about at least a portion of one of the LEDs or LED die packages 220 and under the optic 110.

The material layer 330 along with the adhesive materials 320, 340 are air or gas-permeable and allow for the exchange of gas through the microstructure of the material layer 330 and the adhesive materials 320, 340, thereby allowing air and airborne contaminants to flow horizontally and vertically through the material layer 330 and to the exterior environment of the light bar 100. The adhesive materials 320, 340 provide a waterproof breathable membrane that further prevent clogging of the air paths and seal the light bar 100 in such a manner as to achieve an IP 66 rating per international industry standard IEC-60529 for the ingress of contaminants.

Figure 6A:
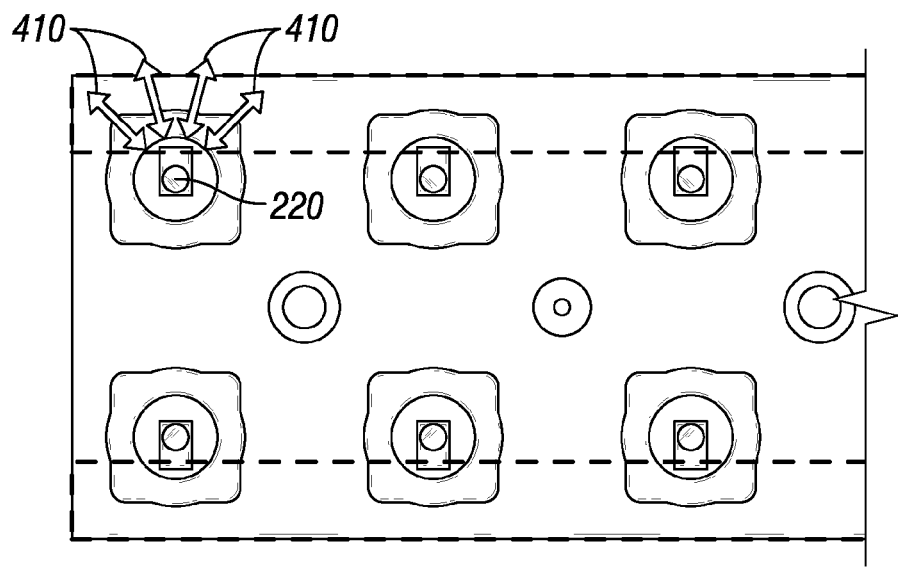
FIGS. 6A and 6B are additional views of a portion of the LED light bar of FIG. 3 showing representative air paths between the LED die package and the outside environment in accordance with the exemplary embodiment of FIG. 3.
Figure 6B:
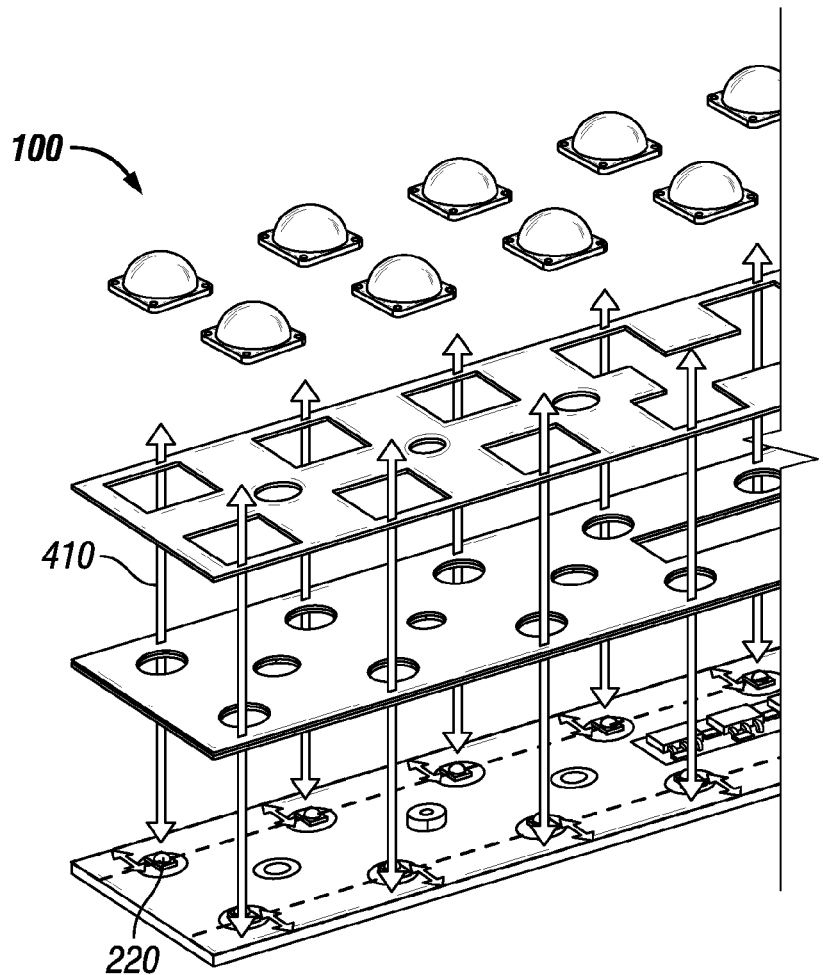
Figure 7:
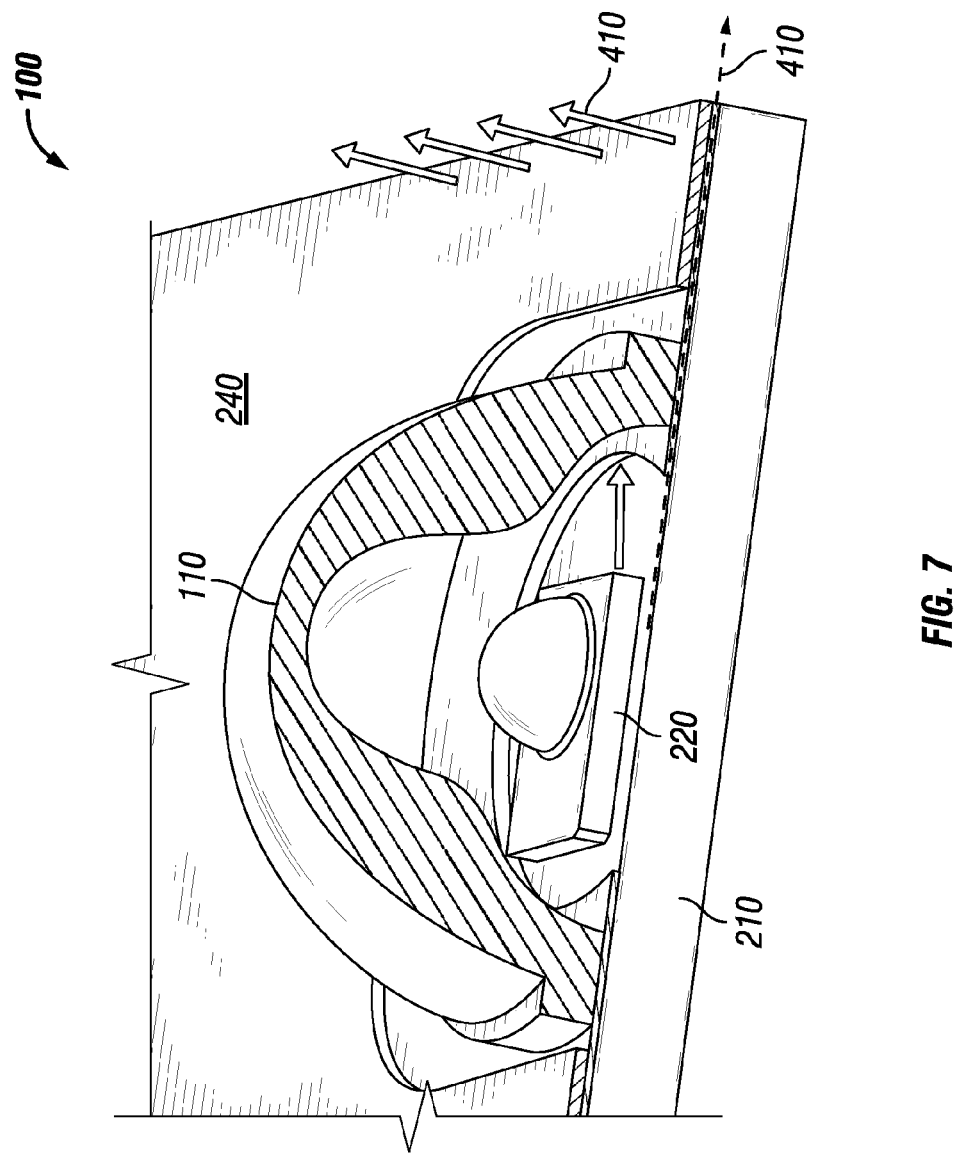
FIG. 7 is a partial cross-sectional view of a portion of the LED light bar of FIG. 3 showing representative air paths from the LED die package to the outside environment in accordance with the exemplary embodiment of FIG. 3.

FIG. 4 is an exploded view of a portion of the LED light bar 100 of FIG. 3 showing representative air paths 410 between the LED die package 220 and the outside environment in accordance with the exemplary embodiment of FIG. 3. FIGS. 5A and 5B are a pair of top plan views of a portion of the LED light bar 100 of FIG. 3 showing representative air paths 410 between the LED die package 220 and the outside environment in accordance with the exemplary embodiment of FIG. 3. FIGS. 6A and 6B are additional views of a portion of the LED light bar 100 of FIG. 3 showing representative air paths 410 between the LED die package 220 and the outside environment in accordance with the exemplary embodiment of FIG. 3. FIG. 7 is a partial cross-sectional view of a portion of the LED light bar 100 of FIG. 3 showing representative air paths 410 from the LED die package 220 to the outside environment in accordance with the exemplary embodiment of FIG. 3. Referring now to FIGS. 4-7, when the LED or LED die package 220 that is mounted onto the PC board 210 is turned on, it generates heat. The build up of heat increases the pressure inside of the optic 110. As the pressure increases beyond the pressure of the outside environment, the air or gas inside of the optic 110, which may include contaminants, wants to move to an area of lower pressure, which includes the outside environment. The material layer 330 disposed about the LED or LED die package 220 provides a pathway for the air (and any airborne contaminants), also referred to as an air path 410, to transition the air or gas from between the area under the optic 110 and the outside environment. The air paths 410 are oriented substantially vertically, substantially horizontally, and/or a combination of vertical and horizontal orientations. As shown in FIGS. 5A and 5B and with reference to FIG. 4, for instance, the air can move laterally under the gap filler 240 and through the material layer 330 to the perimeter of the light bar 100. The air (and any airborne contaminants) then exits the light bar 100. In addition, as shown in FIG. 7 and with reference to FIG. 4, the air can move laterally under the gap filler 240 and through the material layer 330 until the air is no longer under the optic 110 or the footprint of the optic 110. At that point, the air (and any airborne contaminants) can move vertically from the material layer 330 through the gap filler 240 to the outside environment.

It is also possible for air to flow in the opposite direction as shown in each of FIGS. 4-6, from the outside environment into the area surrounding the LED or LED die package 220 under the optic 110. For example, when the LED or LED die package 220 is turned off, the LED or LED die package 220 cools and the area under the optic 110 also cools. This cooling results in a pressure drop inside the area under the optic 110, thereby drawing air towards the LED or LED die package 220. Air is able to flow from the outside environment to the LED or LED die package 220 in a manner substantially similar to, but in the reverse of that described above.

While the exemplary embodiment of FIG. 4-7 shows the air flow from the LEDs or LED die packages 220 to the perimeter of the light bar 100, the air also is capable of flowing in any lateral direction from the LED or LED die package 220 to an area where the air is no longer under the optic 110. At that point, the air can either exit the light bar 100 vertically through the gap filler 240 or continue migrating laterally towards a perimeter of the light bar 100. Further, while the exemplary embodiment of FIGS. 3 and 4 shows the material layer 330, the adhesive materials 320, 340, and the gap filler 240 as being separate components, one or more of the material layer 330, the adhesive materials 320, 340, and the gap filler 240 are capable of being preassembled together as a single sandwich of layers (either with or without the optic 110) to improve consistency and to reduce the time to apply these layers to the PC board 210.

Figure 8:
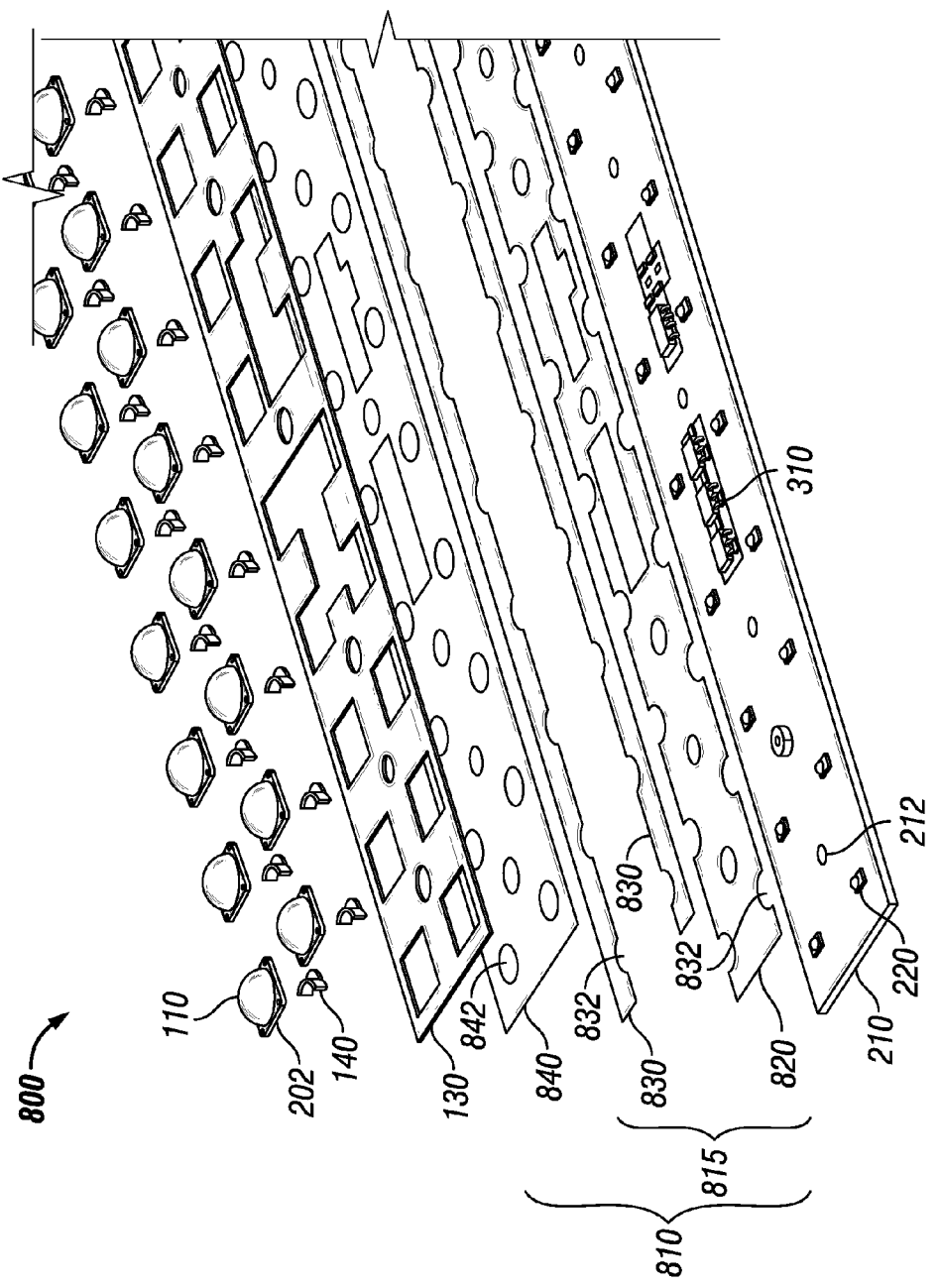
FIG. 8 is an exploded view of an LED light bar without the cover and with one or more air permeable layers in accordance with another exemplary embodiment of the present invention.

FIGS. 8-11 present another exemplary embodiment for an LED light bar 800 having one or more air permeable layers that provide a pathway for air to enter and exit the area surrounding each LED die package 220. FIG. 8 is an exploded view of an LED light bar without the cover 120 (FIG. 1) and with one or more air permeable layers in accordance with another exemplary embodiment of the present invention. Referring now to FIG. 8, the exemplary light bar 800 includes PC board 210, one or more LEDs or LED die packages 220 mounted to the PC board 210, an adhesive layer 810, the gap filler 240, and one or more optics 110. Although several of these components have been previously described, further descriptions of certain components are provided in further detail below in accordance with the exemplary embodiments shown in FIGS. 8-11.

The PC board 210 includes one or more LED drivers 310 that provide power to the LEDs or LED die packages 220 that are mounted to the PC board 210. Each LED or LED die package 220 includes at least one chip of semi-conductive material that is configured to release energy in the form of incoherent light. The optic 110 includes the flange portion 202 and is disposed over the LED or LED die package 220. The optic 110 receives the light emitted from the LED or LED die package 220 and distributes the light to a desired illumination area. In certain exemplary embodiments, the light bar 800 also includes multiple mirrors 350. According to some exemplary embodiments, each mirror 350 is disposed about at least a portion of one of the LEDs or LED die packages 220 and under the optic 110. Each of the PC board 210, LEDs or LED die packages 220, optics 110, and mirrors 350 have been previously described and are applicable to the current exemplary embodiment.

According to FIG. 8, the adhesive layer 810 includes a sandwich of layers to adhere at least the flange portion 202 of one or more optics 110 that are disposed over each LED or LED die package 220 and the PC board 210. The adhesive layer 810 includes two layers; however, greater or fewer number of layers are used to form the adhesive layer 810 in other exemplary embodiments. The adhesive layer 810 protects the LED or LED die package 220 and the PC board 210 from environmental contaminants. The sandwich of layered materials includes a bottom layer 815. At least a portion of the bottom layer 815 includes a gas-permeable tape 830. In one exemplary embodiment, the gas-permeable tape 830 is a moisture resistant venting tape made from non-woven fabric. One example of the gas-permeable tape 830 is Tyvek® tape manufactured by DuPont. Another example of the gas-permeable tape 830 is Tesa® tape manufactured by Tesa AG. However, other gas-permeable tapes known to people having ordinary skill in the art can be used in other exemplary embodiments. In one exemplary embodiment, the bottom layer 815 also includes a first adhesive material 820. In some exemplary embodiments, the gas-permeable tape 830 is placed on the surface of the PC board 210 along the outer longitudinal edges of the light bar 800 and the first adhesive material 820 is positioned longitudinally down the center of the light bar 800. The first adhesive material 820 is generally not gas-permeable, but can be gas-permeable in other exemplary embodiments. According to some exemplary embodiments, the first adhesive material 820 is formed into a tape-like structure.

In the exemplary embodiment of FIG. 8, the bottom layer 815 includes several openings 832 for receiving therethrough the LEDs or LED die packages 220, the LED drivers 310, and for providing an opening about one or more apertures 212 in the PC board 210 for receiving screws 105 (FIG. 1). While these openings 832 are round in the exemplary embodiment, they can alternatively be any geometric or non-geometric shape and are typically configured to allow at least a portion of the LED or LED die package 220 to extend upward therethrough.

While the first adhesive material 820 and the gas-permeable tape 830 are shown as three separate components in FIG. 8, in an exemplary embodiment, the first adhesive material 820 and the gas-permeable tape 830 are manufactured as a single layer for easier application to the PC board 210. For instance, the gas-permeable tape 830 and the first adhesive material 820 are combined using a butt joining operation. As shown in FIG. 8, the area where the bottom layer 815 transitions from the first adhesive material 820 to the gas-permeable tape 830 is along one or more openings 832 provided for in the bottom layer 815. These openings 832 are disposed about the LEDs or LED die packages 220. However, the exact transitioning positioning from the first adhesive material 820 to the gas-permeable tape 830 can be closer or farther from the longitudinal edge of the light bar 800 in other exemplary embodiments. In an alternative embodiment, the entire bottom layer 815 is a gas-permeable tape 830. Having the entire bottom layer 815 as a gas-permeable tape 830 eliminates the need to combine the gas-permeable tape 830 to the first adhesive material 820 in the bottom layer 815 during a pre-manufacturing step.

The adhesive layer 810 also includes a second adhesive material 840. The second adhesive material 840 includes one or more openings 842, which are aligned with the openings 832 in the bottom layer 815 when disposed on top of the bottom layer 815. In one exemplary embodiment, the second adhesive material 840 is an adhesive tape having adhesive on both sides ("double-sided tape") and has substantially the same shape as the bottom layer 815.

The bottom layer 815 includes sufficient adhesive material to adhere the bottom layer 815 to the surface of the PC board 210. The top side of the second adhesive material 840 is adhered to one or more optics 110 and a layer of gap filler 240, if used. The bottom side of the second adhesive material 840 is adhered to the top surface of the bottom layer 815. The gap filler 240 protects the adhesive layer 810 from physical damage and covers up the sticky portion of second adhesive material 840. As shown in FIG. 8, the gap filler 240 includes several square apertures 302. These apertures 302 are aligned with the round openings 832, 842 of the bottom layer 815 and the second adhesive material 840. The apertures 302 in the gap filler 240 are square-shaped to seal around the square perimeter of the exemplary flange portion 202 of the optics 110. Those of ordinary skill in the art will recognize however, that the size and shape of the openings in the bottom layer 815 and the second adhesive material 840 and the apertures 302 in the gap filler 240 can be adjusted based on the shape of the LED or LED die package 220 and the optic 110 being used in the particular lighting application.

The gas-permeable tape 830 allows for the exchange of air or gas through the microstructure of the gas-permeable tape 830, thereby allowing air and airborne contaminants to flow horizontally and vertically through the gas-permeable tape 830 and to the outside environment of the light bar 100. In addition, the gas-permeable tape 830 provides a waterproof breathable membrane along the bottom layer 815. The second adhesive material 840 prevents clogging of the air paths and seals the light bar 800 in such a manner as to achieve an IP 66 rating for the ingress of contaminants. Furthermore, the second adhesive material 840 isolates the sealing area for the optic 110 from the air paths.

Figure 9A:
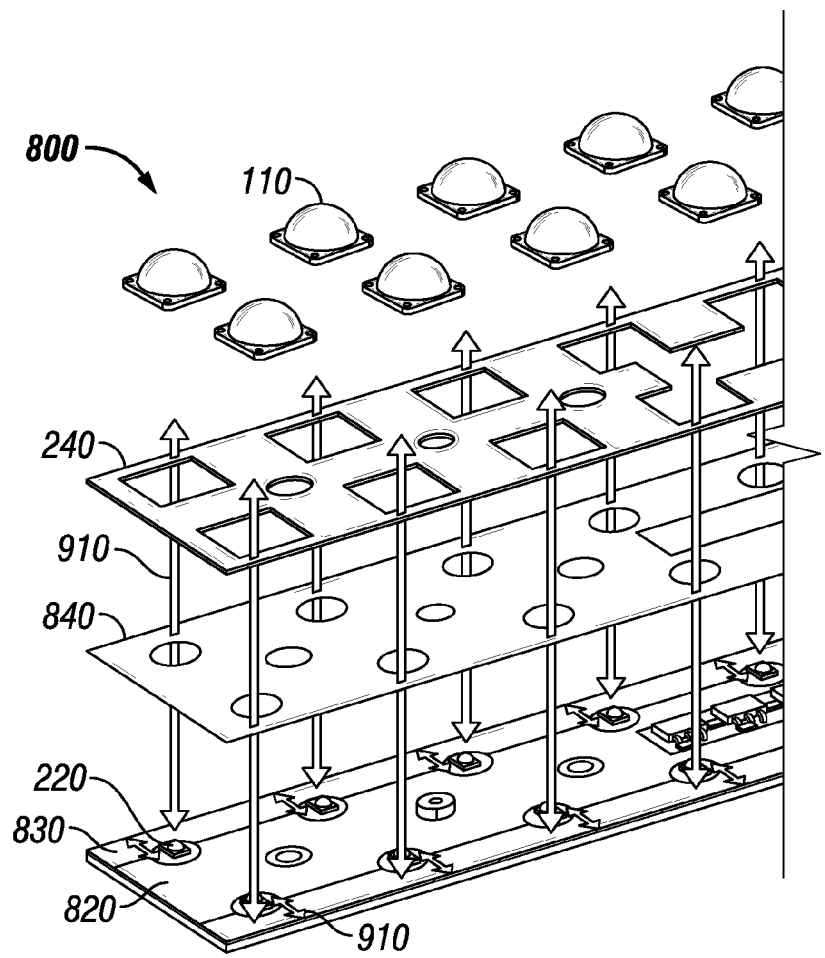
FIGS. 9A and 9B are additional views of a portion of the LED light bar of FIG. 8 showing representative air paths between the LED die package and the outside environment in accordance with the exemplary embodiment of FIG. 8.
Figure 9B:
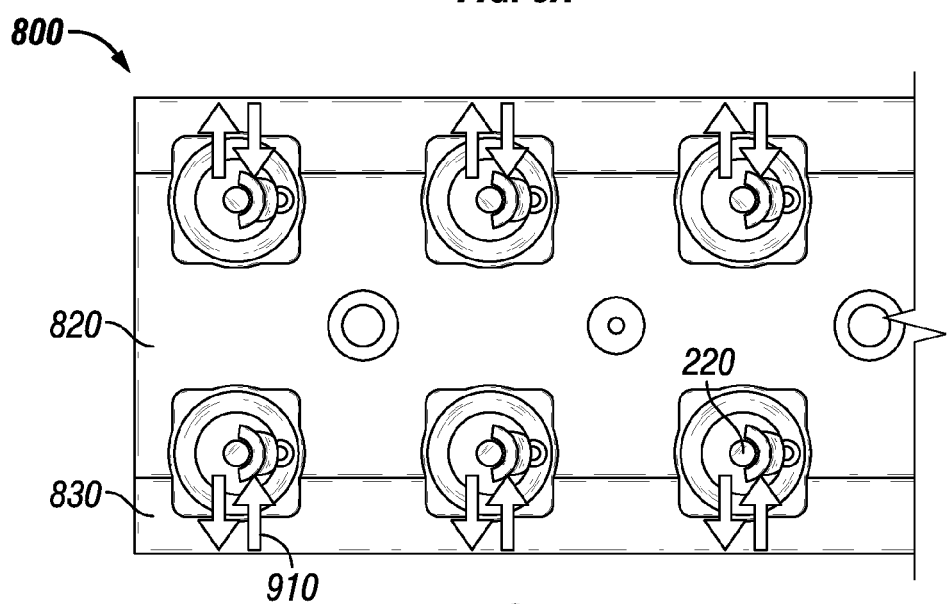
Figure 10A:
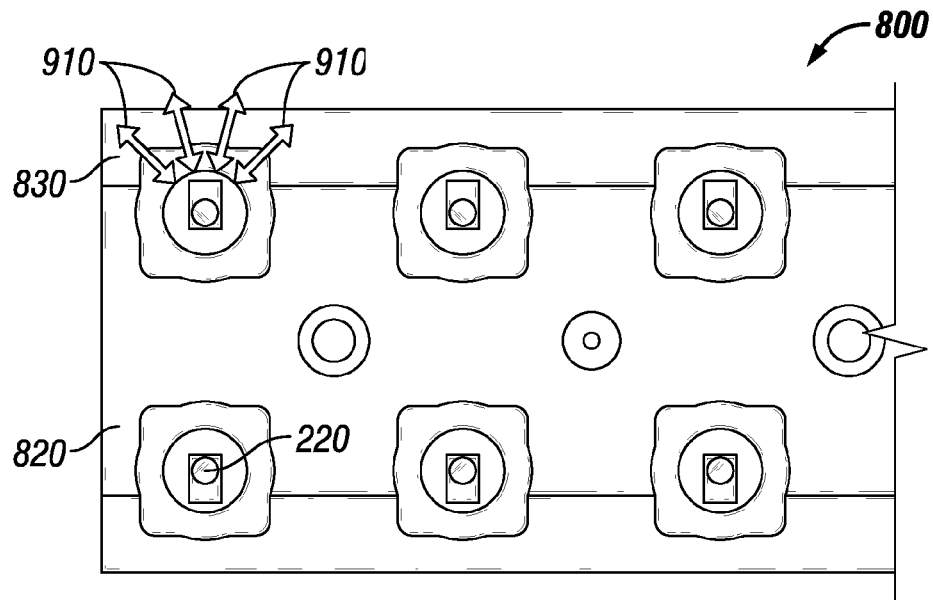
FIGS. 10A and 10B are additional views of a portion of the LED light bar of FIG. 8 showing representative air paths between the LED die package and the outside environment in accordance with the exemplary embodiment of FIG. 8.
Figure 10B:
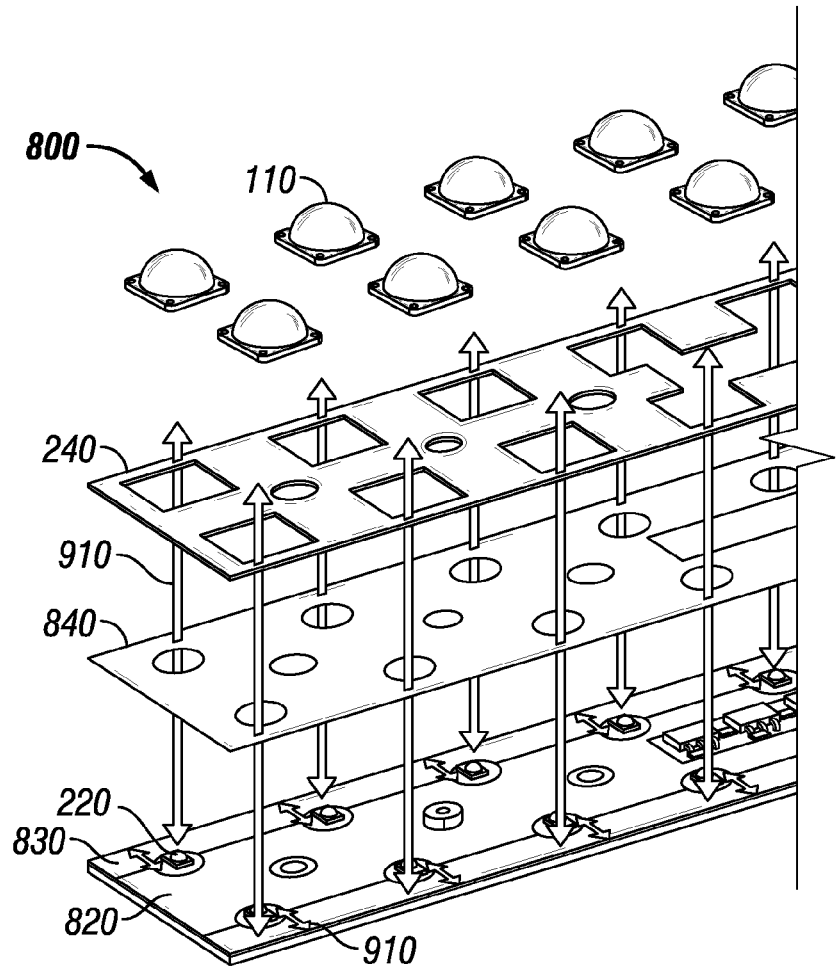
Figure 11:
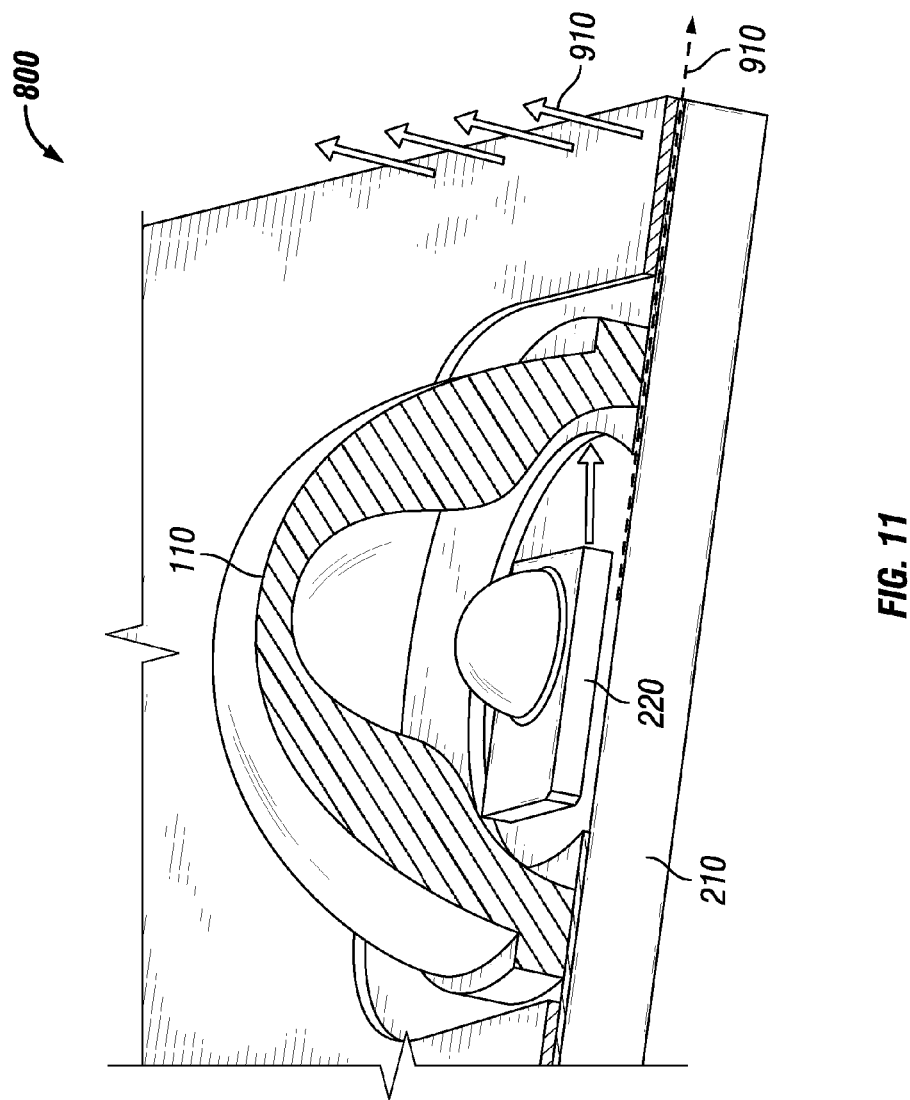
FIG. 11 is a partial cross-sectional view of a portion of the LED light bar of FIG. 8 showing representative air paths from the LED die package to the outside environment in accordance with the exemplary embodiment of FIG. 8.

FIGS. 9A and 9B are additional views of a portion of the LED light bar 800 of FIG. 8 showing representative air paths 910 between the LED die package 220 and the outside environment in accordance with the exemplary embodiment of FIG. 8. FIGS. 10A and 10B are additional views of a portion of the LED light bar 800 of FIG. 8 showing representative air paths 910 between the LED die package 220 and the outside environment in accordance with the exemplary embodiment of FIG. 8. FIG. 11 is a partial cross-sectional view of a portion of the LED light bar 800 of FIG. 8 showing representative air paths 910 from the LED die package 220 to the outside environment in accordance with the exemplary embodiment of FIG. 8. Referring now to FIGS. 9-11, when the LED or LED die package 220 that is mounted to the PC board 210 is turned on, it generates heat. The build up of heat increases the pressure inside of the optic 110. As the pressure increases beyond the pressure of the outside environment, the air or gas inside of the optic 110, which may include contaminants, wants to move to an area of lower pressure, which includes the outside environment. The gas-permeable tape 830 disposed along the outer longitudinal edges of the PC board 210 provides a pathway for the air (and any airborne contaminants), also referred to as an air path 910, to transition the air or gas from between the area under the optic 110 and the outside environment. The air paths 910 are oriented substantially vertically, substantially horizontally, and/or a combination of vertical and horizontal orientations. As shown in FIGS. 9-11, for instance, the air can move laterally under the gap filler 240 and the second adhesive material 840 and through the gas-permeable tape 830 to the perimeter of the light bar 800. The air (and any airborne contaminants) then exits the light bar 800. In addition, as shown in FIGS. 9A, 10B, and 11, the air can move laterally under the gap filler 240 and the second adhesive material 840 and through the gas-permeable tape 830 until the air is no longer under the optic 110. At that point, the air (and any airborne contaminants) can move vertically from the gas-permeable tape 830 through the second adhesive material 840 and the gap filler 240 to the outside environment.

It is also possible for air to flow in the opposite direction as shown in each of FIGS. 9 and 10, from the outside environment to the area surrounding the LED or LED die package 220 under the optic 110. For example, when the LED or LED die package 220 is turned off, the LED or LED die package 220 cools and the area under the optic 110 also cools. This cooling results in a pressure drop inside the area under the optic 110, thereby drawing air towards the LED or LED die package 220. Air is able to flow from the outside environment to the LED or LED die package 220 in a manner substantially similar to, but in the reverse of that described above.

While the exemplary embodiments of FIGS. 9-11 show air flow from the LEDs or LED die packages 220 to the perimeter of the light bar 800, in alternative embodiments wherein the gas-permeable tape 830 comprises the entire bottom layer 815, the air also is capable of flowing in any lateral direction from the LED or LED die package 220 to an area where the air is no longer under the optic 110. At that point, the air can either exit the light bar 800 vertically through the second adhesive material 840 and the gap filler 240 or continue migrating laterally towards a perimeter of the light bar 800. Further, while the exemplary embodiment of FIGS. 8, 9A, and 10B shows the bottom layer 815, the second adhesive material 840, and the gap filler 240 as being separate components, one or more of the bottom layer 815, the second adhesive material 840, and the gap filler 240 are capable of being preassembled together (either with or without the optic 110) as a single sandwich of layers to improve consistency and to reduce the time to apply these layers to the PC board 210.

Figure 12:
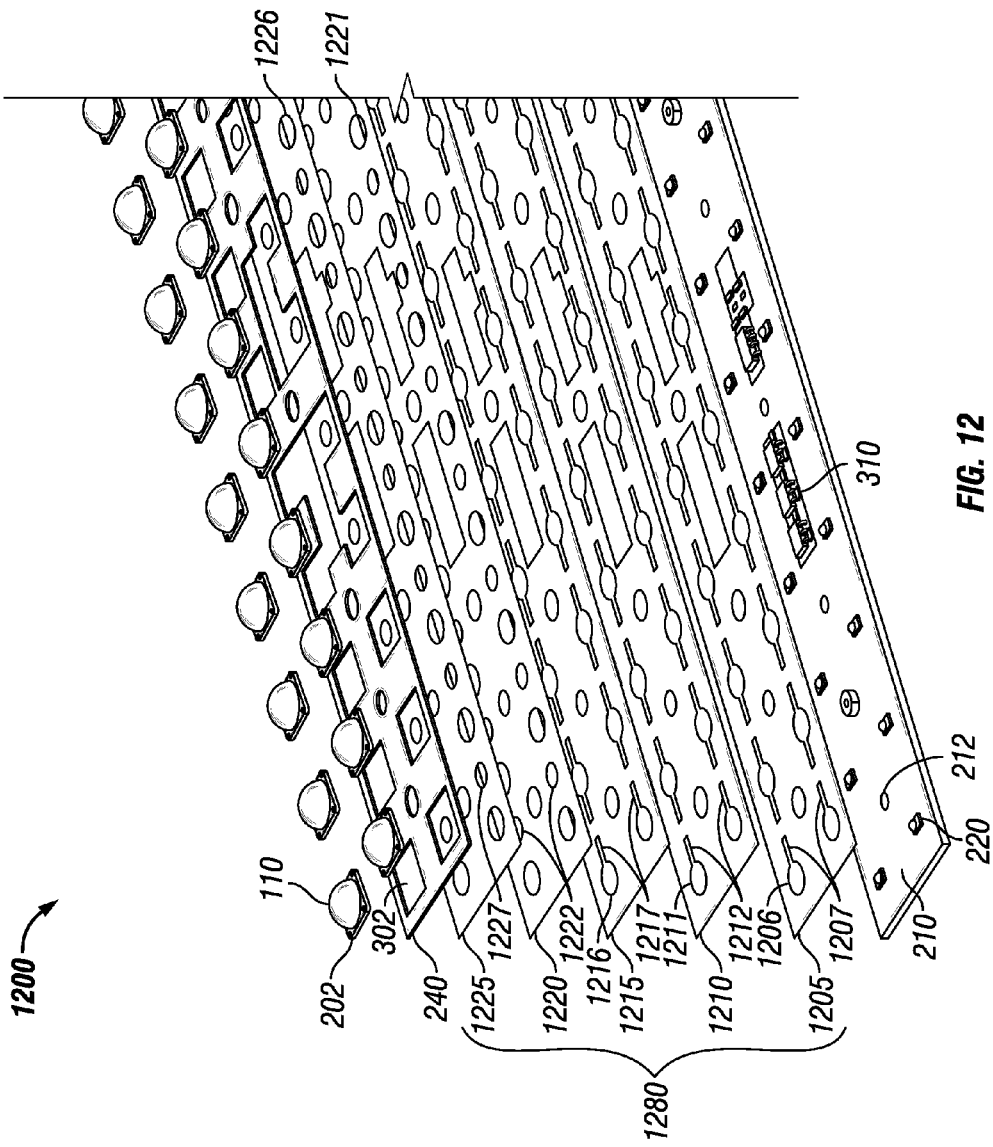
FIG. 12 is an exploded view of an LED light bar without the cover and with one or more air permeable layers in accordance with another exemplary embodiment of the present invention.
Figure 13:
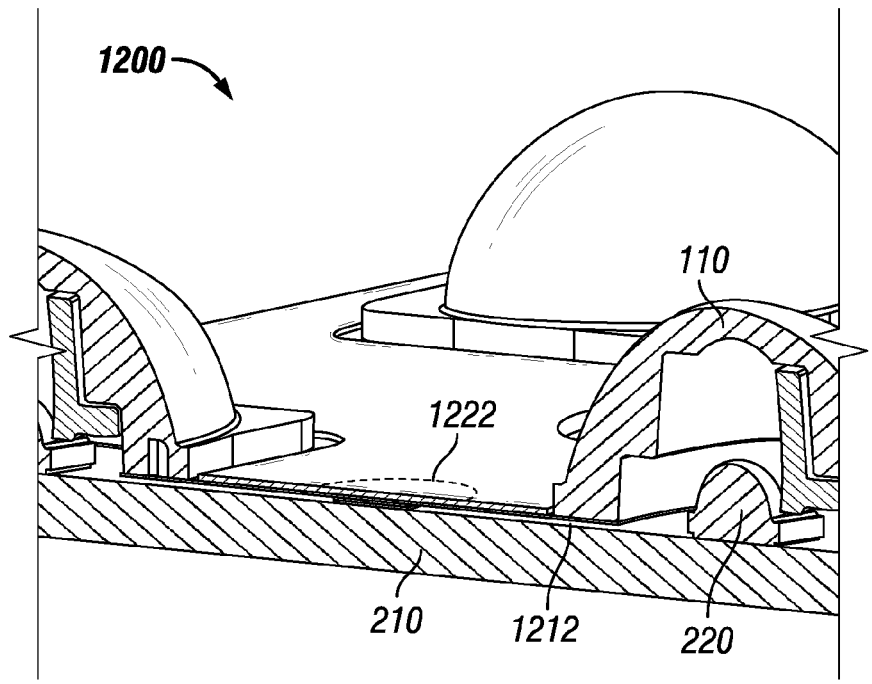
FIG. 13 is a partial cross-sectional view of a portion of the LED light bar of FIG. 12 showing an air channel and a breathing port aperture in accordance with an exemplary embodiment of FIG. 12.

FIGS. 12-15 present another exemplary embodiment for an LED light bar 1200 having one or more air permeable layers that provide air channels 1212 for air to enter and exit the area surrounding each LED or LED die package 220. FIG. 12 is an exploded view of an LED light bar 1200 without the cover 120 (FIG. 1) and with one or more air permeable layers in accordance with another exemplary embodiment of the present invention. FIG. 13 is a partial cross-sectional view of a portion of the LED light bar 1200 of FIG. 12 showing an air channel 1212 and a breathing port aperture 1222 in accordance with an exemplary embodiment of FIG. 12. Referring now to FIGS. 12 and 13, the exemplary light bar 1200 includes PC board 210, one or more LEDs or LED die packages 220 mounted to the PC board 210, an adhesive layer 1280, the gap filler 240, and one or more optics 110. Although several of these components have been previously described, further descriptions of certain components are provided in further detail below in accordance with the exemplary embodiment shown in FIGS. 12-15.

The PC board 210 includes one or more LED drivers 310 that provide power to the LEDs or LED die packages 220 that are mounted to the PC board 210. Each LED or LED die package 220 includes at least one chip of semi-conductive material that is configured to release energy in the form of incoherent light. The optic 110 includes the flange portion 202 and is disposed over the LED or LED die package 220. The optic 110 receives the light emitted from the LED or LED die package 220 and distributes the light to a desired illumination area. In certain exemplary embodiments, the light bar 1200 also includes multiple mirrors 350 (FIG. 3). According to some exemplary embodiments, each mirror 350 (FIG. 3) is disposed about at least a portion of one of the LEDs or LED die packages 220 and under the optic 110. Each of the PC board 210, LEDs or LED die packages 220, optics 110, and mirrors 350 (FIG. 3) have been previously described and are applicable to the current exemplary embodiment.

According to FIG. 12, the adhesive layer 1280 includes a sandwich of layers of materials to adhere at least the flange portion 202 of one or more optics 110 that are disposed over each LED or LED die package 220 and the PC board 210. The adhesive layer 1280 protects the LED or LED die package 220 and the PC board 210 from environmental contaminants. The adhesive layer 280 includes a first carrier material 1210. According to some exemplary embodiments, the first carrier material 1210 is fabricated using a polymer film layer. In one exemplary embodiment, the polymer film layer is polyethylene terephthalate (PET), Mylar®, Rayon®, Gortex®, polytetrafluoroethylene (PTFE), or any other polymer film known to people having ordinary skill in the art.

As with the other layers in the other embodiments discussed above, the first carrier material 1210 includes one or more openings 1211 for receiving at least a portion of the LED or LED die package 220 therethrough. In addition to and in communication with each one of the openings 1211 is at least one air channel 1212. In one exemplary embodiment, the air channel 1212 is a longitudinal aperture extending from one edge of the opening 1211 that receives the LED or LED die package 220 therethrough. As shown in FIG. 12, except for the openings 1211 nearest to each latitudinal end of the light bar 1200, a pair of air channels 1212 extend in opposing longitudinal directions for the light bar 1200. For the openings 1211 nearing the latitudinal end of the light bar 1200, a single air channel 1212 extends from the opening 1211 in the longitudinal direction toward an adjacent opening 1211. While the exemplary embodiment presents pairs of air channels 1212 extending in the longitudinal direction from each opening 1211, the air channels 1212 can extend in any direction and greater or fewer than two air channels 1212 extend from each opening 1211 in other exemplary embodiments.

The adhesive layer 1280 also includes a first adhesive material 1205 and a second adhesive material 1215 on the top and bottom sides of the first carrier material 1210. According to one example, the adhesive materials 1205, 1215 are fabricated using an acrylic adhesive; however, other suitable materials including, but not limited to, silicone adhesives and other gas-permeable adhesives can be used to fabricate the adhesive materials 1205, 1215. The material used to fabricate the first adhesive material 1205 is the same material that is used to fabricate the second adhesive material 1215. However, the first adhesive material 1205 is fabricated using a different material than used to fabricate the second adhesive material 1215 according to other exemplary embodiments. In one exemplary embodiment, the adhesive materials 1205, 1215 are a viscous or semi-viscous material that is applied to the first carrier material 1210 and has substantially the same shape as the first carrier material 1210. For example, the first carrier material 1210 includes several openings 1211 for receiving therethrough the LED or LED die packages 220, the LED drivers 310, and for providing an opening about the apertures 212 in the PC board 210 for receiving screws 105 (FIG. 1) and several air channels 1212 extending from the openings 1211. Thus, the application of the viscous or semi-viscous material on the first carrier material 1210 to form both the first and second adhesive materials 1205, 1215 also forms matching openings 1206, 1216 and matching air channels 1207, 1217 in both the first adhesive material 1205 and the second adhesive material 1210, respectively. The openings 1206, 1211, and 1216 are all vertically aligned. The air channels 1207, 1212, and 1217 are all vertically aligned. In an alternative embodiment, the first and second adhesive materials 1205, 1215 are laminated onto the bottom side and the top side of the first carrier material 1210. After the first and second adhesive materials 1205, 1215 are applied onto the first carrier material 1210, they are die cut to provide openings 1206, 1211, and 1216 and air channels 1207, 1212, and 1217 in each of the adhesive materials 1205, 1215 and the first carrier material 1210. In an alternative embodiment, the adhesive materials 1205, 1215 are vapor deposited on the first carrier material 1210. Although openings 1206, 1211, and 1216 are illustrated as being round-shaped, the openings 1206, 1211, and 1216 can be any geometric or non-geometric shape according to other exemplary embodiments.

The adhesive layer 1280 also includes a second carrier material 1220. According to some exemplary embodiments, the second carrier material 1220 is fabricated using a polymer film layer. The second carrier material 1220 is disposed above the first carrier material 1210 and the second adhesive material 1215. In one exemplary embodiment, the polymer film layer is polyethylene terephthalate (PET), Mylar®, Rayon®, Gortex®, polytetrafluoroethylene (PTFE), or any other polymer film known to people having ordinary skill in the art.

As with the first carrier material 1210, the second carrier material 1220 also includes one or more openings 1221 for receiving at least a portion of the LED or LED die package 220 therethrough. In addition to those openings, one or more breathing port apertures 1222 are formed into the second carrier material 1220. In one exemplary embodiment, the breathing port apertures 1222 have a circular shape; however, other shapes are contemplated within the scope of this invention. The breathing port apertures 1222 are positioned on the second carrier material 1220 such that, when positioned over the first carrier material 1210, a portion of the breathing port aperture 1222 and at least one, and typically two, of the air channels 1212 will overlap and be in fluid communication with one another, as shown, for example, in FIG. 14. Also, once the second carrier material 1220 is positioned over the first carrier material 1210, the opening 1221 is vertically aligned with openings 1206, 1211, and 1216.

The adhesive layer 1280 also includes a third adhesive material 1225 on the top side of the second carrier material 1220. According to one example, the third adhesive material 1225 is fabricated using an acrylic adhesive; however, other suitable materials including, but not limited to, silicone adhesives and other gas-permeable adhesives can be used to fabricate the third adhesive material 1225. The material used to fabricate the third adhesive material 1225 is the same material that is used to fabricate at least one of the first adhesive material 1205 or the second adhesive material 1215. However, the third adhesive material 1225 is fabricated using a different material than used to fabricate the first adhesive material 1205 and the second adhesive material 1215 according to other exemplary embodiments. In one exemplary embodiment, the third adhesive material 1225 is a viscous or semi-viscous material that is applied to the top side of the second carrier material 1220 and has substantially the same shape as the second carrier material 1220. For example, the second carrier material 1220 includes several openings 1221 for receiving therethrough the LED or LED die packages 220, the LED drivers 310, and for providing an opening about the apertures 212 in the PC board 210 for receiving screws 105 (FIG. 1) and several breathing port apertures 1222. Thus, the application of the viscous or semi-viscous material on the second carrier material 1220 to form the third adhesive material 1225 also forms matching openings 1226 and matching breathing port apertures 1227 in the third adhesive material 1225. The openings 1221, 1226 are all vertically aligned. The breathing port apertures 1222, 1227 are all vertically aligned. In an alternative embodiment, the third adhesive material 1225 is laminated onto the top side of the second carrier material 1220. After the third adhesive material 1225 is applied onto the second carrier material 1220, they are die cut to provide openings 1216, 1226 and breathing port apertures 1222, 1227 in each of the third adhesive material 1225 and the second carrier material 1220. In an alternative embodiment, the third adhesive material 1225 is vapor deposited on the second carrier material 1220. Although openings 1221, 1226 are illustrated as being round-shaped, the openings 1221, 1226 can be any geometric or non-geometric shape according to other exemplary embodiments.

The adhesive layer 1280 also includes the gap filler 240 in certain exemplary embodiments. According to certain exemplary embodiments, the gap filler 240 is fabricated using a non-woven breathable membrane. The gap filler 240 is disposed over the second carrier material 1220. In certain exemplary embodiments, the nonwoven breathable membrane is made of Tyvek® manufactured by Dupont Industries, Tufpak® manufactured by Tufpak, Inc., or other comparable materials known to people having ordinary skill in the art. The gap filler 240 and the third adhesive material 1225 provide a seal around the perimeter of each optic 115. As shown in FIG. 12, the gap filler 240 includes several square apertures 302. These apertures 302 are aligned with the round LED receiving openings 1211, 1221, 1206, 1216, and 1226 of the first and second carrier materials 1210, 1220 and the first, second, and third adhesive materials 1205, 1215, and 1225. The apertures 302 in the gap filler 240 are square-shaped to seal around the square perimeter of the exemplary optic 110. Those of ordinary skill in the art will recognize, however, that the size and shape of the openings 1211, 1221, 1206, 1216, and 1226 in the first and second carrier materials 1210, 1220 and the first, second, and third adhesive materials 1205, 1215, and 1225 and the aperture 302 in the gap filler 240 can be adjusted based on the shape of the LED or LED die package 220 and the optic 110 being used in the particular lighting application.

When the sandwich layers are combined to form the adhesive layer 1280, the first adhesive material 1205 on the bottom side of the first carrier material 1210 allows the first carrier material 1210 to adhere to the PC board 210. The second adhesive material 1215 on the top side of the first carrier material 1210 allows the two carrier materials 1210, 1220 to adhere to one-another. Although it has been described that the second adhesive material 1215 is applied, laminated, or deposited onto the top side of the first carrier material 1210, the second adhesive material 1215 can be applied, laminated, or deposited onto the bottom side of the second carrier material 1220 in other exemplary embodiments and still perform in the same manner. The third adhesive material 1225 on the top side of the second carrier material 1220 allows one or more optics 110 and the gap filler 240, if used, to adhere to the second carrier material 1220.

Figure 15:
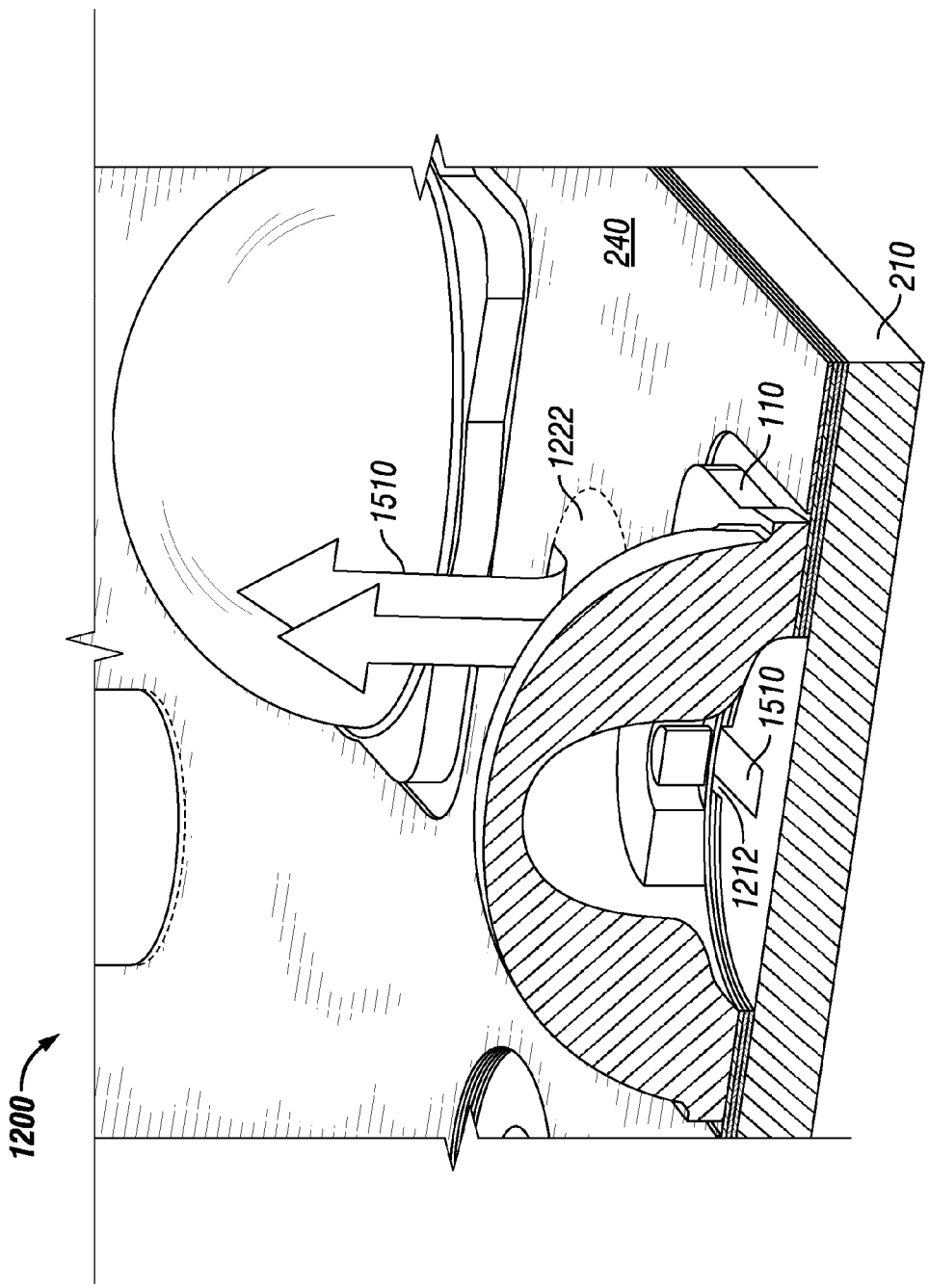
FIG. 15 is a partial cross-sectional view of a portion of the LED light bar of FIG. 12 showing representative air paths from the LED die package to the outside environment in accordance with the exemplary embodiment of FIG. 12.

The first carrier material 1210 provides air channels 1212 in direct fluid communication with the cavity of the optic 110 and the LED or LED die package 220. These air channels 1212 also are in fluid communication with the breathing port apertures 1222. This combination of fluid communications provides a direct pathway for air and airborne contaminants to flow from the cavity of the optic 110 to the gap filler 240, if used, and out from the light bar 1200 to the surrounding environment, as shown in FIG. 15. In addition, according to some exemplary embodiments, the gap filler 240 provides a waterproof breathable membrane along the top layer of the adhesive layer 1280 for the light bar 1200. The first, second, and third adhesive materials 1205, 1215, 1225 are constructed to prevent clogging of the air channels 1212 and the breathing port apertures 1222 and seal the light bar 1200 in such a manner as to achieve an IP 66 rating per international industry standard IEC-60529 for the ingress of contaminants. Furthermore, the first, second, and third adhesive materials 1205, 1215, 1225 isolate the sealing area for the optic 110 from the air channels 1212 and the breathing port apertures 1222.

Figure 14:
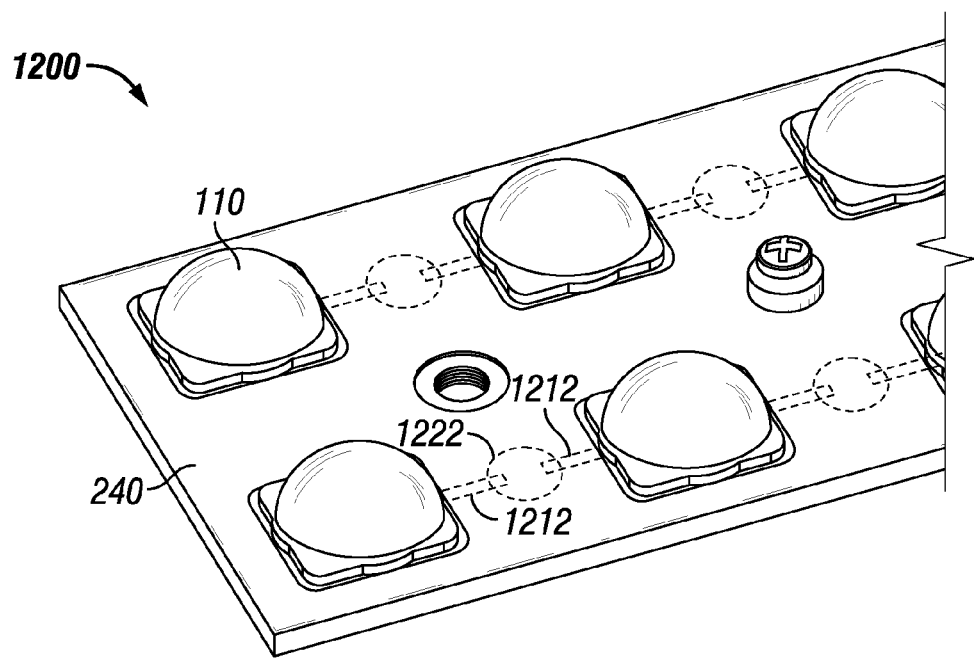
FIG. 14 is a perspective view of a portion of the LED light bar of FIG. 12 showing the air channel and the breathing port aperture of FIG. 12 in accordance with an exemplary embodiment of FIG. 12.

FIG. 14 is a perspective view of a portion of the LED light bar 1200 of FIG. 12 showing the air channel 1212 and the breathing port aperture 1222 of FIG. 12 in accordance with an exemplary embodiment of FIG. 12. FIG. 15 is a partial cross-sectional view of a portion of the LED light bar 1200 of FIG. 12 showing representative air paths 1510 from the LED die package 22 (FIG. 12)0 to the outside environment in accordance with the exemplary embodiment of FIG. 12. Referring now to FIGS. 14 and 15, when the LED or LED die package 220 (FIG. 12) that is mounted to the PC board 210 is turned on, it generates heat. The build up of heat increases the pressure inside of the optic 110. As the pressure increases beyond the pressure of the outside environment, the air or gas inside of the optic, which may include contaminants, wants to move to an area of lower pressure, which includes the outside environment. The air moves laterally along air path 1510 through the air channel 1212. When the air reaches a breathing port aperture 1222, the air moves vertically along air path 1510 through the breathing port aperture 1222 and through the gap filler 240 to the outside environment of the light bar 1200. Although not illustrated, it is also possible for air to flow in the opposite direction, from the outside environment to the area surrounding the LED or LED die package 220 under the optic 110. While the exemplary embodiment of FIGS. 12-15 show the first and second carrier materials 1210, 1220, the first, second, and third adhesive materials 1205, 1215, and 1225, and the gap filler 240 as being separate components, one or more of the first and second carrier materials 1210, 1220, the first, second, and third adhesive materials 1205, 1215, and 1225, and the gap filler 240 are capable of being preassembled (with or without the inclusion of the optic 110) together as a single sandwich of layers to improve consistency and to reduce the time to apply these layers to the PC board 210.

Figure 16:
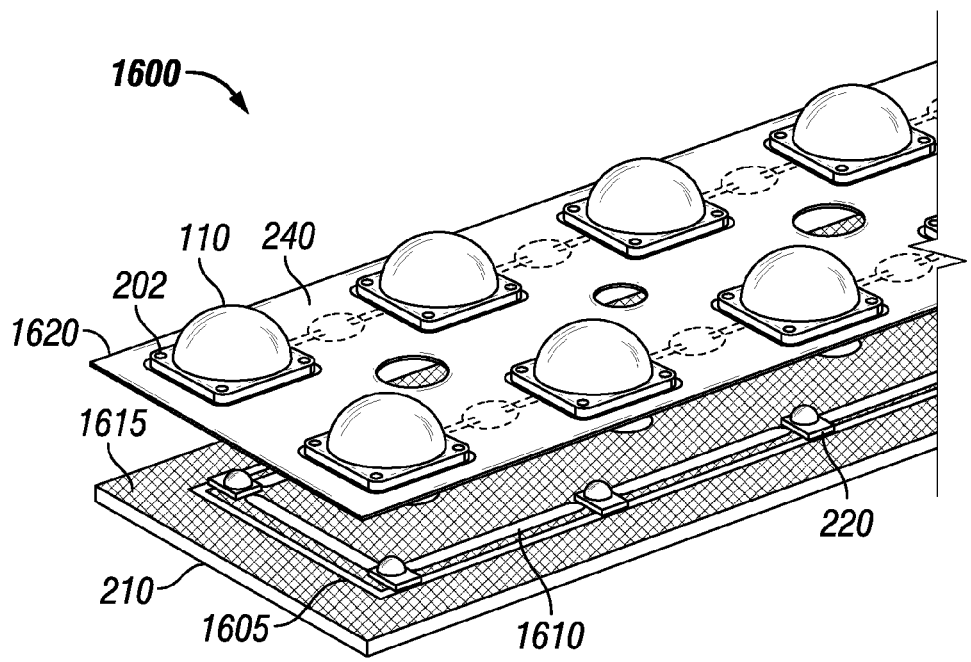
FIG. 16 is a partially exploded view of a portion of an LED light bar with one or more air channels in accordance with another exemplary embodiment of the present invention.
Figure 17:
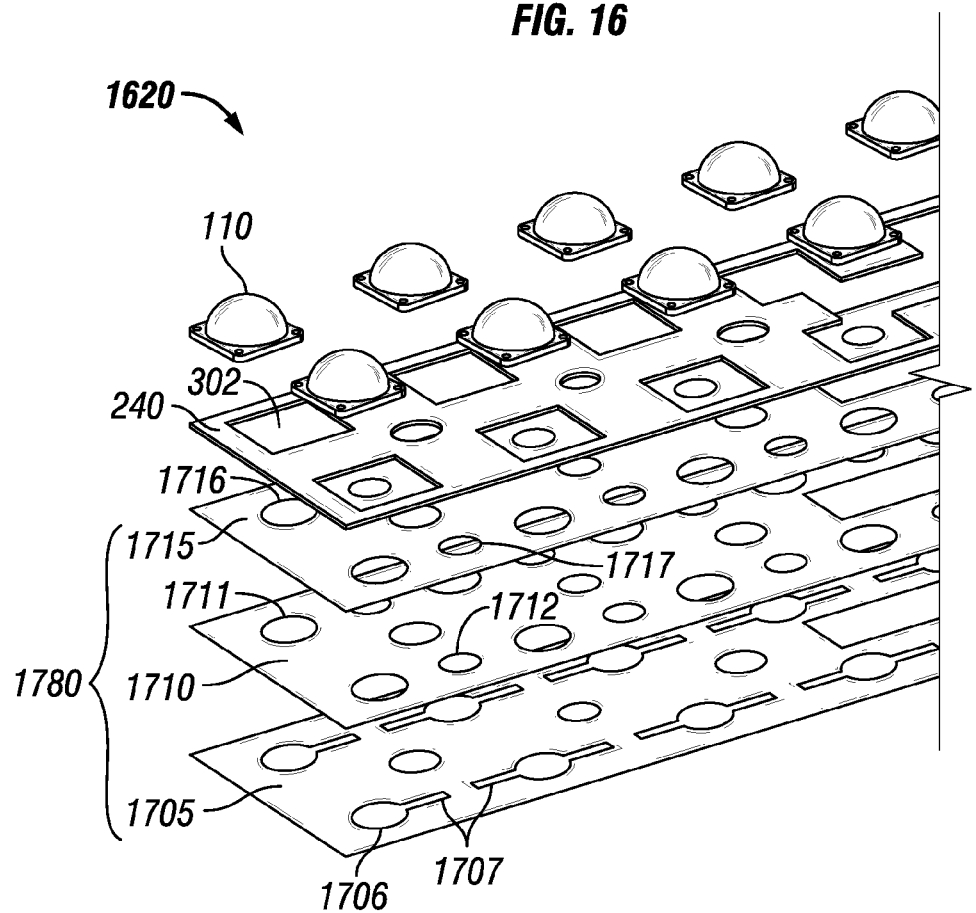
FIG. 17 is an exploded view of a portion of a lens set for the LED light bar of FIG. 16 having one or more air permeable layers in accordance with an exemplary embodiment of FIG. 16.
Figure 18:
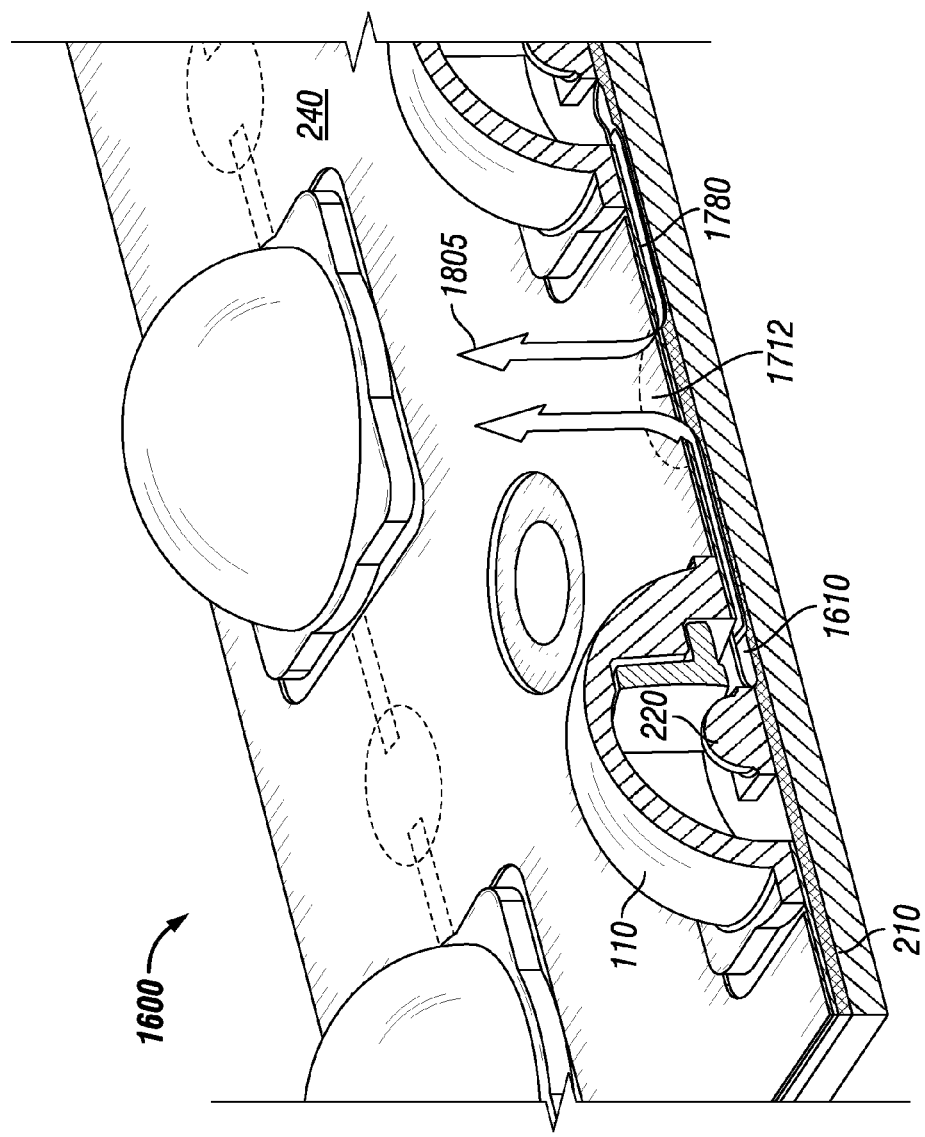
FIG. 18 is a partial cross-sectional view of a portion of the LED light bar of FIG. 16 showing representative air paths from the LED die package to the outside environment in accordance with the exemplary embodiment of FIG. 16.

FIGS. 16-18 present another exemplary embodiment for an LED light bar 1600 having one or more air permeable layers that provide air channels 1610 for air to enter and exit the area surrounding each LED or LED die package 220 and inside the cavity of the optic 110. FIG. 16 is a partially exploded view of a portion of an LED light bar 1600 with one or more air channels 1610 in accordance with another exemplary embodiment of the present invention. Referring now to FIG. 16, the exemplary light bar 1600 includes PC board 210, one or more LEDs or LED die packages 220 mounted to the PC board 210, and a lens set 1620, which includes one or more optics 110. Although several of these components have been previously described, further descriptions of certain components are provided in further detail below in accordance with the exemplary embodiment shown in FIGS. 16-18.

The PC board 210 includes one or more LED drivers 310 (FIG. 3) that provide power to the LEDs or LED die packages 220 that are mounted to the PC board 210. In addition, the PC board 210 includes circuit traces 1605 electrically coupled to the LED driver 310 (FIG. 3) and the LEDs or LED die packages 220. The circuit traces 1605 transmit power and/or control signals from the LED driver 310 (FIG. 3) to the LEDs or LED die packages 220. The PC board 210 also includes one or more layers of coating 1615 along the top surface of the PC board 210. According to some exemplary embodiments, the layers of coating 1615 includes a layer of solder mask. However, in alternative embodiments, the layers of coating 1615 includes conformal coating or other hard coatings known to people having ordinary skill in the art. In certain exemplary embodiments, multiple layers of solder mask 1615 are applied to the PC board 210. During application, portions of the PC board 210 are selectively coated using screen printing or other coating techniques to apply one or multiple layers of coating 1615. These portions are typically adjacent to the LEDs or LED die packages 220. By selectively applying the layers of coating 1615 to certain parts of the PC board 210, air channels 1610 are created along the top surface of the PC board 210.

Each LED or LED die package 220 includes at least one chip of semi-conductive material that is configured to release energy in the form of incoherent light. The optic 110 includes the flange portion 202 and is disposed over the LED or LED die package 220. The optic 110 receives the light emitted from the LED or LED die package 220 and distributes the light to a desired illumination area. In certain exemplary embodiments, the light bar 1600 also includes multiple mirrors 350 (FIG. 3). According to some exemplary embodiments, each mirror 350 (FIG. 3) is disposed about at least a portion of one of the LEDs or LED die packages 220 and under the optic 110. Each of the PC board 210, LEDs or LED die packages 220, optics 110, and mirrors 350 (FIG. 3) have been previously described and are applicable to the current exemplary embodiment.

FIG. 17 is an exploded view of a portion of the lens set 1620 for the LED light bar 1600 of FIG. 16 having air permeable layers in accordance with an exemplary embodiment of FIG. 16. Referring to FIG. 17, the lens set 1620 includes an adhesive layer 1780, the gap filler 240, and one or more optics 110. The adhesive layer includes a carrier material 1710, a first adhesive material 1705, and a second adhesive material 1715. The carrier material 1710 includes one or more openings 1716 and one or more breathing port apertures 1717 and is substantially similar to the second carrier material 1220 (FIG. 12). The first adhesive material 1705 includes one or more openings 1706 and one or more air channels 1707 and is substantially similar to the second adhesive material 1215 (FIG. 12). The second adhesive material 1715 includes one or more openings 1716 and one or more breathing port apertures 1717 and is substantially similar to the third adhesive material 1225 (FIG. 12). Similarly, the gap filler 240, which includes apertures 302, and the optics 110 are substantially the same as described in previous exemplary embodiments. For the sake of brevity, the descriptions for each of the second carrier material 1220 (FIG. 12), the second adhesive material 1215 (FIG. 12), the third adhesive material 1225 (FIG. 12), the gap filler 240, and the optics 110 of previously described embodiments are incorporated herein with respect to the exemplary embodiment shown in FIGS. 16-18, and will not be repeated.

When the sandwich layers are combined to form the adhesive layer 1780, the first adhesive material 1705 on the bottom side of the carrier material 1710 allows the carrier material 1710 to adhere to the layers of coating 1615 on the PC board 210. The second adhesive material 1715 on the top side of the carrier material 1710 allows optics 110 and the gap filler 240, if used, to adhere to the carrier material 1710. The breathing port apertures 1712 of the carrier material 1710 are positioned such that they are in vertical alignment with at least a portion of the air channels 1610.

FIG. 18 is a partial cross-sectional view of a portion of the LED light bar 1600 of FIG. 16 showing representative air paths 1805 from the LED or LED die package 220 to the outside environment in accordance with the exemplary embodiment of FIG. 16. Referring to FIGS. 16-18, the layers of coating 1615 on the surface of the PC board 210 provides air channels 1610 in direct fluid communication with the cavity of the optic 110 and the LED or LED die package 220. These air channels 1610 also are in fluid communication with the breathing port apertures 1712 of the carrier material 1710. This combination of fluid communications provides a direct pathway for air and airborne contaminants to flow from the cavity of the optic 110 to the gap filler 240, if used, and out from the light bar 1600 to the surrounding environment, as shown in FIG. 18. In addition, according to some exemplary embodiments, the gap filler 240 provides a waterproof breathable membrane along the top layer of the adhesive layer 1780 for the light bar 1600. The first and second adhesive materials 1705, 1715 are constructed to prevent clogging of the air channels 1610 and the breathing port apertures 1712 and seal the light bar 1600 in such a manner as to achieve an IP 66 rating per international industry standard IEC-60529 for the ingress of contaminants. Furthermore, the first and second adhesive materials 1705, 1715 isolate the sealing area for the optic 110 from the air channels 1610 and the breathing port apertures 1712.

Referring now to FIG. 18, when the LED or LED die package 220 that is mounted to the PC board 210 is turned on, it generates heat. The build up of heat increases the pressure inside of optic 110. As the pressure increases beyond the pressure of the outside environment, the air or gas inside of the optic 110, which may include contaminants, wants to move to an area of lower pressure, which includes the outside environment. The air moves laterally along air path 1805 through the air channel 1610. When the air reaches a breathing port aperture 1712, the air moves vertically along air path 1805 through the breathing port aperture 1712 and through the gap filler 240 to the outside environment of the light bar 1600. Although not illustrated, it is also possible for air to flow in the opposite direction, from the outside environment to the area surrounding the LED or LED die package 220 under the optic 110. While the exemplary embodiment of FIGS. 16-18 shows the carrier material 1710, the first and second adhesive materials 1705, 1715, and the gap filler 240 as being separate components, one or more of the carrier material 1710, the first and second adhesive materials 1705, 1715, and the gap filler 240 are capable of being preassembled (with or without the inclusion of the optic 110) together as a single sandwich of layers to improve consistency and to reduce the time to apply these layers to the PC board 210.

Figure 19:
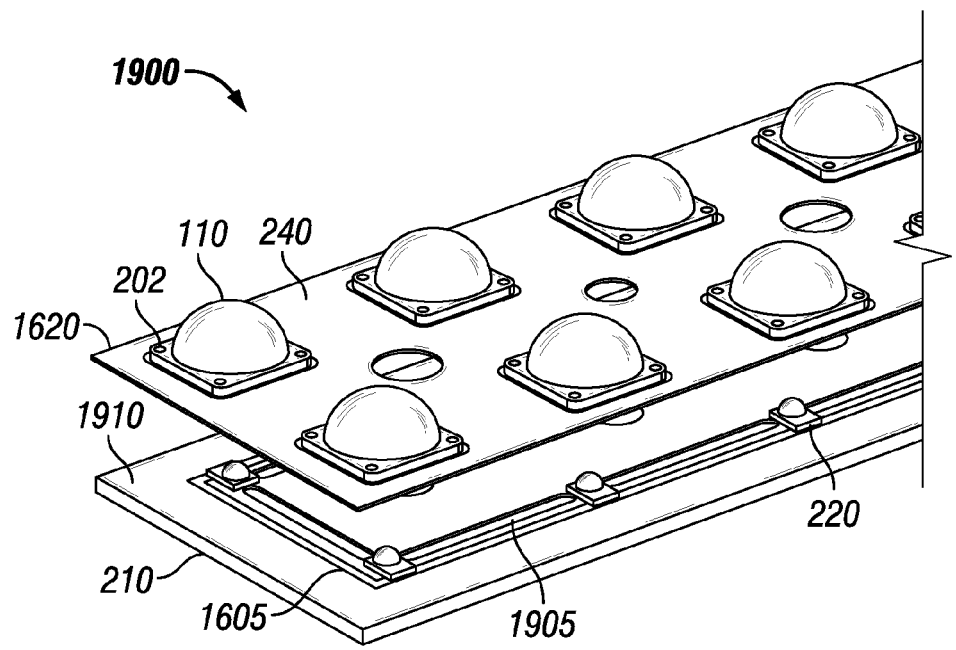
FIG. 19 is a partially exploded view of a portion of an LED light bar with one or more air channels in accordance with another exemplary embodiment of the present invention.
Figure 20:
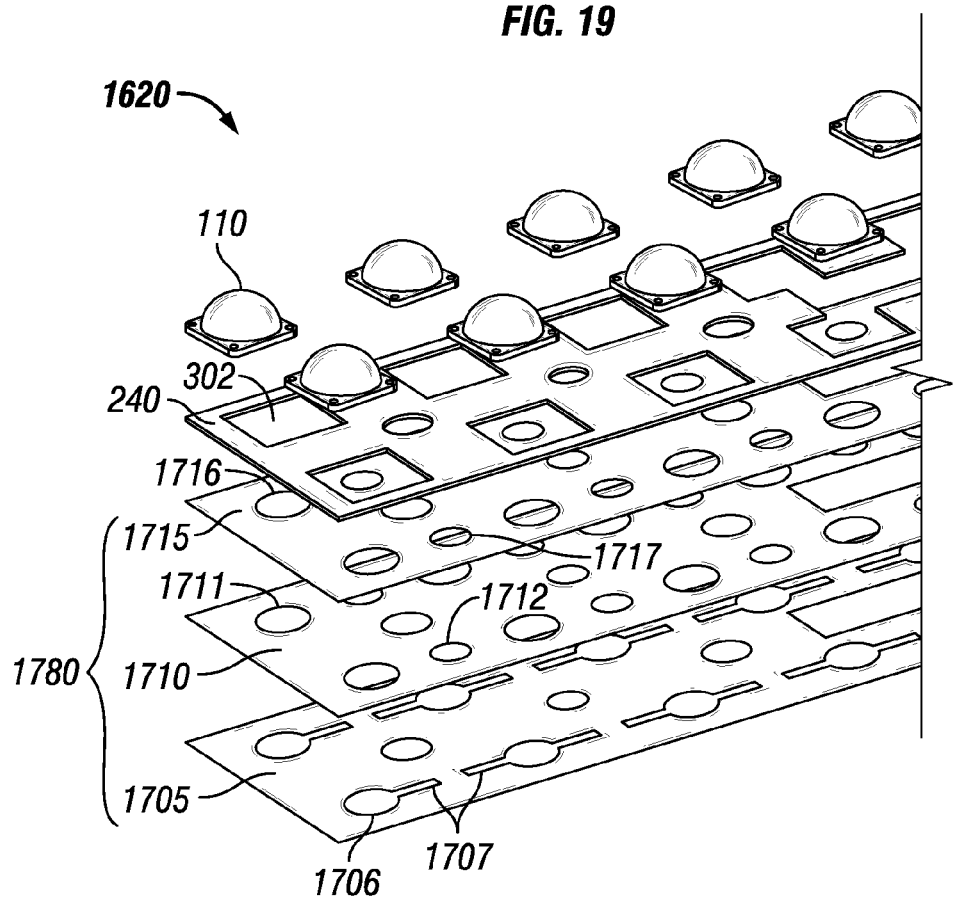
FIG. 20 is an exploded view of a portion of a lens set for the LED light bar of FIG. 19 having one or more air permeable layers in accordance with an exemplary embodiment of FIG. 19.
Figure 21:
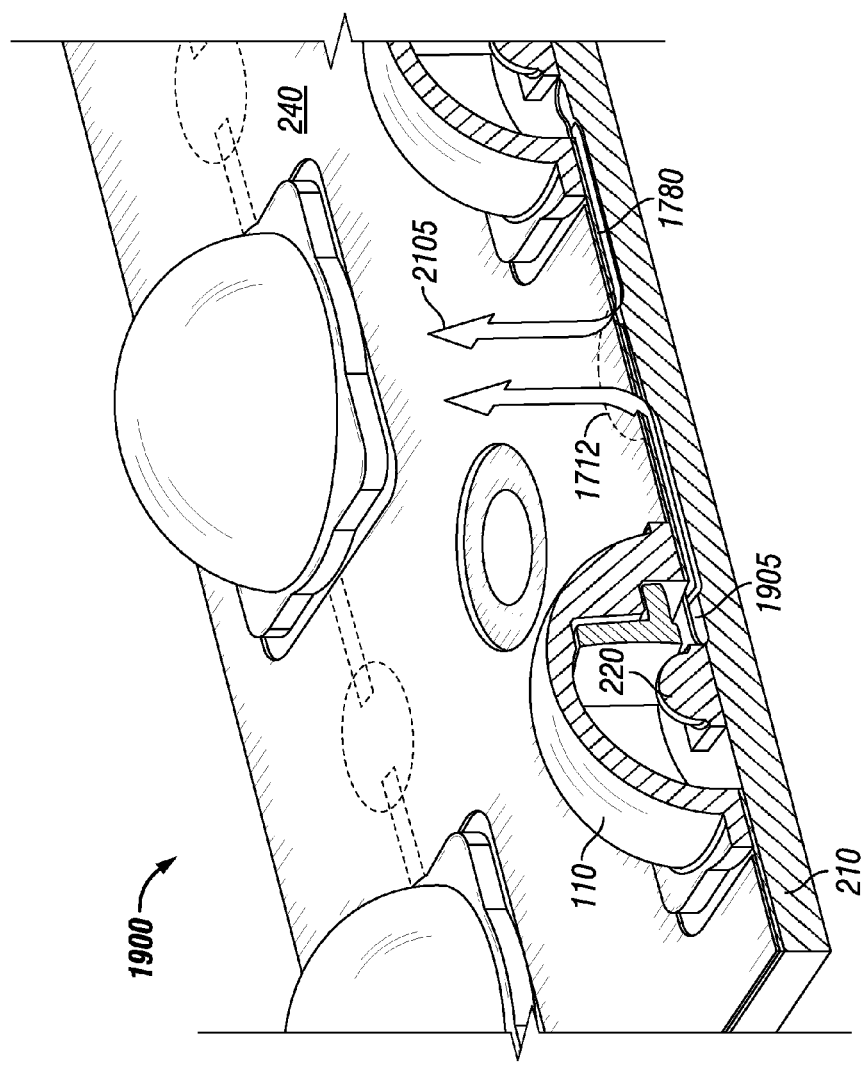
FIG. 21 is a partial cross-sectional view of a portion of the LED light bar of FIG. 19 showing representative air paths from the LED die package to the outside environment in accordance with the exemplary embodiment of FIG. 19.

FIGS. 19-21 present another exemplary embodiment for an LED light bar 1900 having one or more air permeable layers that provide air channels 1905 for air to enter and exit the area surrounding each LED or LED die package 220 and inside the cavity of the optic 110. FIG. 19 is a partially exploded view of a portion of an LED light bar 1900 with one or more air channels 1905 in accordance with another exemplary embodiment of the present invention. Referring now to FIG. 19, the exemplary light bar 1900 includes PC board 210, one or more LEDs or LED die packages 220 mounted to the PC board 210, and a lens set 1620, which includes one or more optics 110. Although several of these components have been previously described, further descriptions of certain components are provided in further detail below in accordance with the exemplary embodiment shown in FIGS. 19-21.

The PC board 210 includes one or more LED drivers 310 (FIG. 3) that provide power to the LEDs or LED die packages 220 that are mounted to the PC board 210. In addition, the PC board 210 includes circuit traces 1605 electrically coupled to the LED driver 310 (FIG. 3) and the LEDs or LED die packages 220. The circuit traces 1605 transmit power and/or control signals from the LED driver 310 (FIG. 3) to the LEDs or LED die packages 220. The PC board 210 also includes one or more air channels 1905 photo-chemically, laser, or mechanically etched into the top surface of the PC board 210. These air channels 1905 are typically adjacent to the LEDs or the LED die packages 220 and extend outwardly from the LEDs or the LED die packages 220 and towards another LED or LED die package 220. According to some exemplary embodiments, the air channel 1905 extending from one LED or LED die package 220 to another LED or LED die package 220 is continuous; however, the air channels 1905 can be discontinuous in other exemplary embodiments. In some exemplary embodiments, the PC board 210 also includes one or more layers of coating 1910 along the top surface of the PC board 210 in conjunction with the etched air channels 1905. The layers of coating 1905 are substantially similar to the layers of coating 1615 (FIG. 16) and will therefore not be described further.

Each LED or LED die package 220 includes at least one chip of semi-conductive material that is configured to release energy in the form of incoherent light. The optic 110 includes the flange portion 202 and is disposed over the LED or LED die package 220. The optic 110 receives the light emitted from the LED or LED die package 220 and distributes the light to a desired illumination area. In certain exemplary embodiments, the light bar 1900 also includes multiple mirrors 350 (FIG. 3). According to some exemplary embodiments, each mirror 350 (FIG. 3) is disposed about at least a portion of one of the LEDs or LED die packages 220 and under the optic 110. Each of the PC board 210, LEDs or LED die packages 220, optics 110, and mirrors 350 (FIG. 3) have been previously described and are applicable to the current exemplary embodiment.

FIG. 20 is an exploded view of a portion of a lens set 1620 for the LED light bar 1900 of FIG. 19 having one or more air permeable layers in accordance with an exemplary embodiment of FIG. 19. Referring to FIG. 20, the lens set 1620 includes an adhesive layer 1780, the gap filler 240, and one or more optics 110. The adhesive layer includes a carrier material 1710, a first adhesive material 1705, and a second adhesive material 1715. The carrier material 1710 includes one or more openings 1716 and one or more breathing port apertures 1717 and is substantially similar to the second carrier material 1220 (FIG. 12). The first adhesive material 1705 includes one or more openings 1706 and one or more air channels 1707 and is substantially similar to the second adhesive material 1215 (FIG. 12). The second adhesive material 1715 includes one or more openings 1716 and one or more breathing port apertures 1717 and is substantially similar to the third adhesive material 1225 (FIG. 12). Similarly, the gap filler 240, which includes apertures 302, and the optics 110 are substantially the same as described in previous exemplary embodiments. For the sake of brevity, the descriptions for each of the second carrier material 1220 (FIG. 12), the second adhesive material 1215 (FIG. 12), the third adhesive material 1225 (FIG. 12), the gap filler 240, and the optics 110 of previously described embodiments are incorporated herein with respect to the exemplary embodiment shown in FIGS. 19-21, and will not be repeated.

When the sandwich layers are combined to form the adhesive layer 1780, the first adhesive material 1705 on the bottom side of the carrier material 1710 allows the carrier material 1710 to adhere to the layers of coating 1615 on the PC board 210. The second adhesive material 1715 on the top side of the carrier material 1710 allows optics 110 and the gap filler 240, if used, to adhere to the carrier material 1710. The breathing port apertures 1712 of the carrier material 1710 are positioned such that they are in vertical alignment with at least a portion of the air channels 1905.

FIG. 21 is a partial cross-sectional view of a portion of the LED light bar 1900 of FIG. 19 showing representative air paths 1905 from the LED or LED die package 220 to the outside environment in accordance with the exemplary embodiment of FIG. 19. Referring to FIGS. 19-21, the etching performed on the surface of the PC board 210 provides air channels 1905 in direct fluid communication with the cavity of the optic 110 and the LED or LED die package 220. These air channels 1610 also are in fluid communication with the breathing port apertures 1712 of the carrier material 1710. This combination of fluid communications provides a direct pathway for air and airborne contaminants to flow from the cavity of the optic 110 to the gap filler 240, if used, and out from the light bar 1900 to the surrounding environment, as shown in FIG. 21. In addition, according to some exemplary embodiments, the gap filler 240 provides a waterproof breathable membrane along the top layer of the adhesive layer 1780 for the light bar 1900. The first and second adhesive materials 1705, 1715 are constructed to prevent clogging of the air channels 1905 and the breathing port apertures 1712 and seal the light bar 1900 in such a manner as to achieve an IP 66 rating per international industry standard IEC-60529 for the ingress of contaminants. Furthermore, the first and second adhesive materials 1705, 1715 isolate the sealing area for the optic 110 from the air channels 1905 and the breathing port apertures 1712.

Referring now to FIG. 21, when the LED or LED die package 220 that is mounted to the PC board 210 is turned on, it generates heat. The build up of heat increases the pressure inside of optic 110. As the pressure increases beyond the pressure of the outside environment, the air or gas inside of the optic 110, which may include contaminants, wants to move to an area of lower pressure, which includes the outside environment. The air moves laterally along air path 2105 through the air channel 1905. When the air reaches a breathing port aperture 1712, the air moves vertically along air path 1805 through the breathing port aperture 1712 and through the gap filler 240 to the outside environment of the light bar 1900. Although not illustrated, it is also possible for air to flow in the opposite direction, from the outside environment to the area surrounding the LED or LED die package 220 under the optic 110. While the exemplary embodiment of FIGS. 19-21 shows the carrier material 1710, the first and second adhesive materials 1705, 1715, and the gap filler 240 as being separate components, one or more of the carrier material 1710, the first and second adhesive materials 1705, 1715, and the gap filler 240 are capable of being preassembled (with or without the inclusion of the optic 110) together as a single sandwich of layers to improve consistency and to reduce the time to apply these layers to the PC board 210.

Figure 22:
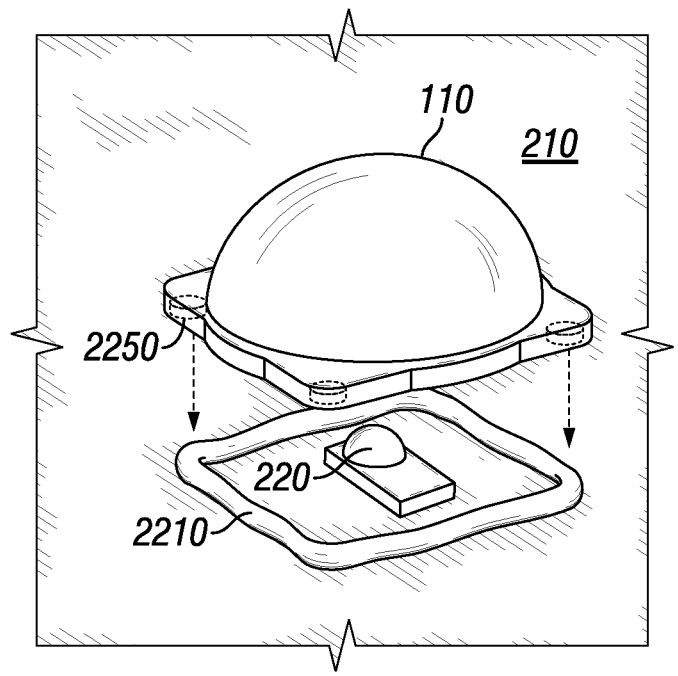
FIG. 22 illustrates an LED light source and an optic with a fluid deposition surrounding the LED light source to seal the optic to the PC board in accordance with another exemplary embodiment of the present invention.

FIG. 22 illustrates an LED light source 220 and an optic 110 with a fluid deposition 2210 surrounding the LED light source 220 to seal the optic 110 to a PC board 210 in accordance with another exemplary embodiment of the present invention. The LED light source can be either a single LED, an LED die package, or a combination of both. The optic 110 includes a flange portion 202, as previously described. The fluid deposition 2210 is formed from silicone and is deposited onto the top surface of the PC board 210 to surround the LED light source 220. However, according to other exemplary embodiments, the fluid deposition 2210 can be formed from other types of adhesive materials, which include, but are not limited to, acrylics, epoxies, and other types of gas-permeable adhesive materials. The flange portion 202 is positioned on the fluid deposition 2210 and surrounds the LED light source 220. The fluid deposition 2210 is deposited onto the PC board in a manner such that once the optic 110 is placed on top of the fluid deposition 2210, the fluid deposition 2210 does not enter into the cavity area of the optic 110. Although one LED light source 220 and a corresponding optic 110 is shown on the PC board 210, multiple LEDs or LED die packages 220 with corresponding optics 110 are coupled directly or indirectly to the PC board 210, in either a uniform or non-uniform pattern, in other exemplary embodiments. The PC board 210 is used within a light bar (not shown) according to some exemplary embodiments.

According to some exemplary embodiments, the fluid deposition 2210 is placed on the PC board 210 using a silk screen adhesive, which can be performed using a machine or manually. Alternatively, according to other exemplary embodiments, the fluid deposition 2210 is placed on the PC board 210 by injecting the fluid on the PC board 210 using an injection tool, which can be performed using a machine or manually. According to some exemplary embodiments, a "pick and place" machine (not shown) is used to properly align the optics 110 while attaching the optics 110 to the fluid deposition 2210. In accordance with some exemplary embodiments shown in FIG. 22, a pick and place machine is programmed and/or manually operated for picking and placing one or more optics 110 on a PC board 210 with the fluid deposition 2210 for sealing the optics 110 to the PC board 210.

Figure 24:
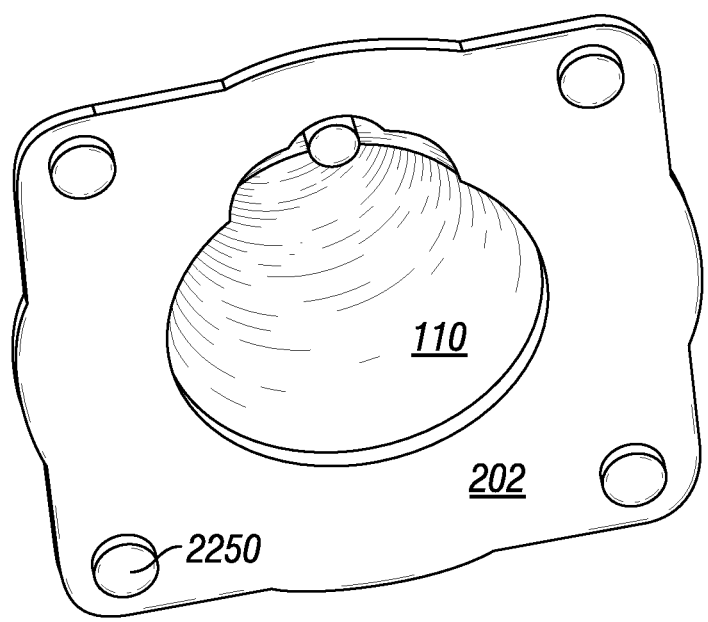
FIG. 24 illustrates a bottom view of an optic in accordance with one exemplary embodiment of the present invention.

In some exemplary embodiments, the thickness of the fluid deposition 2210 is set such that the fluid deposition 2210 provides a desired location of the optic 110 in the vertical (or "Z") axis relative to the LED light source 220 while sealing the optic 110 to the PC board 210. Alternatively or additionally, each optic 110 includes two or more support structures 2250 extending away from the flange portion 202 of the optic 110 and in a direction towards the PC board 210 once the optic 110 is placed onto the PC board 110. The length of the support structures 2250 is set such that a dome-shaped portion of the optic 110 is positioned at a desired location in the vertical (or "Z") axis relative to the LED light source 220. According to some exemplary embodiments, the length of the support structures 2250 are ten thousandths of an inch; however, the length of the support structures 2250 can vary depending upon designer preferences. FIG. 24 illustrates a bottom view of the optic 110 in accordance with one or more exemplary embodiments of the present invention. These support structures 2250 are more clearly visible in FIG. 24.

Figure 23:
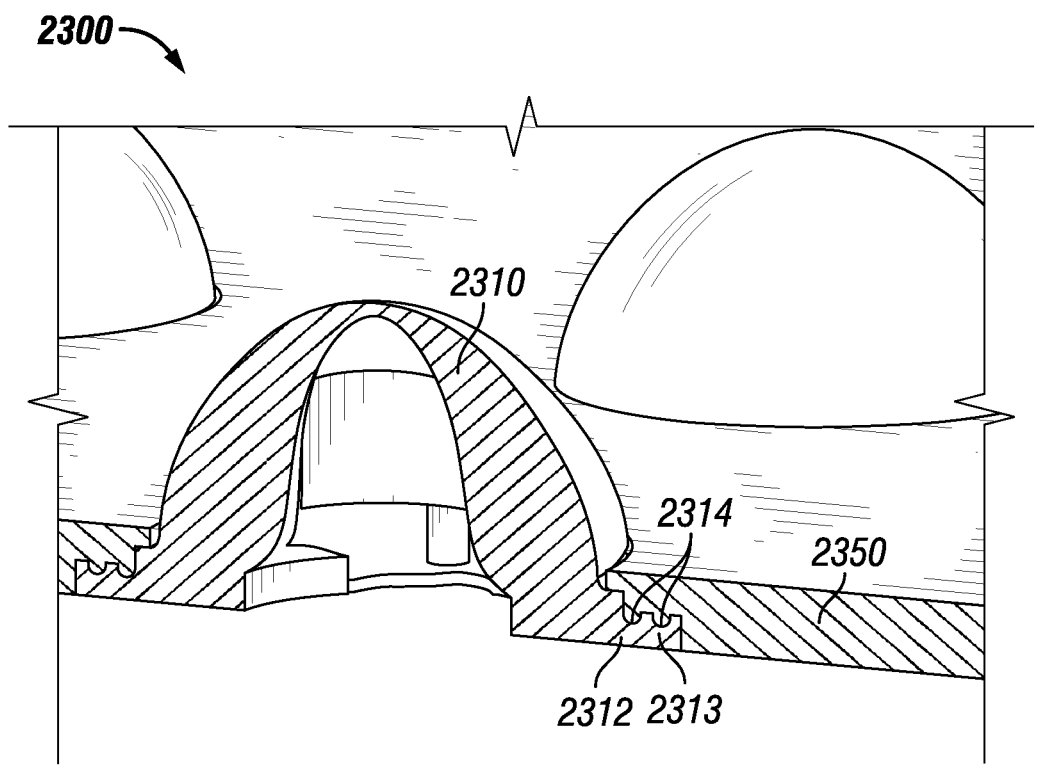
FIG. 23 illustrates a cross-sectional view of a portion of a light bar having an optic formed with, and rigidly held in place by, an over mold material where the over mold material provides a bond between the optic and utilizes grooves or slots on a flange of the optic for bonding the optic with an over mold material in accordance with another exemplary embodiment of the present invention.

FIG. 23 illustrates a cross-sectional view of a portion of a light bar 2300 having an optic 2310 formed with, and rigidly held in place by, an over mold material 2350 where the over mold material 2350 provides a bond between the optic 2310 and utilizes grooves or slots 2314 on a flange portion 2312 of the optic 2310 for bonding the optic 2310 with an over mold material 2350 in accordance with another exemplary embodiment of the present invention. Referring to FIG. 23, the light bar 2300 includes the optic 2310 and the over mold material 2350 that is used to bond the optic 2310 to a PC board (not shown).

The optic 2310 includes the flange portion 2312, where at least a portion of the flange portion 2312 is designed or modified to add or enlarge a "landing area" 2313 for better adhesion to the over mold material 2350 during the over mold injection process. One example of an over mold injection process is described below in conjunction with FIG. 25. The "landing area" 2313 is that portion of the flange portion 2312 that bonds with the over mold material 2350. According to some exemplary embodiments, the entire flange portion 2312 is the "landing area" 2313; however, according to other exemplary embodiments, a portion of the flange portion 2312 is the "landing area" 2313. According to some exemplary embodiments, the "landing area" 2313 of the flange portion 2312 is designed or modified to further aid in adhesion to the over mold material 2350 by making the surface of the landing area 2313 include bonding enhancement features 2314. These bonding enhancement features 2314 includes one or more of a coarse surface, notches, grooves, or other features, such as a non-planar surface, that can enhance bonding of the over mold material 2350 to the "landing area" 2313. For instance, the bonding enhancement features 2314 are incorporated into at least a portion of the flange portion 2312 to allow the over mold material 2350 to encapsulate at least the outer most portion of the flange portion 2312, thereby increasing the seal and/or adhesion between the over mold material 2350 and the flange portion 2312.

The over mold material 2350 is fabricated using EPDM according to some exemplary embodiments. However, according to other exemplary embodiments, the over mold material 2350 is fabricated using an acrylic material, a polycarbonate material, or some other suitable material known to people having ordinary skill in the art and having the benefit of the present disclosure. In some exemplary embodiments, the over mold material 2350 is fabricated using the same material as used to fabricate the optic 110; however, a different material can be used to fabricate the over mold material 2350 than used for fabricating the optic 110.

According to some exemplary embodiments, the optic 2310 is similar to optic 110 (FIG. 24) in that the optic 2310 includes two or more support structures 2250 (FIG. 24) extending away from the flange portion 2312 of the optic 2310 and in a direction towards the PC board once the optic 2310 is placed onto the PC board. The length of the support structures 2250 (FIG. 24) is set such that a dome-shaped portion of the optic 2310 is positioned at a desired location in the vertical (or "Z") axis relative to the LED light source (not shown).

Figure 25:
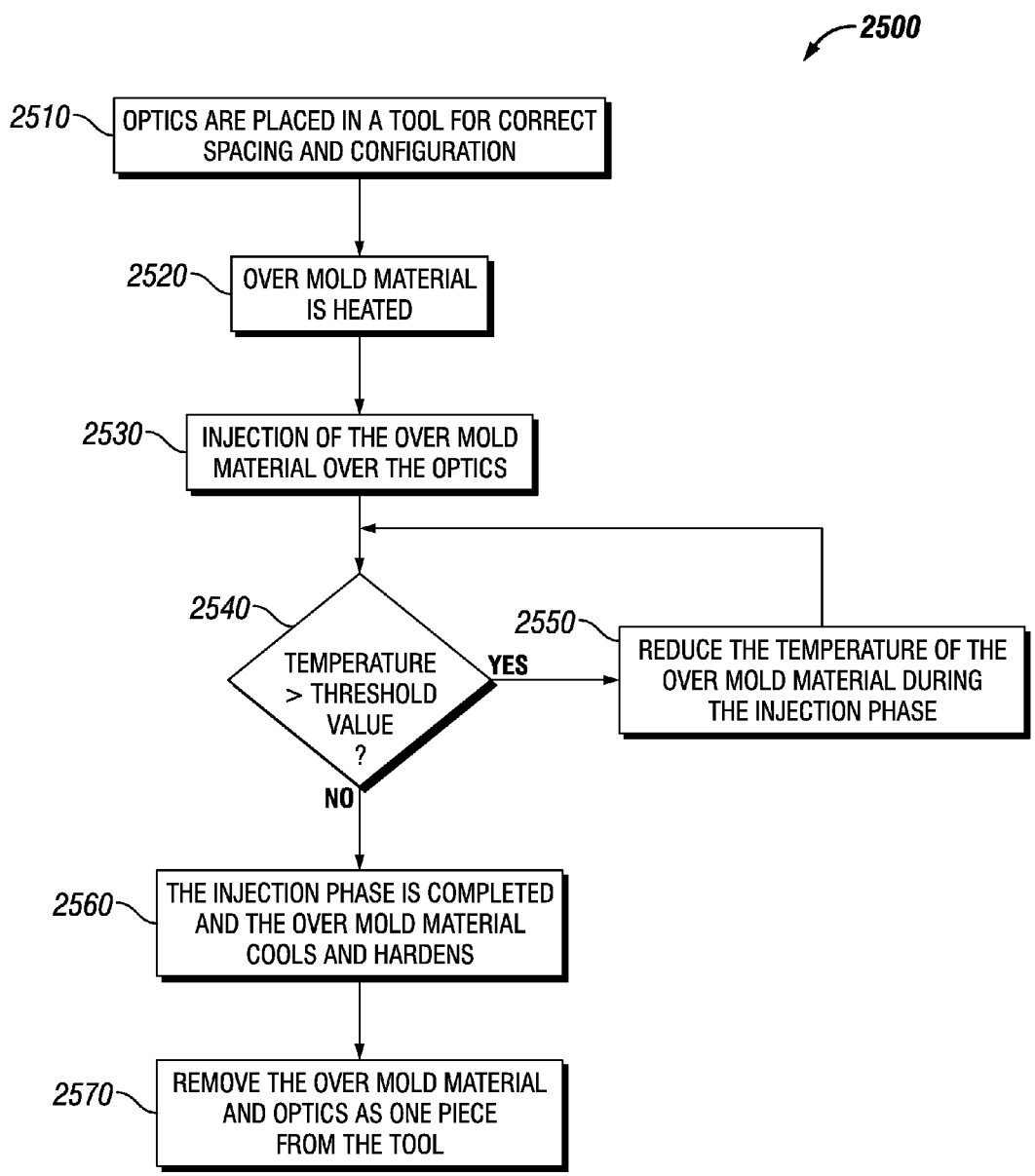
FIG. 25 illustrates a flowchart of a method for performing an over mold injection process in accordance with one exemplary embodiment of the present invention.

FIG. 25 illustrates a flowchart 2500 of a method for performing an over mold injection process in accordance with one exemplary embodiment of the present invention. In accordance with one exemplary embodiment, the over mold material, which is fabricated from EPDM, an acrylic material, a polycarbonate material, or any other suitable material known to people having ordinary skill in the art, is injected over one or more optics. During the injection process, a tool is used to hold the optics in place during injection of the over mold material. Referring to FIG. 25, the injection process begins at block 2510 where the optics are placed in a tool for correct spacing and configuration. Next, block 2520 is invoked where the over mold material is heated until it is ready to be injected in block 2530. The over mold material is injected over the optics in block 2530. In some exemplary embodiments, the over mold material is fabricated using a thermoplastic elastomer ("TPE") material. In other exemplary embodiments of the invention, the over mold material is fabricated using another elastomer material (e.g., EPDM material, other plastic material, or the like), an acrylic material, or any other suitable material that provides a bond between the optic and a circuit board.

In some exemplary embodiments of the invention, the over mold material is dyed a particular color prior to or during the injection process; however, in other exemplary embodiments, the color of the over mold material remains a natural color of the over mold material. In some exemplary embodiments, the dyed color of the over mold material acts as an indicator during the manufacturing process or maintenance of the light module (e.g., light bar) incorporating the over mold material. For example, the dyed color provides an indication of the over mold material that it is present within the light bar. In another example, the dyed color provides a quick indication that the injection process has been completed during the manufacturing process. In certain exemplary embodiments, color aids in the easier inspection of the over mold material within the light bar. For example, the color allows faults in the over mold material easier to detect in certain exemplary embodiments. The color of the over mold material is chosen for its aesthetic look or its affect on the light emitted from the light bar according to some exemplary embodiments.

In some exemplary embodiments of the invention, the tool is designed to restrict the flow of the over mold material during the injection process such that there is no flow around the functioning portion of the optic. The method of injecting the over mold material over the optics is temperature sensitive. In certain exemplary embodiments, the temperature of the over mold material during the injection process exceeds the melting point of the over mold material to allow for adequate distribution and adhesion to the optics and the PC board. However, during the injection process the temperature of the over mold material is not high enough to deform or degrade the material used to form the optic. If the temperature of the over mold material causes the optic to deform or degrade, the optic performance is degraded and/or optic alignment with its corresponding LED light source is changed. As shown in FIG. 25, the temperature of the over mold material is monitored in block 2540. If the temperature of the over mold material exceeds a threshold value, then block 2550 is invoked to reduce the temperature of the over mold material during the injection process. In an example embodiment of the invention, the temperature threshold value is a temperature value below a temperature where the optic material, which is a form of plastic, glass, or other suitable transparent or translucent material, is adversely impacted or damaged by the heat. The temperature at which the optic material is adversely impacted or damaged by the heat is referred to as the critical temperature of the optic 110. In other exemplary embodiments of the invention, the temperature monitoring processes described in blocks 2540 and 2550 are avoided by limiting the means of heating the over mold material to not exceed a particular temperature threshold, thereby avoiding any damage to the optic and/or misalignment of the optic.

Next, block 2560 is invoked where the over mold material cools and hardens. As the over mold material cools and hardens, the over mold material becomes integrated with the optics and such the optics and the over mold material become essentially one piece. Block 2570 is then invoked to remove the over mold material and optics as one piece from the tool. When coupled to the circuit board, this one piece construction seals the LED packages and the optics in the proper alignment while improving the weatherproofing and tamper-proofing properties of the light bar.

Although the blocks 2510, 2520, 2530, 2540, 2550, 2560, and 2570 are presented and described in a certain order, one or more of the blocks 2510, 2520, 2530, 2540, 2550, 2560, and 2570 are performed in a different order than that described according to other exemplary embodiments. The order in which the blocks 2510, 2520, 2530, 2540, 2550, 2560, and 2570 have been described are not meant to be limiting and should not be construed as such. Also, additional blocks having certain steps being performed can be included without departing from the scope and spirit of the exemplary embodiment.

Figure 26:
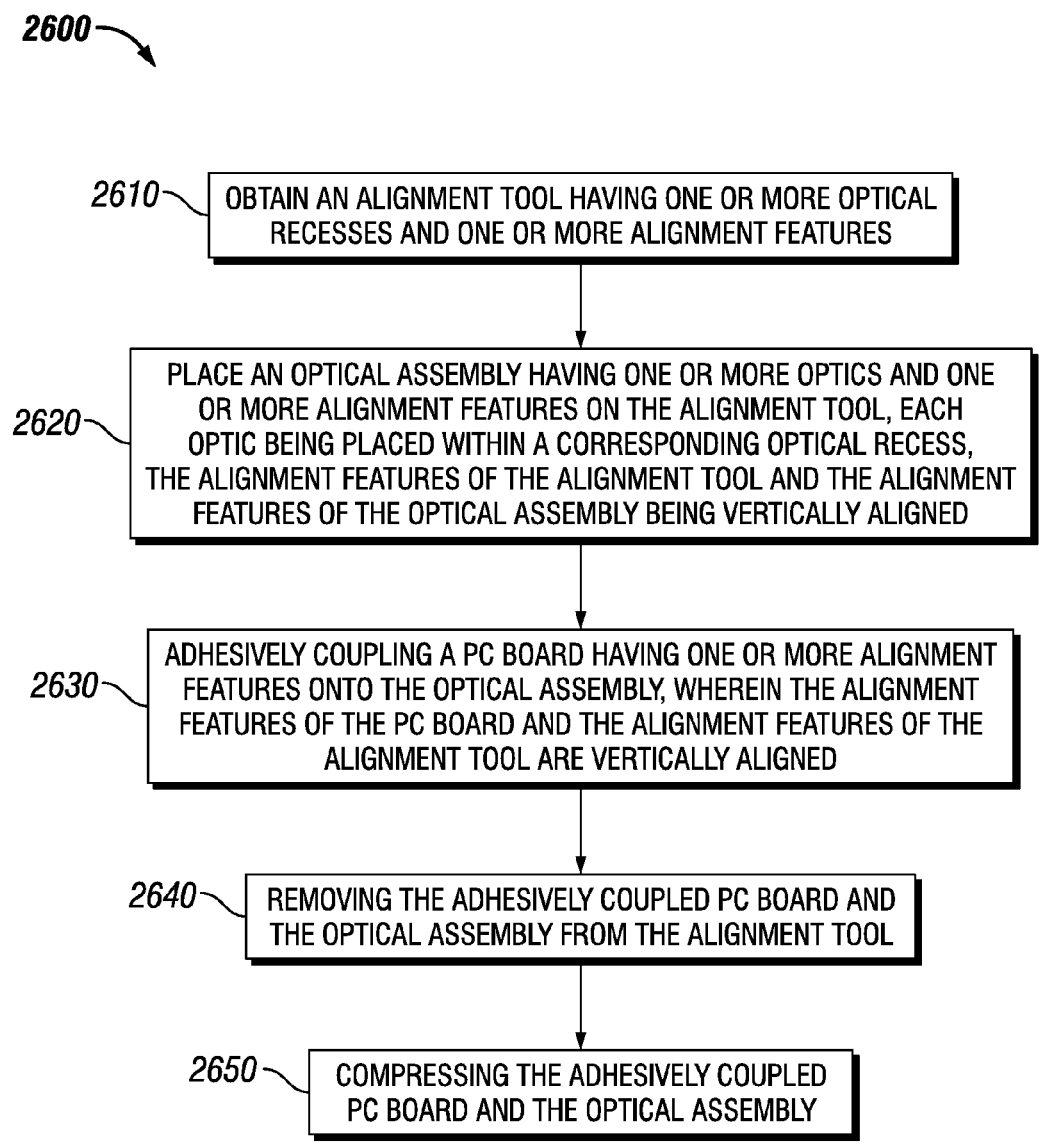
FIG. 26 illustrates a flowchart of a method for assembling a portion of the light bar incorporating the use of one of the adhesive layers in accordance with one exemplary embodiment of the invention.
Figure 27:
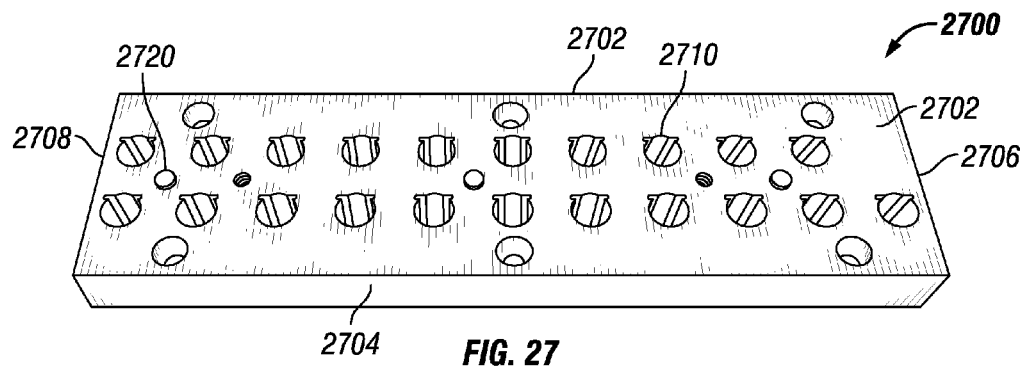
FIG. 27 shows a perspective view of an alignment tool having one or more optical recesses and one or more alignment features in accordance with one exemplary embodiment.
Figure 28:
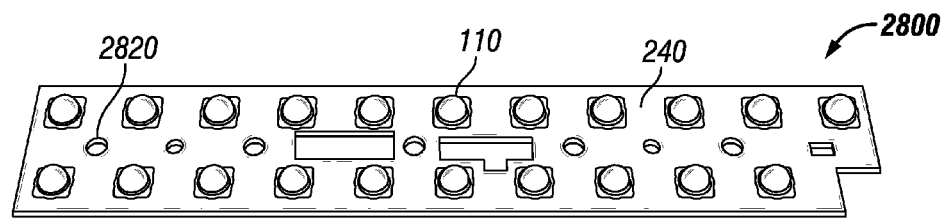
FIG. 28 shows a perspective view of an optical assembly in accordance with an exemplary embodiment.
Figure 29:
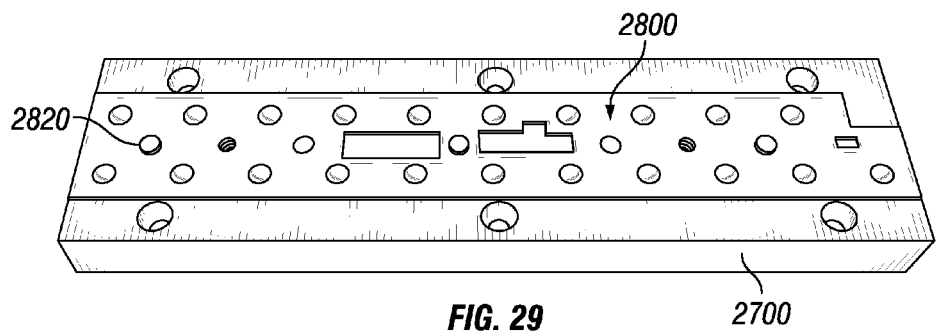
FIG. 29 shows the optical assembly placed on the alignment tool in accordance with an exemplary embodiment.
Figure 30:
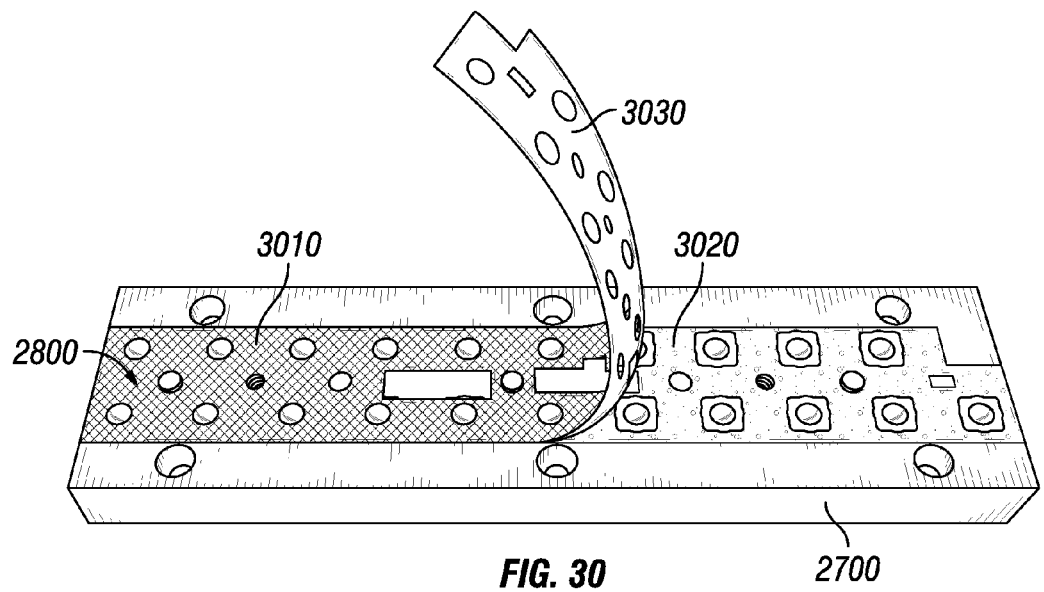
FIG. 30 shows a backing material being removed from the optical assembly to expose the adhesive material in accordance with one exemplary embodiment.
Figure 31:
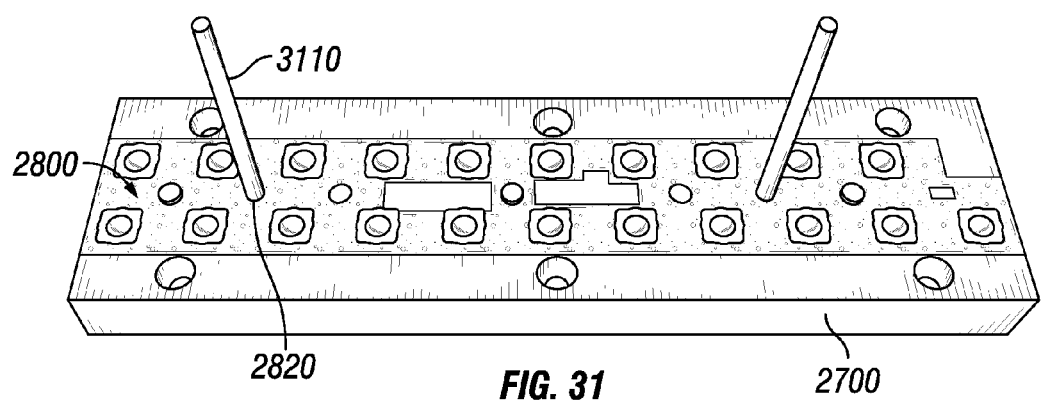
FIG. 31 shows an alignment device inserted through one or more alignment features of the optical assembly and into the one or more vertically aligned alignment features of the alignment tool in accordance with an exemplary embodiment.
Figure 32:
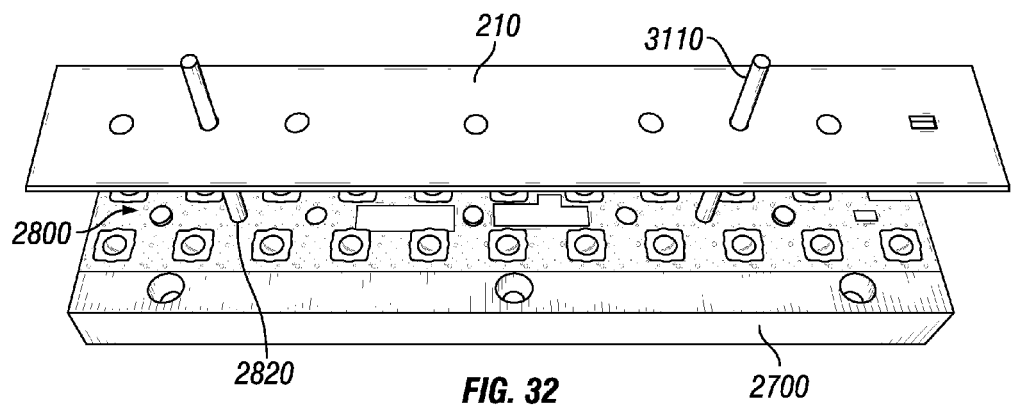
FIG. 32 shows a PC board being aligned with the optical assembly in accordance with one exemplary embodiment.
Figure 33:
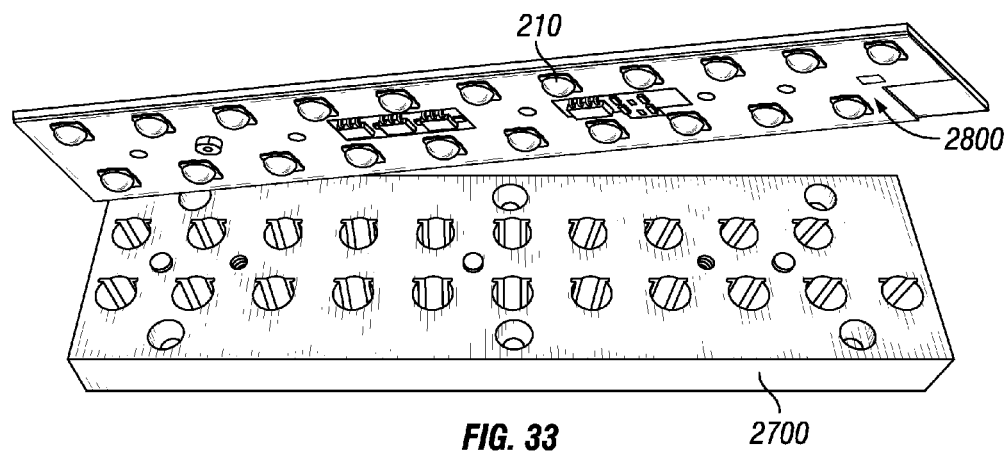
FIG. 33 shows the adhesively coupled PC board and the optical assembly being removed from the alignment tool in accordance with one exemplary embodiment.
Figure 34:
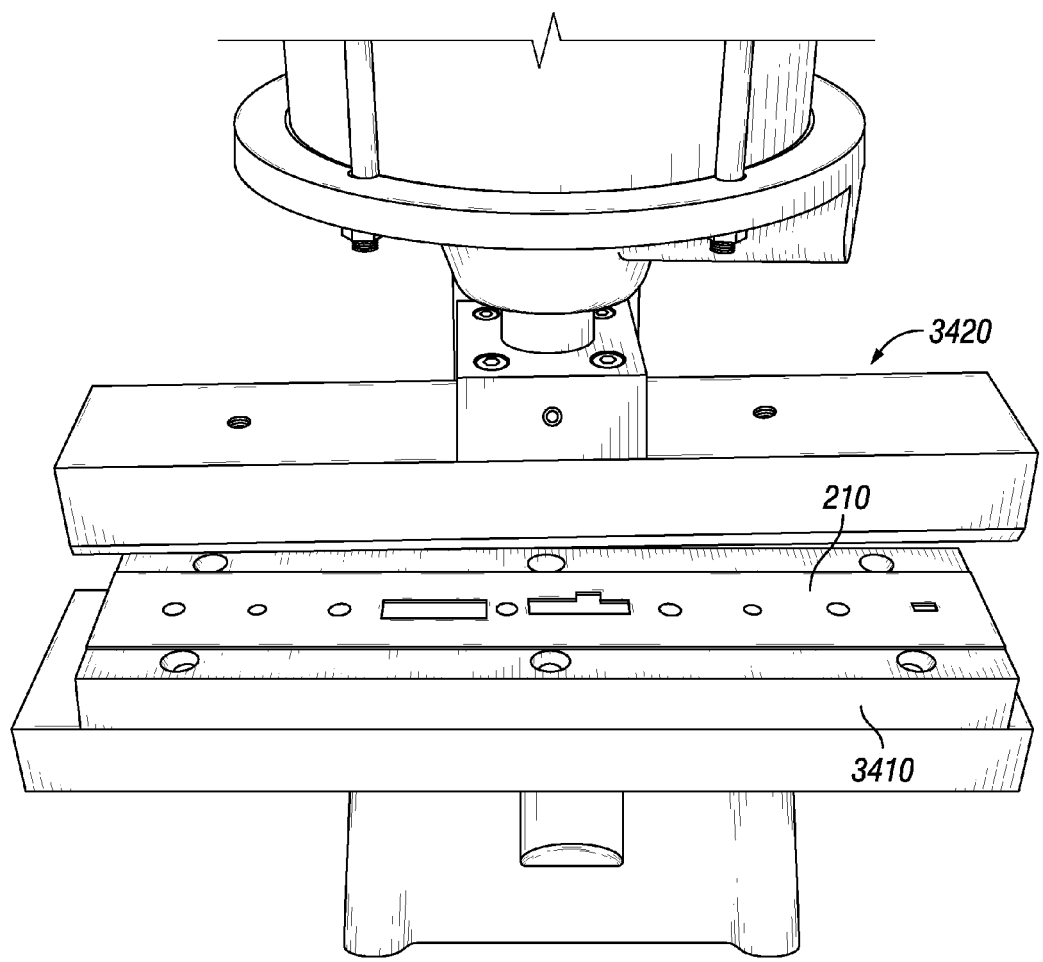
FIG. 34 shows the adhesively coupled PC board and the optical assembly being compressed in accordance with one exemplary embodiment.

FIG. 26 illustrates a flowchart 2600 of a method for assembling a portion of the light bar incorporating the use of one of the adhesive layers in accordance with one exemplary embodiment of the invention. FIG. 27 shows a perspective view of an alignment tool 2700 having one or more optical recesses 2710 and one or more alignment features 2720 in accordance with one exemplary embodiment. FIG. 28 shows a perspective view of an optical assembly 2800 in accordance with an exemplary embodiment. FIG. 29 shows the optical assembly 2800 placed on the alignment tool 2700 in accordance with an exemplary embodiment. FIG. 30 shows a backing material 3030 being removed from the optical assembly 2800 to expose the adhesive material 3020 in accordance with one exemplary embodiment. FIG. 31 shows an alignment device 3110 inserted through one or more alignment features 2820 of the optical assembly 2800 and into the one or more vertically aligned alignment features 2720 of the alignment tool 2700 in accordance with an exemplary embodiment. FIG. 32 shows a PC board 210 being aligned with the optical assembly 2700 in accordance with one exemplary embodiment. FIG. 33 shows the adhesively coupled PC board 210 and the optical assembly 2800 being removed from the alignment tool 2700 in accordance with one exemplary embodiment. FIG. 34 shows the adhesively coupled PC board 210 and the optical assembly 2800 being compressed in accordance with one exemplary embodiment. Referring to FIGS. 26-34, the method begins at block 2610 where an alignment tool 2700 having one or more optical recesses 2710 and one or more alignment features 2720 is obtained. In one example, block 2610 is illustrated in FIG. 27. The alignment tool 2700 is fabricated from aluminum; however, other suitable materials, including, but not limited to, other metals, metal alloys, and polymers can be used in other exemplary embodiments. The alignment tool 2700 includes a first longitudinal edge 2702, a second longitudinal edge 2704 substantially parallel to the first longitudinal edge 2702, a first latitudinal edge 2706, and a second latitudinal edge 2708 substantially parallel to the first latitudinal edge 2706. Although the alignment tool 2700 is illustrated as being substantially rectangularly-shaped, the alignment tool 2700 can be shaped into any other geometric or non geometric shape. The optical recesses 2710 are positioned on a first surface 2702 of the alignment tool 2700 and are arranged in two rows with one row having eleven optical recesses 2710 and the second row having ten optical recesses 2710. The number of optical recesses 2710 is greater or fewer than twenty-one in other exemplary embodiments and can be arranged in greater or fewer rows. Additionally, each row includes greater or fewer optical recesses 2710 in other exemplary embodiments. The positioning of the optical recesses 2710 is determined by the desired positioning of the optics 110 in the assembled light bar. Although a certain number of optical recesses 2710 are positioned within the alignment tool 2700, the assembled light bar can have fewer optics 110 than the number of optical recesses 2710 according to some exemplary embodiments. The alignment tool also includes one or more alignment features 2720. According to some exemplary embodiments, the alignment feature 2720 includes an opening. However, in other exemplary embodiments, the alignment feature 2720 includes a protrusion, rod, dowel, or other suitable alignment feature that extends substantially vertically from the first surface 2702.

Next, block 2620 is invoked where the optical assembly 2800 having one or more optics 110 and one or more alignment features 2820 is placed on the alignment tool 2700 such that each optic 110 is placed within a corresponding optical recess 2710 and the alignment features 2720 of the alignment tool 2700 and the alignment features 2820 of the optical assembly 2800 are substantially vertically aligned. In one example, block 2620 is illustrated in FIGS. 28 and 29. In accordance with some exemplary embodiments, the optical assembly 2800 includes one of the several adhesive layers that have previously been described and one or more optics 110 adhesively coupled to the adhesive layer. The optics 110 also have been previously described. However, in certain exemplary embodiments, the optical assembly 2800 also includes the gap filler 240 which is coupled to the adhesive layer and disposed around the optics 110. The gap filler 240 is optional and has been previously described.

One example of the alignment features 2820 of the optical assembly 2800 includes openings. In the exemplary embodiment where the alignment features 2720 of the alignment tool 2700 and the alignment features 2820 of the optical assembly 2800 are openings, the alignment features 2720, 2820 are positioned to be vertically aligned. In the exemplary embodiment where the alignment features 2720 of the alignment tool 2700 are a protrusion, rod, dowel, or other similar device and the alignment features 2820 of the optical assembly 2800 are openings, the alignment features 2720 are inserted through corresponding vertically aligned alignment features 2820 of the optical assembly 2800. This vertical alignment of the alignment features 2720, 2820 and insertion of the optics 110 into the recesses 2710 facilitate proper orientation and alignment of the optics 110 once coupled to a PC board having one or more LEDs.

An adhesive material 3020 within the adhesive layer is exposed along a surface 3010 of the optical assembly 2800. The adhesive material 3020 is similar to the previously described adhesive materials in accordance with the exemplary embodiments. According to some exemplary embodiments, the adhesive material 3020 is already exposed. However, according to some other exemplary embodiments, the adhesive material 3020 is yet to be exposed. FIG. 30 shows a backing material 3030 being removed from the optical assembly 2800 to expose the adhesive material 3020 in accordance with one exemplary embodiment. In the exemplary embodiments where the adhesive material 3020 is yet to be exposed, the backing material 3030 is peeled off. In the exemplary embodiments where the alignment features 2720 of the alignment tool 2700 are openings, an alignment device 3110, as shown in FIG. 31, is inserted through one or more alignment features 2820 of the optical assembly 2800 and into the one or more vertically aligned alignment features 2720 of the alignment tool 2700. In some exemplary embodiments, the alignment features 2720 of the alignment tool 2700 are threaded and the alignment devices 3110 are screwed into the alignment features 2720.

Upon exposure of the adhesive material 3020, block 2630 is invoked where a PC board 210 having one or more alignment features 3220 is adhesively coupled to the optical assembly 2800, wherein the alignment features 3220 of the PC board 3210 and the alignment features 2720 of the alignment tool 2700 are vertically aligned. In one example, block 2630 is illustrated in FIGS. 30-32. According to some exemplary embodiments, the alignment feature 3220 includes an opening. According to these exemplary embodiments, the alignment features 3220 are inserted around the corresponding alignment features 2720 of the alignment tool 2700 or the alignment devices 3110 depending upon the exemplary embodiment. Although not seen in FIG. 32, the PC board 210 includes a first surface (not shown) and a second surface 3230 opposite the first surface, where the first surface includes one or more LEDs coupled thereto. As the PC board 210 is adhesively coupled to the optical assembly 2800, one or more LEDs are moved closer to a corresponding optic 110 until each optic 110 surrounds one or more LEDs. At this stage, the optical assembly 2800 is not hermetically sealed with the PC board 210.

Once the PC board 210 is adhesively coupled to the optical assembly 2800, block 2640 is invoked where the adhesively coupled PC board 210 and the optical assembly 2800 (collectively, the "light bar" 110) are removed from the alignment tool 2700. In one example, block 2640 is illustrated in FIG. 33.

Block 2650 is invoked, where the adhesively coupled PC board 210 and the optical assembly 2800 are compressed. At this stage, the optical assembly 2800 becomes hermetically sealed with the PC board 210. In one example, block 2650 is illustrated in FIG. 34. According to one exemplary embodiment, the adhesively coupled PC board 210 and the optical assembly 2800 are placed in a compression tool 3410, which is then placed into a press unit 3420. According to some exemplary embodiments, the compression tool 3410 is fabricated using at least a rubber material; however, other suitable materials, such as a polymer material or other compressible material, that provides some compliance can be used. The press unit 3420 provides a force, directly or indirectly, onto the compression tool 3410 which thereby hermetically seals the optical assembly 2800 to the PC board 210. The force provided by the press unit 3420 is a pneumatic force according to some exemplary embodiments, but can be other force types, such as a mechanical force, according to other exemplary embodiments.

The apparatuses and processes described above allow for the optics 110 to be precisely aligned over and around the LEDs coupled to the PC board 210. Thus, the desired optical performance is achievable in a repeatable manner. Although the process utilizes a combination of manual and machine performed steps, the steps are performable entirely manually, entirely by machine, or a combination of machine and manual steps, but differently than that described above in other exemplary embodiments. Although the blocks 2610, 2620, 2630, 2640, and 2650 are presented and described in a certain order, one or more of the blocks 2610, 2620, 2630, 2640, and 2650 are performed in a different order than that described according to other exemplary embodiments. The order in which the blocks 2610, 2620, 2630, 2640, and 2650 have been described are not meant to be limiting and should not be construed as such. Also, additional blocks having certain steps being performed can be included without departing from the scope and spirit of the exemplary embodiment.

Figure 35:
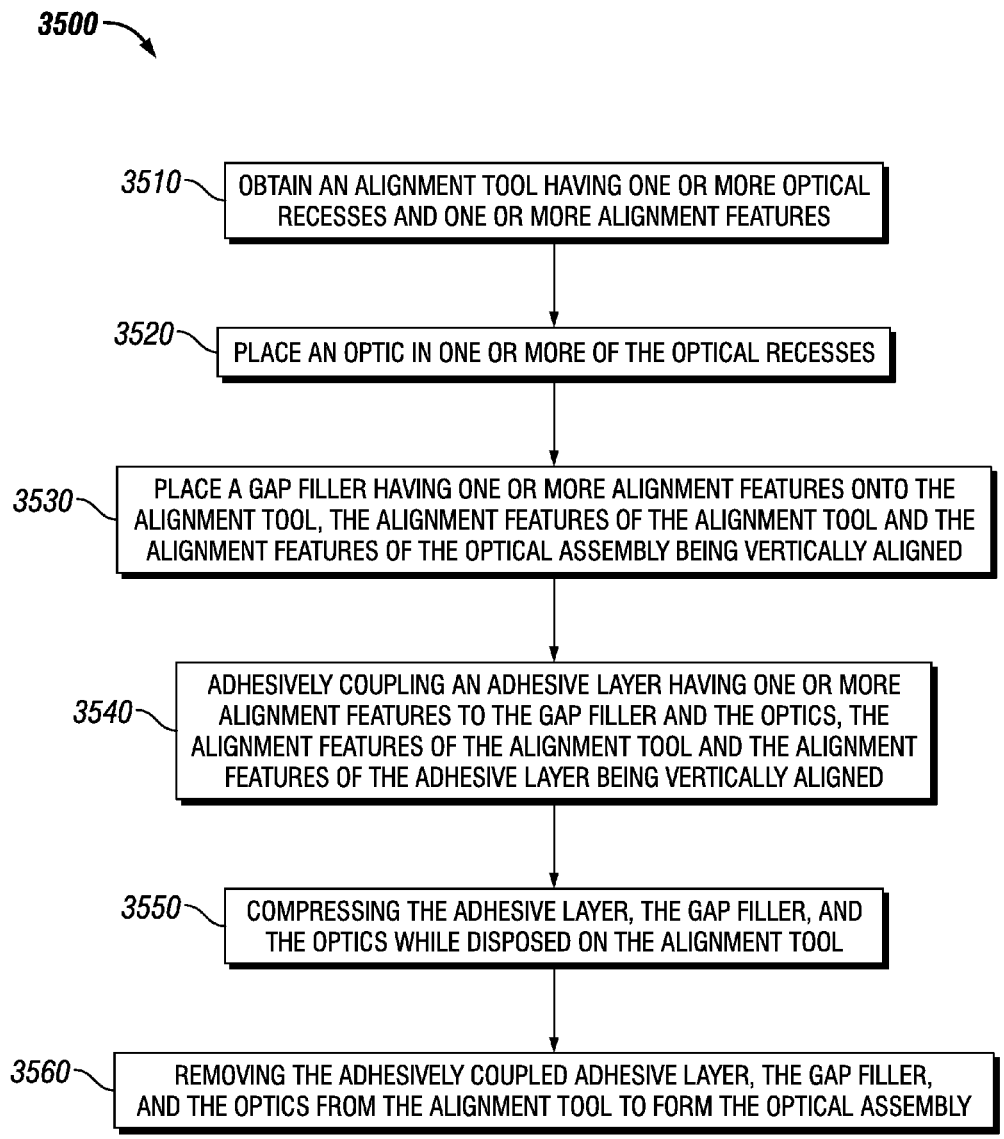
FIG. 35 illustrates a flowchart of a method for assembling an optical assembly in accordance with one exemplary embodiment of the invention.
Figure 36:
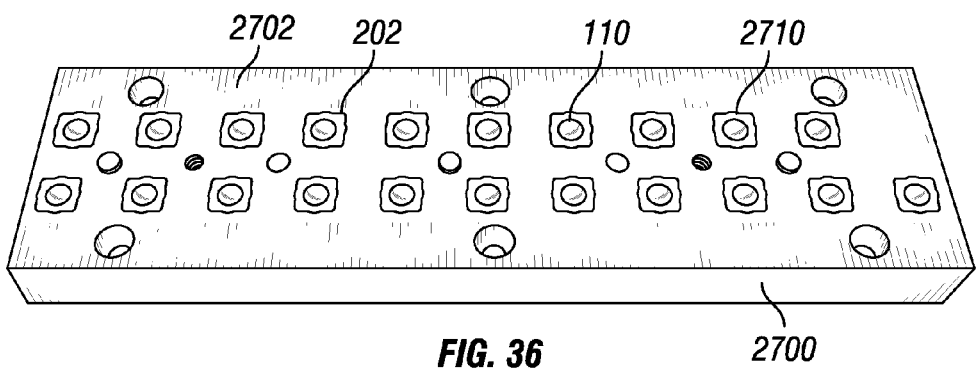
FIG. 36 shows an alignment tool with one or more optics disposed within the optical recesses in accordance with one exemplary embodiment.
Figure 37:
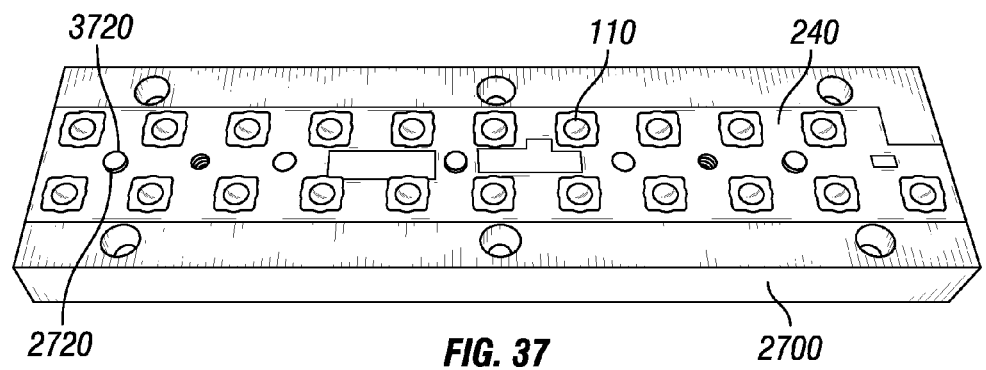
FIG. 37 shows a gap filler positioned on the alignment tool and surrounding the optics in accordance with one exemplary embodiment.
Figure 38:
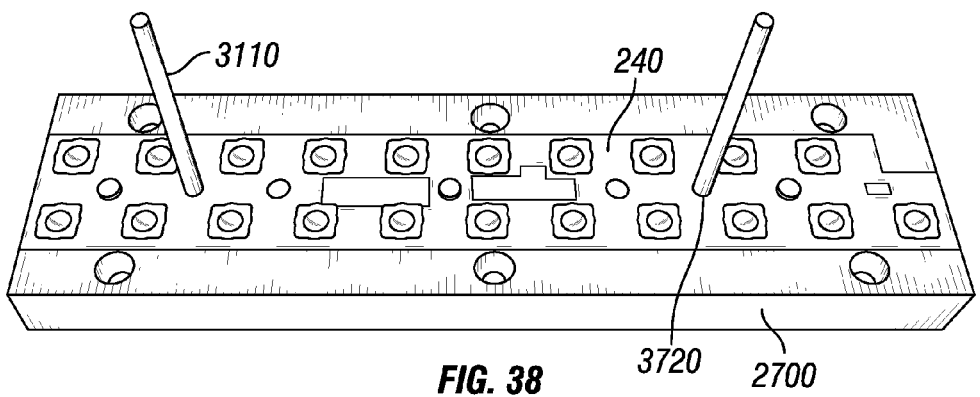
FIG. 38 shows an alignment device inserted through one or more alignment features of the gap filler and into the one or more vertically aligned alignment features of the alignment tool in accordance with an exemplary embodiment.
Figure 39:
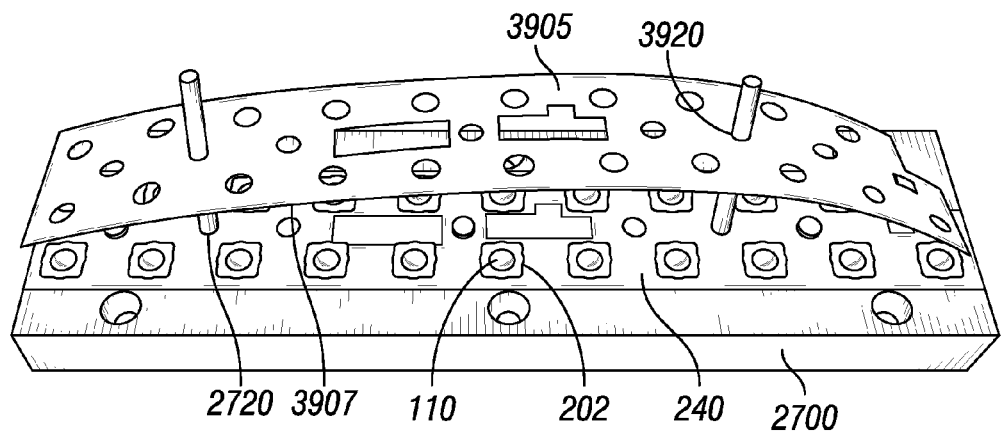
FIG. 39 shows an adhesive layer being adhesively coupled to the gap filler and the optics in accordance with one exemplary embodiment.
Figure 40:
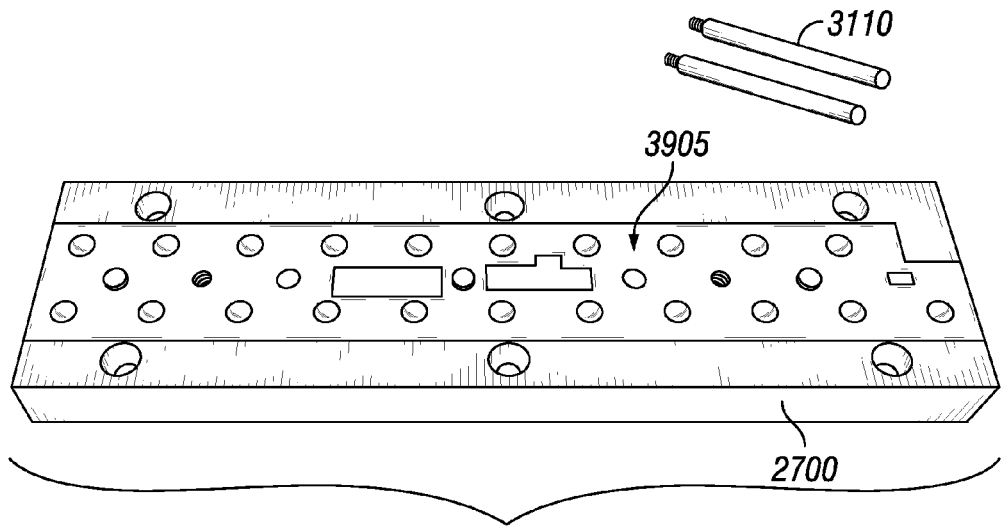
FIG. 40 shows the alignment device removed from the alignment tool in accordance with one exemplary embodiment.
Figure 41:
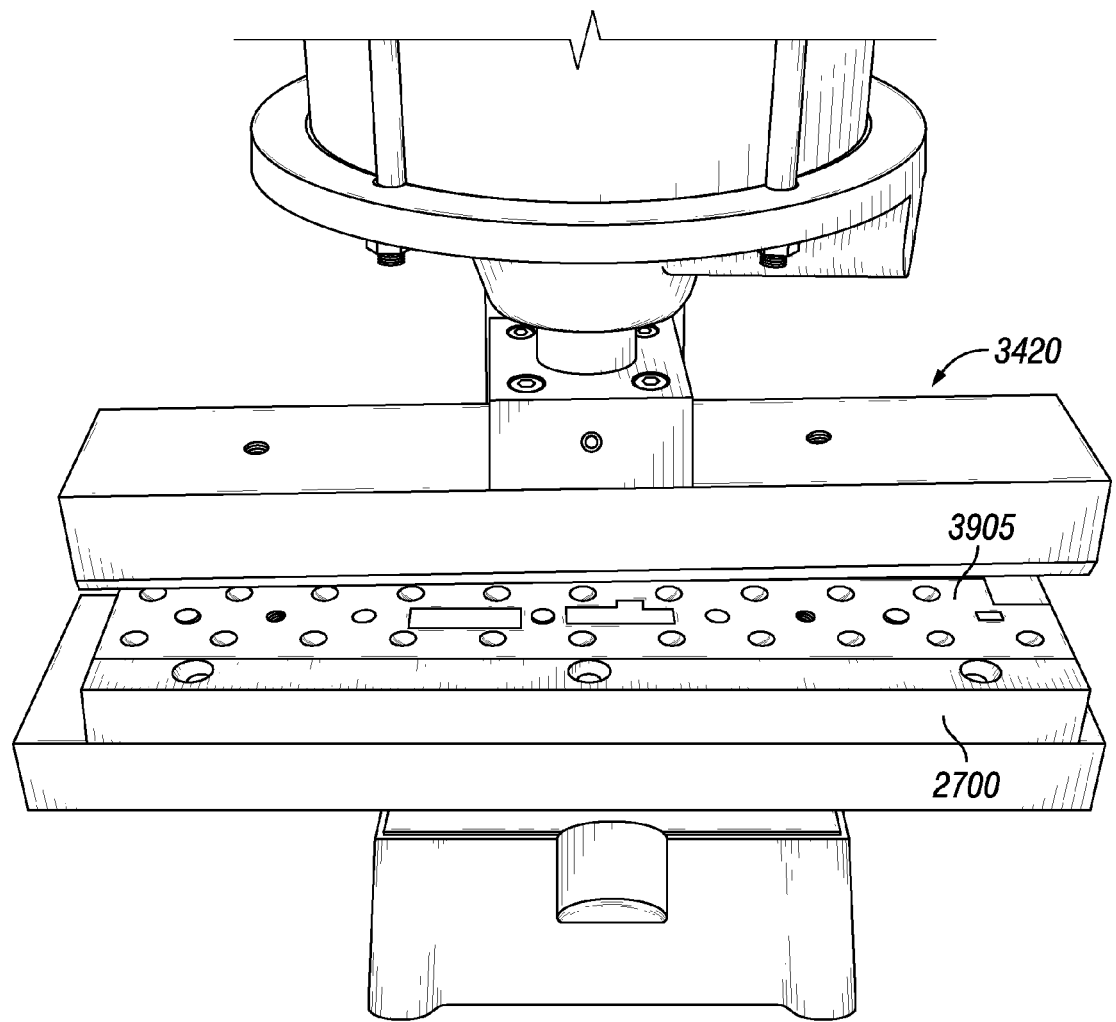
FIG. 41 shows the adhesively coupled adhesive layer, the gap filler, and the optics and the alignment tool being compressed in accordance with one exemplary embodiment.
Figure 42:
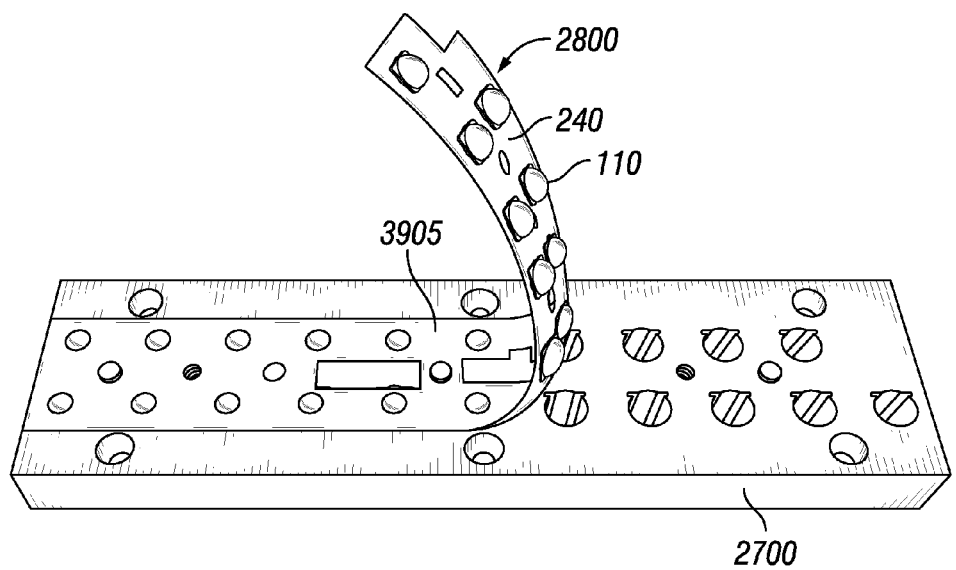
FIG. 42 shows an optical assembly being removed from the alignment tool in accordance with one exemplary embodiment.

FIG. 35 illustrates a flowchart of a method for assembling an optical assembly in accordance with one exemplary embodiment of the invention. FIG. 27 shows a perspective view of an alignment tool 2700 having one or more optical recesses 2710 and one or more alignment features 2720 in accordance with one exemplary embodiment. FIG. 28 shows a perspective view of an optical assembly 2800 in accordance with an exemplary embodiment. FIG. 36 shows an alignment tool 2700 with one or more optics 110 disposed within the optical recesses 2710 in accordance with one exemplary embodiment. FIG. 37 shows a gap filler 240 positioned on the alignment tool 2700 and surrounding the optics 110 in accordance with one exemplary embodiment. FIG. 38 shows an alignment device 3110 inserted through one or more alignment features 3720 of the gap filler 240 and into the one or more vertically aligned alignment features 2720 of the alignment tool 2700 in accordance with an exemplary embodiment. FIG. 39 shows an adhesive layer 3905 being adhesively coupled to the gap filler 240 and the optics 110 in accordance with one exemplary embodiment. FIG. 40 shows the alignment device 3110 removed from the alignment tool 2700 in accordance with one exemplary embodiment. FIG. 41 shows the adhesively coupled adhesive layer 3905, the gap filler 240, and the optics 110 and the alignment tool 2700 being compressed in accordance with one exemplary embodiment. FIG. 42 shows an optical assembly 2800 being removed from the alignment tool 2700 in accordance with one exemplary embodiment.

Referring to FIGS. 35-42, 27, and 28, the method begins at block 3510 where an alignment tool 2700 having one or more optical recesses 2710 and one or more alignment features 2720 is obtained. In one example, block 3510 is illustrated in FIG. 27. The alignment tool 2700 has been described above and will not be repeated again for convenience.

Next, block 3520 is invoked where an optic 110 is placed in one or more of the optical recesses 2710 of the alignment tool 2700. In one example, block 3520 is illustrated in FIG. 36. The optics 110 has been described above and will not be repeated again for convenience. The domed-part of the optic 110 is inserted face-down into the optical recess 2710 thereby having the flange portion 202 of the optic 110 lie at or adjacent the plane of the alignment tool's first surface 2702. According to some exemplary embodiments, the flange portion 202 is in the same plane as the first surface 2702. In some exemplary embodiments, an optic 110 is placed within each optical recess 2710 formed within the alignment tool 2700; however, in other exemplary embodiments, an optic 110 is not placed in at least one optical recess 2710.

Next, block 3530 is invoked where a gap filler 240 is placed on the first surface 202 of the alignment tool 2700 such that the gap filler 240 is disposed around the optics 110. In one example, block 3530 is illustrated in FIG. 37. The gap filler 240 has been described above and will not be repeated again for convenience. The gap filler 240 also includes one or more alignment features 3720 that are vertically aligned with the alignment features 2720 of the alignment tool 2700 once the gap filler 240 is placed on the alignment tool 2700.

One example of the alignment features 3720 of the gap filler 240 includes openings. In the exemplary embodiments where the alignment features 2720 of the alignment tool 2700 and the alignment features 3720 of the gap filler 240 are openings, the alignment features 2720, 3720 are positioned to be vertically aligned. In the exemplary embodiments where the alignment features 2720 of the alignment tool 2700 are a protrusion, rod, dowel, or other similar device and the alignment features 3720 of the gap filler 3720 are openings, the alignment features 2720 are inserted through a corresponding vertically aligned alignment feature 3720 of the gap filler 240. This vertical alignment of the alignment features 2720, 3720 and insertion of the optics 110 into the recesses 2710 facilitate proper orientation and alignment of the optics 110 once coupled to a PC board having one or more LEDs. According to some exemplary embodiments, block 3530 is optional.

In the exemplary embodiments where the alignment features 2720 of the alignment tool 2700 is an opening, an alignment device 3110, as shown in FIG. 38, is inserted through one or more alignment features 3720 of the gap filler 240, if used, and into the one or more vertically aligned alignment features 2720 of the alignment tool 2700. In some exemplary embodiments, the alignment features 2720 of the alignment tool 2700 are threaded and the alignment devices 3110 are screwed into the alignment features 2720.

Next, block 3540 is invoked where an adhesive layer 3905 is adhesively coupled to the gap filler 240, if used, and the flange portion 202 of the optics 110. In the exemplary embodiments where the gap filler 240 is not used, the adhesive layer 3905 is adhesively coupled to the flange portion 202 of the optics 110. Block 3540 is illustrated in FIG. 39. The adhesive layer 3905 is similar to the adhesive layers described above and will not be repeated again for convenience. An adhesive material 3930, which is similar to previously described adhesive materials, is exposed along a surface 3907 of the adhesive layer 3905. According to some exemplary embodiments, the adhesive material 3930 is already exposed. However, according to some other exemplary embodiments, the adhesive material 3930 is yet to be exposed. Although not illustrated and according to some exemplary embodiments, a backing material is removed from the surface 3907 of the adhesive layer 3905 to expose the adhesive material 3930, similar to that shown in FIG. 30. In the exemplary embodiments where the adhesive material 3930 is yet to be exposed, the backing material is peeled off. The adhesive layer 3905 also includes one or more alignment features 3920. When adhesively coupling the adhesive layer 3905 to the gap filler 240, the alignment features 3920 of the adhesive layer 3905 and the alignment features 2720 of the alignment tool 2700 are vertically aligned. According to some exemplary embodiments, the alignment features 3920 include openings. According to these exemplary embodiments, the alignment features 3920 are inserted around corresponding alignment features 2720 of the alignment tool 2700 or the alignment devices 3110 depending upon the exemplary embodiment. As the adhesive layer 3905 is adhesively coupled to the optics 110 and the gap filler 240, the adhesive layer 3905 is not yet hermetically sealed with the gap filler 240 and the optics 110 at this stage.

To prepare for the compression of the adhesive layer 3905 to the gap filler 240 and the optics 110, the alignment devices 3110, if used, are removed from the alignment tool 2700, as illustrated in FIG. 40. Next, block 3550 is invoked where the adhesive layer 3905, the gap filler 240, and the optics 110 are compressed while disposed on the alignment tool 2700. At this stage, the adhesive layer 3905 becomes hermetically sealed to the optics 110 and the gap filler 240, if used. In one example, block 3550 is illustrated in FIG. 41. According to one exemplary embodiment, the adhesively coupled adhesive layer 3905, the optics 110, and the gap filler 240, while disposed on the alignment tool 2700 are placed in the press unit 3420. The press unit 3420 provides a force onto the alignment tool 2700 which thereby hermetically seals the adhesive layer 3905 to the optics 110 and the gap filler 240.

The force provided by the press unit 3420 is a pneumatic force according to some exemplary embodiment, but can be other force types, such as a mechanical force, according to other exemplary embodiments.

Once the adhesive layer 3905 is compressed to the optics 110 and the gap filler 240, block 3560 is invoked where the adhesive layer 3905, the gap filler 240, and the optics 110 form the optical assembly 2800, which has been previously described. The optical assembly 2800 is removed from the alignment tool 2700. In one example, block 3560 is illustrated in FIG. 42. In some exemplary embodiments, the optical assembly 2800 is used within the method 2600 (FIG. 26) to form light bar 100 (FIG. 1).

The precision alignment of the optics onto the adhesive layer are performed in a repeatable manner. Although the process utilizes a combination of manual and machine performed steps, the steps are performable entirely manually, entirely by machine, or a combination of machine and manual steps, but differently than that described above in other exemplary embodiments. Although the blocks 3510, 3520, 3530, 3540, 3550 and 3560 are presented and described in a certain order, one or more of the blocks 3510, 3520, 3530, 3540, 3550 and 3560 are performed in a different order than that described according to other exemplary embodiments. The order in which the blocks 3510, 3520, 3530, 3540, 3550 and 3560 have been described are not meant to be limiting and should not be construed as such. Also, additional blocks having certain steps being performed can be included without departing from the scope and spirit of the exemplary embodiment.

Figure 43:
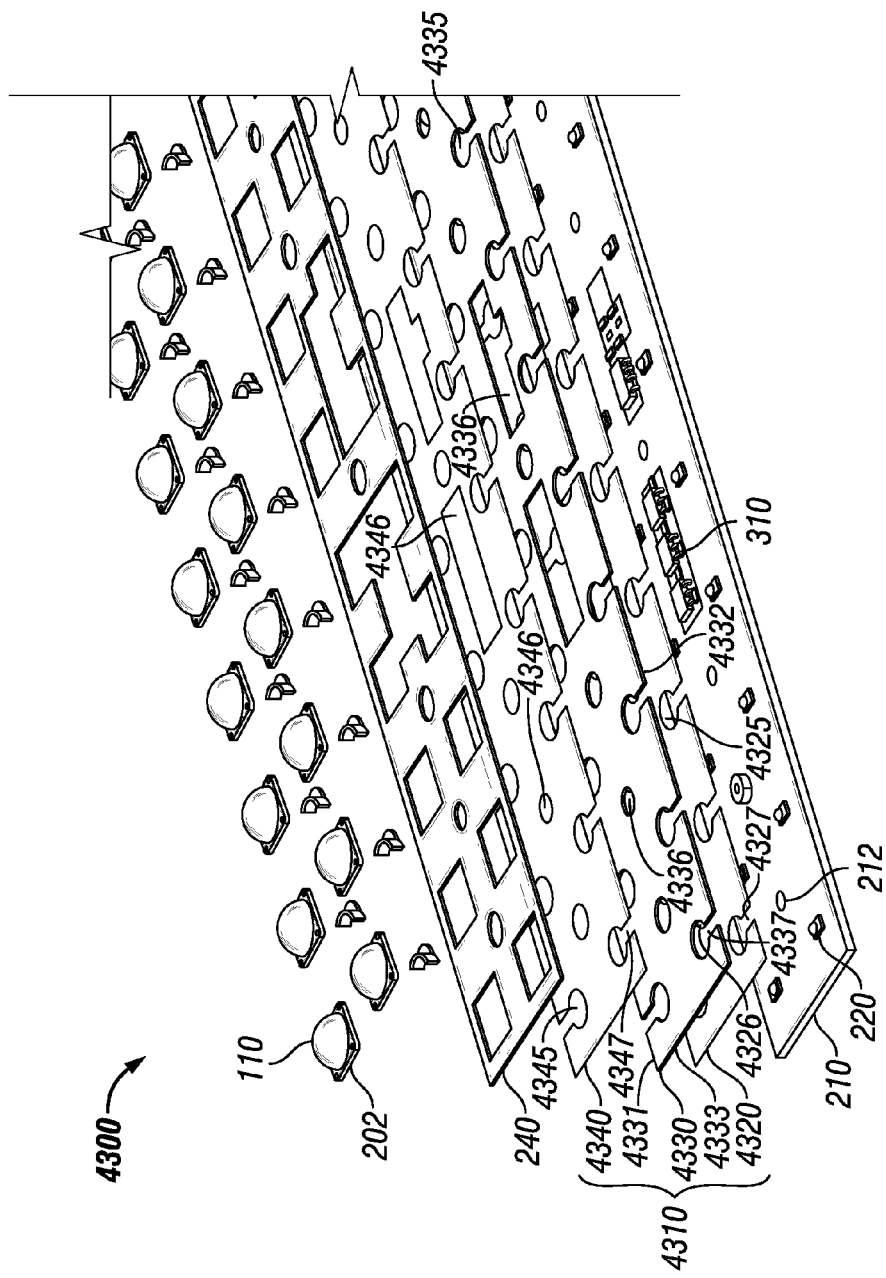
FIG. 43 is an exploded view of an LED light bar without the cover in accordance with another exemplary embodiment of the present invention.

FIG. 43 is an exploded view of an LED light bar 4300 without the cover 120 in accordance with another exemplary embodiment of the present invention. Referring now to FIG. 43, the exemplary LED light bar 4300 includes the PC board 210, one or more LEDs or LED die packages 220 mounted to the PC board 210, an adhesive layer 4310, the gap filler 240, and one or more optics 110. The construction of the LED light bar 4300 is similar in construction to the LED light bar 100 (FIG. 3) except that the construction of the adhesive layer 4310 is different than the construction of the adhesive layer 230 (FIG. 3). For the sake of brevity, the descriptions for each of components of the LED light bar 4300 which are similar to the components of the LED light bar 100 (FIG. 3) are not described again in detail below.

According to FIG. 43, the adhesive layer 4310 includes a sandwich of layers to adhere at least the flange portion 202 of one or more optics 110 that are disposed over each LED or LED die package 220 and the PC board 210. The adhesive layer 4310 includes three layers; however, greater or fewer number of layers are used to form the adhesive layer 4310 in other exemplary embodiments. The sandwich of layered materials includes a material layer 4330. According to some exemplary embodiments, this material layer 4330 is substantially rectangular in shape; however, the shape is of another geometric shape or non-geometric shape depending upon the shape of the light bar 4300 according to other exemplary embodiments. According to some exemplary embodiments, the material layer 4330 includes a first longitudinal edge 4331, a second longitudinal edge 4332 substantially parallel to the first longitudinal edge 4331, a first latitudinal edge 4333 extending from the end of the first longitudinal edge 4331 to the respective adjacent end of the second longitudinal edge 4332, and a second latitudinal edge (not shown) extending from the opposing end of the first longitudinal edge 4331 to the respective opposing end of the second longitudinal edge 4332. This material layer 4330 is fabricated using a non-gas-permeable material according to some exemplary embodiments. However, according to some exemplary embodiments, the material layer 4330 is fabricated using a gas-permeable layer, including, but not limited to, Tyvek®, high density polyethylene, burlap, canvas, and silicone. The material layer 4330 includes several first openings 4335 for receiving therethrough the LED or LED die packages 220. The material layer 4330 also includes several second openings 4336 for receiving therethrough the LED drivers 310 and for providing an opening about the apertures 212 in the PC board 210 for receiving screws 105 (FIG. 1). Further, the material layer 4330 includes one or more channels 4337 extending from each first opening 4335 to the edge 4331, 4332, and 4333 of the material layer 4330. According to some exemplary embodiments, the channels 4337 extend from each first opening 4335 to at least one of the first longitudinal edge 4331 or the second longitudinal edge 4332. The channels 4337 are formed in the material layer 4330 either when the material layer 4330 is formed or after the material layer 4330 is formed. For example, the channels 4337 are formed by cutting the material layer 4330.

The adhesive layer 4310 also includes a first adhesive material 4320 on the bottom side of the material layer 4330 and a second adhesive material 4340 on the top side of the material layer 4330. These adhesive materials 4320, 4340 are fabricated using a non-gas-permeable material according to some exemplary embodiments; however, a gas-permeable material, such as an acrylic adhesive or a silicone adhesive, are used to fabricate the adhesive materials 4320, 4340 according to other exemplary embodiments. The material used to fabricate the first adhesive material 4320 is the same material that is used to fabricate the second adhesive material 4340. However, the first adhesive material 4320 is fabricated using a different material than used to fabricate the second adhesive material 4340 according to other exemplary embodiments. In one exemplary embodiment, the adhesive materials 4320, 4340 are a viscous or semi-viscous material that is applied to the material layer 4330 and has substantially the same shape as the material layer 4330. For example, the material layer 4330 includes several first openings 4335 for receiving therethrough the LED or LED die packages 220, several second openings 4336 for receiving therethrough the LED drivers 310 and for providing an opening about the apertures 212 in the PC board 210 for receiving screws 105 (FIG. 1), and a channel 4337 extending from the first opening 4335 to an edge 4331, 4332, and 4333 of the material layer 4330. Thus, the application of the viscous or semi-viscous material on the material layer 4330 to form both the first and second adhesive materials 4320, 4340 also forms matching first openings 4325, 4345, matching second openings 4326, 4346, and matching channels 4327, 4347 in both the first adhesive material 4320 and the second adhesive material 4340, respectively. The first openings 4325, 4335, and 4345 are all vertically aligned. The second openings 4326, 4336, and 4346 are all vertically aligned. The channels 4327, 4337, and 4347 are all vertically aligned. In an alternative embodiment, the first and second adhesive materials 4320, 4340 are laminated onto the bottom side and the top side of the material layer 4330. After the first and second adhesive materials 4320, 4340 are applied onto the material layer 4330, they are die cut to provide first openings 4325, 4335, and 4345, the second openings 4326, 4336, and 4346, and the channels 4327, 4337, and 4347 in each of the adhesive materials 4320, 4340 and the material layer 4330. Although first openings 4325, 4335, and 4345 and second openings 4326, 4336, and 4346 are illustrated as being round-shaped, any of the first openings 4325, 4335, and 4345 and/or the second openings 4326, 4336, and 4346 can be any geometric or non-geometric shape according to other exemplary embodiments. Further, although channels 4327, 4337, and 4347 are illustrated as being substantially rectangular-shaped, the channels 4327, 4337, and 4347 can be any geometric or non-geometric shape according to other exemplary embodiments.

The first adhesive material 4320 on the bottom side of the material layer 4330 allows the material layer 4330 to adhere to the PC board 210. The second adhesive material 4340 on the top side of the material layer 4330 allows multiple optics 110 and a layer of the gap filler 240, if used, to adhere to the material layer 4330. The second adhesive material 4340 provides a seal around the perimeter of each optic 110. Those of ordinary skill in the art will recognize however, that the size and shape of the first openings 4325, 4335, and 4345 in the material layer 4330 and the adhesive materials 4320, 4340 can be adjusted based on the shape of the LED or LED die package 220 and the optic 110 being used in the particular lighting application. Although the adhesive layer 4310 of this exemplary embodiment is described with respect to the adhesive layer 230 (FIG. 3), the modification made to the adhesive layer 230 (FIG. 3) to form the adhesive layer 4310 is performable on the adhesive layers from any of the exemplary embodiments described above or below.

Figure 44:
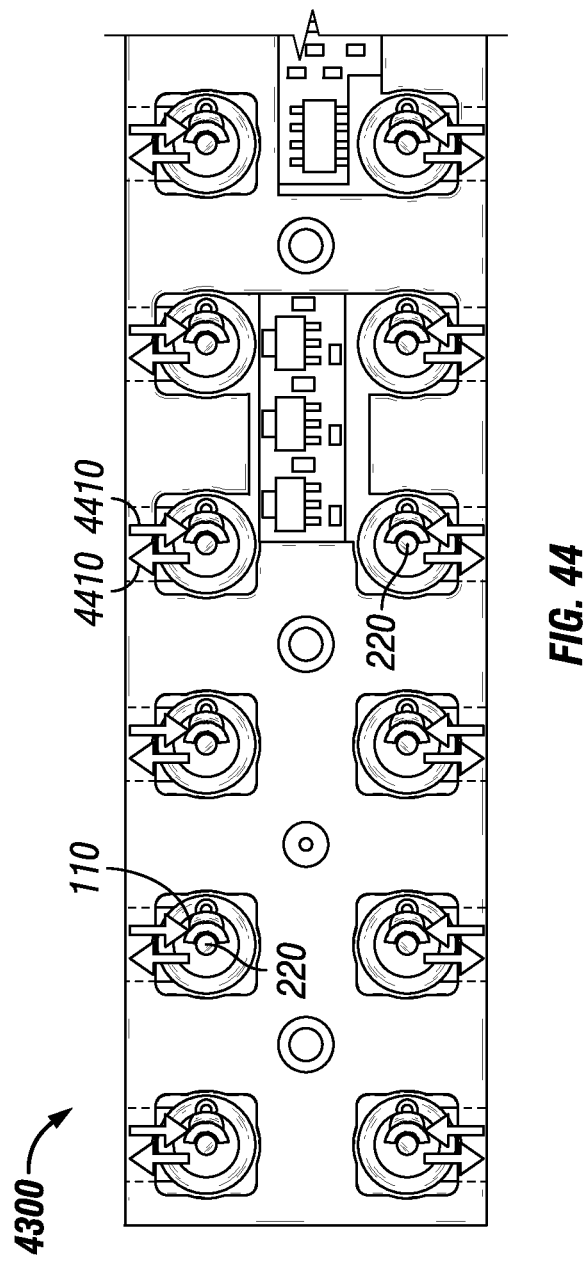
FIG. 44 is a top plan view of a portion of the LED light bar of FIG. 43 showing representative air paths between the LED die package and the outside environment in accordance with the exemplary embodiment of FIG. 43.

FIG. 44 is a top plan view of a portion of the LED light bar 4300 of FIG. 43 showing representative air paths 4410 between the LED die package 220 and the outside environment in accordance with the exemplary embodiment of FIG. 43. Referring now to FIGS. 43 and 44, when the LED or LED die package 220 that is mounted onto the PC board 210 is turned on, it generates heat. The build up of heat increases the pressure inside of the optic 110. As the pressure increases beyond the pressure of the outside environment, the air or gas inside of the optic 110, which may include contaminants, wants to move to an area of lower pressure, which includes the outside environment. The material layer 4330, the first adhesive material 4320, and the second adhesive material 4340 disposed about the LED or LED die package 220 provide a pathway for the air (and any airborne contaminants), also referred to as an air path 4410, to transition the air or gas from between the area under the optic 110 and the outside environment. In accordance with an exemplary embodiment where the adhesive layer 4310 is not air or gas-permeable, the air paths 4410 are oriented substantially horizontally through the channels 4327, 4337, and 4347. As shown in FIG. 44 and with reference to FIG. 43, for instance, the air moves laterally under the gap filler 240 and through the material layer 4330 to the perimeter of the light bar 4300 via the channels 4327, 4337, and 4347. The air (and any airborne contaminants) then exits the light bar 100.

It also is possible for air to flow in the opposite direction as shown in FIG. 44, from the outside environment into the area surrounding the LED or LED die package 220 under the optic 110. For example, when the LED or LED die package 220 is turned off, the LED or LED die package 220 cools and the area under the optic 110 also cools. This cooling results in a pressure drop inside the area under the optic 110, thereby drawing air towards the LED or LED die package 220. Air is able to flow from the outside environment to the LED or LED die package 220 in a manner substantially similar to, but in the reverse of that described above.

Figure 45:
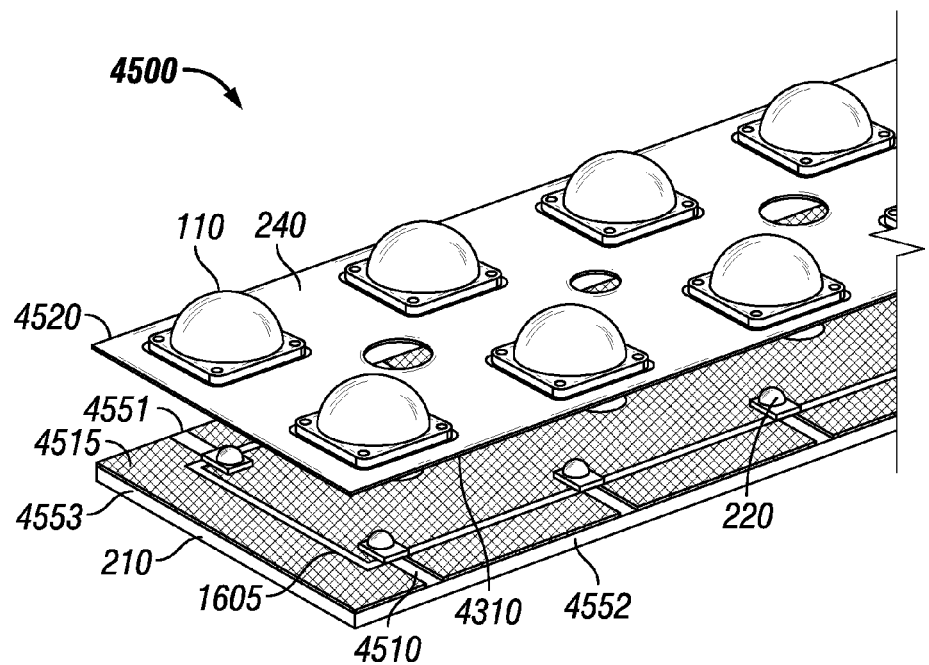
FIG. 45 is a partially exploded view of a portion of an LED light bar with one or more air channels in accordance with another exemplary embodiment of the present invention.

FIG. 45 is a partially exploded view of a portion of an LED light bar 4500 with one or more air channels 4510 in accordance with another exemplary embodiment of the present invention. Referring now to FIG. 45, the exemplary LED light bar 4500 includes the PC board 210, one or more layers of coating 4515 along the top surface of the PC board 210, one or more LEDs or LED die packages 220 mounted to the PC board 210, and a lens set 4520, which includes one or more optics 110. The construction of the LED light bar 4500 is similar in construction to the LED light bar 1600 (FIG. 16) except that the placement of the layers of coating 4515 on the top surface of the PC board 210 is different than placement of the layers of coating 1615 (FIG. 16) and the lens set 4520 is different than the lens set 1620 (FIG. 16). For the sake of brevity, the descriptions for each of components of the LED light bar 4500 which are similar to the components of the LED light bar 1600 (FIG. 16) are not described again in detail below.

According to some exemplary embodiments, the PC board 210 is substantially rectangular in shape; however, the shape is of another geometric shape or non-geometric shape depending upon the shape of the light bar 4500 according to other exemplary embodiments. According to some exemplary embodiments, the PC board 210 includes a first longitudinal edge 4551, a second longitudinal edge 4552 substantially parallel to the first longitudinal edge 4551, a first latitudinal edge 4553 extending from the end of the first longitudinal edge 4551 to the respective adjacent end of the second longitudinal edge 4552, and a second latitudinal edge (not shown) extending from the opposing end of the first longitudinal edge 4551 to the respective opposing end of the second longitudinal edge 4552. The first longitudinal edge 4551, the second longitudinal edge 4552, the first latitudinal edge 4553, and the second latitudinal edge are collectively referred to as edges of the PC board 220.

The PC board 210 also includes one or more LED drivers 310 (FIG. 3) that provide power to the LEDs or LED die packages 220 that are mounted to the PC board 210. In addition, the PC board 210 includes circuit traces 1605 electrically coupled to the LED driver 310 (FIG. 3) and the LEDs or LED die packages 220. The circuit traces 1605 transmit power and/or control signals from the LED driver 310 (FIG. 3) to the LEDs or LED die packages 220.

The PC board 210 also includes one or more layers of coating 4515 along the top surface of the PC board 210. According to some exemplary embodiments, the layers of coating 4515 includes a layer of solder mask. However, in alternative embodiments, the layers of coating 4515 includes conformal coating or other hard coatings known to people having ordinary skill in the art. In certain exemplary embodiments, multiple layers of solder mask 4515 are applied to the PC board 210. During application, portions of the PC board 210 are selectively coated using screen printing or other coating techniques to apply one or multiple layers of coating 4515. These portions are typically adjacent to the LEDs or LED die packages 220. By selectively applying the layers of coating 4515 to certain parts of the PC board 210, air channels 4510 are formed along the top surface of the PC board 210. These air channels 4510, in contrast from the air channels 1610 (FIG. 16), extend from each of the LEDs or LED die packages 220 to one or more edges 4551, 4552, and 4553 of the PC board 210. Alternatively, One or more of the air channels 4510 combine with one or more other air channels 4510 before extending to one or more edges 4551, 4552, and 4553 of the PC board 210 according to other exemplary embodiments.

The lens set 4520 is similar to the components used in FIG. 43 and includes the optics 110, the gap filler 240, and the adhesive layer 4310, which have been described with respect to FIG. 43 and also with respect to other exemplary embodiments. For the sake of brevity, these components are not described in detail again. The gap filler 240 is optional according to some exemplary embodiments. The channels 4327, 4337, and 4347 (FIG. 43) are vertically aligned with the respective air channels 4510. According to some exemplary embodiments, the channels 4327, 4337, and 4347 (FIG. 43) are not formed in the adhesive layer 4310 when used in this exemplary embodiment. Once the lens set 4520, either with or without the channels 4327, 4337, and 4347 (FIG. 43), is disposed on the layers of coating 4515, the air channels 4510 are completely formed and provide a direct fluid communication, which is along the surface of the PC board 210, for air to flow between the cavity of the optic 110 and the surrounding environment. The adhesive layer 4310 used in this exemplary embodiment can be constructed similarly to any of the previously described adhesive layers and can include greater or fewer layers according to other exemplary embodiments.

As shown in FIG. 45, when the LED or LED die package 220 that is mounted to the PC board 210 is turned on, it generates heat. The build up of heat increases the pressure inside of optic 110. As the pressure increases beyond the pressure of the outside environment, the air inside of the optic 110, which may include contaminants, wants to move to an area of lower pressure, which includes the outside environment. The air moves laterally along air path 4505 through the air channel 4510 until it reaches one of the edges 4551, 4552, 4553 of the PC board 210, where the air then escapes to the outside environment of the light bar 4500. It is also possible for air to flow in the opposite direction, from the outside environment to the area surrounding the LED or LED die package 220 under the optic 110.

Figure 46:
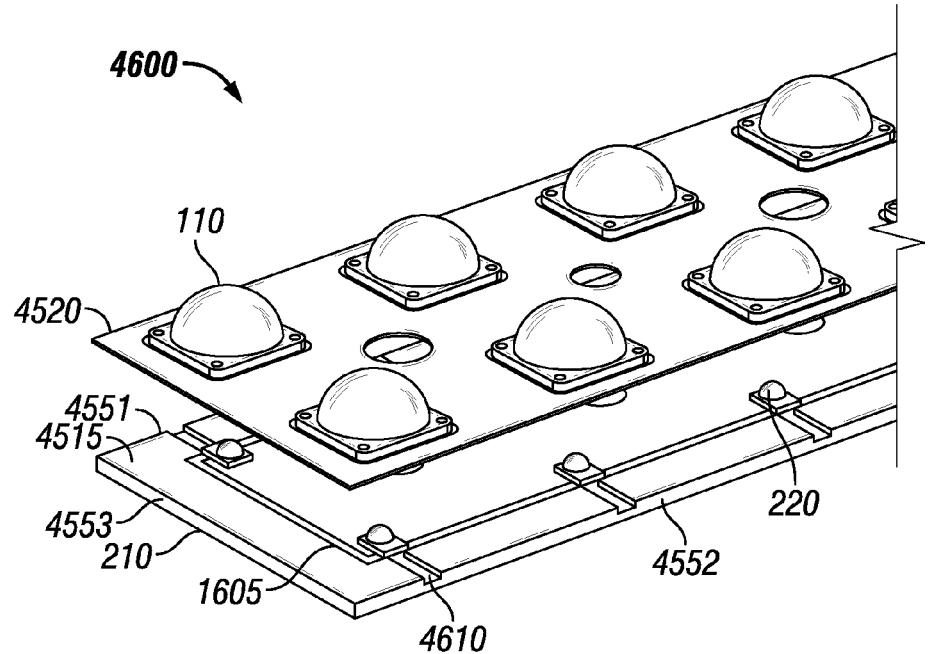
FIG. 46 is a partially exploded view of a portion of an LED light bar with one or more air channels in accordance with another exemplary embodiment of the present invention.

FIG. 46 is a partially exploded view of a portion of an LED light bar 4600 with one or more air channels 4610 in accordance with another exemplary embodiment of the present invention. Referring now to FIG. 46, the exemplary LED light bar 4600 includes the PC board 210, one or more LEDs or LED die packages 220 mounted to the PC board 210, and a lens set 4520, which includes one or more optics 110. The construction of the LED light bar 4600 is similar in construction to the LED light bar 1900 (FIG. 19) except that the placement of the etched air channels 4610 within the top surface of the PC board 210 is different than placement of the etched air channels 1905 (FIG. 19) and the lens set 4520 is different than the lens set 1620 (FIG. 19). For the sake of brevity, the descriptions for each of components of the LED light bar 4600 which are similar to the components of the LED light bar 1900 (FIG. 19) are not described again in detail below.

According to some exemplary embodiments, the PC board 210 is substantially rectangular in shape; however, the shape is of another geometric shape or non-geometric shape depending upon the shape of the light bar 4600 according to other exemplary embodiments. According to some exemplary embodiments, the PC board 210 includes a first longitudinal edge 4551, a second longitudinal edge 4552 substantially parallel to the first longitudinal edge 4551, a first latitudinal edge 4553 extending from the end of the first longitudinal edge 4551 to the respective adjacent end of the second longitudinal edge 4552, and a second latitudinal edge (not shown) extending from the opposing end of the first longitudinal edge 4551 to the respective opposing end of the second longitudinal edge 4552. The first longitudinal edge 4551, the second longitudinal edge 4552, the first latitudinal edge 4553, and the second latitudinal edge are collectively referred to as edges of the PC board 220.

The PC board 210 also includes one or more LED drivers 310 (FIG. 3) that provide power to the LEDs or LED die packages 220 that are mounted to the PC board 210. In addition, the PC board 210 includes circuit traces 1605 electrically coupled to the LED driver 310 (FIG. 3) and the LEDs or LED die packages 220. The circuit traces 1605 transmit power and/or control signals from the LED driver 310 (FIG. 3) to the LEDs or LED die packages 220.

The PC board 210 also includes one or more air channels 4610 photo-chemically, laser, or mechanically etched into the top surface of the PC board 210. These air channels 4610 are typically adjacent to the LEDs or the LED die packages 220 and extend outwardly from the LEDs or the LED die packages 220 and towards another LED or LED die package 220. According to some exemplary embodiments, the air channels 4610, in contrast from the air channels 1905 (FIG. 19), extend from each of the LEDs or LED die packages 220 to one or more edges 4551, 4552, and 4553 of the PC board 210. Alternatively, one or more of the air channels 4610 combine with one or more other air channels 4610 before extending to one or more edges 4551, 4552, and 4553 of the PC board 210 according to other exemplary embodiments. In some exemplary embodiments, the PC board 210 also includes one or more layers of coating 4515 along the top surface of the PC board 210 in conjunction with the etched air channels 4610. The layers of coating 4515 used in this exemplary embodiment are substantially similar to the layers of coating 4515 used in the embodiment described in FIG. 45 and will therefore not be described further.

The lens set 4520 is similar to the lens set 4520 used in the exemplary embodiment described in FIG. 45. For the sake of brevity, this component is not described in detail again. The lens set 4520 is modifiable according to the description provided with FIG. 45. Once the lens set 4520, either with or without the channels 4327, 4337, and 4347 (FIG. 43), is disposed on the top surface of the PC board 210, the air channels 4610 are completely formed and provide a direct fluid communication, which is substantially along the surface of the PC board 210, for air to flow between the cavity of the optic 110 and the surrounding environment.

The air flow within the air channels 4610 is similar to the air flow within the air channels 4510 (FIG. 45) of FIG. 45. In short, the air moves laterally along air path 4605 through the air channel 4610 until it reaches one of the edges 4551, 4552, 4553 of the PC board 210, where the air then escapes to the outside environment of the light bar 4600. It is also possible for air to flow in the opposite direction, from the outside environment to the area surrounding the LED or LED die package 220 under the optic 110.

One exemplary embodiment of the present invention includes a light module. The light module includes a plurality of light emitting diode (LED) die packages coupled to a circuit board. The LED die package includes an LED and a primary lens. The light module also includes at least one secondary lens. Each secondary lens is disposed over at least one LED of the plurality of LEDs. The secondary lens includes a flange extending from at least one side of the secondary lens. The light module also includes an over mold material disposed over at least a portion of the circuit board and at least a portion of the flange of each secondary lens. The over mold material hardens to fix the secondary lens in an optical alignment over the LED die package. In certain other exemplary embodiments, the flange extending from at least one side of the secondary lens includes at least one bonding enhancement feature. In another exemplary embodiment, the bonding enhancement feature is positioned on at least the top side of the flange. In another exemplary embodiment, the bonding enhancement feature is positioned on at least the bottom side of the flange. In yet another exemplary embodiment, the bonding enhancement feature includes at least one of a coarse surface, a groove, and a notch.

Another exemplary embodiment of the present invention includes a method of manufacturing a light module. The method includes providing a plurality of light emitting diode (LED) die packages coupled to a circuit board. The LED die package includes an LED and a primary lens. The method also includes providing at least one secondary lens, where each secondary lens is disposed over at least one LED of the plurality of LEDs. The secondary lens includes a flange extending from at least one side of the secondary lens. The method also includes injecting an over mold material over at least a portion of the circuit board and at least a portion of the flange of each secondary lens. The over mold material hardens to fix the secondary lens in an optical alignment over the LED die package. In certain other exemplary embodiments, the over mold material is injected at a temperature that is above the melting point of the over mold material and under a critical temperature of the secondary lens.

Another exemplary embodiment of the present invention includes a method of manufacturing a light module. The method includes providing a plurality of light emitting diode (LED) die packages coupled to a circuit board. The LED die package includes an LED and a primary lens. The method also includes providing at least one secondary lens. The secondary lens is disposed over at least one LED of the plurality of LEDs. The secondary lens includes a flange extending from at least one side of the secondary lens. The method also includes depositing an adhesive layer between the circuit board and the secondary lens. The adhesive layer fixes the secondary lens in an optical alignment over the LED die package. In another exemplary embodiment, the flange includes one or more protrusions extending away from the flange. The protrusions provide spacing between the LED die package and the secondary lens. In other exemplary embodiments, the adhesive layer includes a gas-permeable layer.

Another exemplary embodiment of the present invention includes a light module. The light module includes a plurality of light emitting diodes (LEDs) coupled to a circuit board. The light module also includes at least one lens. Each lens is disposed over at least one LED of the plurality of LEDs. The lens includes a flange extending from at least one side of the lens. The light module also includes a first layer between the circuit board and each lens. The first layer further includes a plurality of first openings. Each first opening is configured to be disposed around at least a portion of one of the LEDs. The first layer also includes a plurality of first apertures. Each first aperture is in fluid communication with one of the first openings and extends outside of a footprint of the lens disposed over the associated first opening. The light module also includes a second layer between the first layer and the lens. The second layer further includes a plurality of second openings. Each second opening is configured to be disposed around at least a portion of one of the LEDs and is substantially vertically aligned with one of the plurality of first openings. The second layer also includes a plurality of third openings. Each third opening is vertically aligned with and is in fluid communication with at least one of the first apertures. The light module also includes a first adhesive material disposed between the first layer and the circuit board. The first adhesive material adheres the first layer to the circuit board. The light module also includes a second adhesive material disposed between the first layer and the second layer. The second adhesive material adheres the first and second layers together. The light module also includes a third adhesive material disposed above the second layer. In some exemplary embodiments, the first layer and the second layer include polymer film. In another exemplary embodiment, the light module further includes a gap filler disposed adjacent to at least a portion of the flange extending from at least one side of the lens and adhered to the second layer with the third adhesive material. In another exemplary embodiment, the gap filler is gas-permeable. In another exemplary embodiment, the gap filler includes a non-woven material. In some exemplary embodiments, at least one of the first, second, and third adhesive materials include at least one of a silicone adhesive material and an acrylic adhesive material. In another exemplary embodiment, the first, second, and third adhesive layers include a deposited adhesive silicone material. In another exemplary embodiment, the first, second, and third adhesive materials are the same. In another exemplary embodiment, at least one of the first, second, and third adhesive materials is different.

Another exemplary embodiment of the present invention includes a light module. The light module includes a circuit board that includes a top surface. The light module also includes a conformal coating applied to a portion of the top surface of the circuit board. The application of the coating to only a portion of the circuit board creates at least one air channel on the top surface of the circuit board. The light module also includes a plurality of light emitting diodes (LEDs) coupled to the circuit board. The light module also includes at least one lens. Each lens is disposed over at least one LED of the plurality of LEDs. The lens includes a lens cavity and a flange extending from at least one side of the lens. At least one lens cavity is in fluid communication with at least one of the air channels. The light module also includes a first layer disposed between the circuit board and each lens. The first layer includes a plurality of first openings. Each first opening is configured to be disposed around at least a portion of one of the LEDs. The first layer also includes a plurality of second openings. Each second opening is vertically aligned with and is in fluid communication with at least one of the air channels. The light module also includes a first adhesive material disposed between the first layer and the circuit board. The first adhesive material adheres the first layer to the conformal coating on the top surface of the circuit board. The light module also includes a second adhesive material disposed above the first layer. In another exemplary embodiment, the first layer includes polymer film. In another exemplary embodiment, air flows between the lens cavity and an outside environment, through one of the air channels and one of the second openings. In another exemplary embodiment, the light module further includes a gap filler disposed adjacent at least a portion of the flange extending from at least one side of the lens and adhered to the first layer with the second adhesive material. In another exemplary embodiment, the gap filler includes a non-woven material. In another exemplary embodiment, at least one of the first and second adhesive materials includes at least one of a silicone adhesive material and an acrylic adhesive material. In another exemplary embodiment, the first and second adhesive materials include a deposited adhesive silicone material. In another exemplary embodiment, the conformal coating includes solder mask. In another exemplary embodiment, the first and second adhesive materials are the same. In another exemplary embodiment, at least one of the first and second adhesive materials is different.

Another exemplary embodiment of the present invention includes a light module. The light module includes a circuit board that includes a top surface. The light module also includes at least one air channel etched into the top surface of the circuit board. The light module also includes a plurality of light emitting diodes (LEDs) coupled to the circuit board. The light module also includes at least one lens. Each lens is disposed over at least one LED of the plurality of LEDs. The lens includes a lens cavity and a flange extending from at least one side of the lens. At least one lens cavity is in fluid communication with at least one of the air channels. The light module also includes a first layer disposed between the circuit board and each lens. The first layer includes a plurality of first openings. Each first opening is configured to be disposed around at least a portion of one of the LEDs. The first layer also includes a plurality of second openings. Each second opening is vertically aligned with and is in fluid communication with at least one of the air channels. The light module also includes a first adhesive material disposed between the first layer and the circuit board. The first adhesive material adheres the first layer to the top surface of the circuit board. The light module also includes a second adhesive material disposed above the first layer. In another exemplary embodiment, the air flows between the lens cavity and an outside environment, through one of the air channels and one of the second openings. In another exemplary embodiment, the light module further includes a gap filler disposed adjacent to at least a portion of the flange extending from at least one side of the lens and adhered to the first layer with the second adhesive material.

Another exemplary embodiment of the present invention includes a method of manufacturing an optical assembly. The method includes providing an alignment tool including one or more optical recesses and one or more first alignment features. The method also includes inserting an optic into one or more of the optical recesses. The method also includes adhesively coupling an adhesive layer that includes one or more second alignment features to the optics. The first alignment features and the second alignment features are substantially vertically aligned. The method also includes compressing the adhesive layer to at least the optics. The method also includes removing at least the compressed adhesive layer and the optics from the alignment tool. In another exemplary embodiment, the method further includes placing a gap filler onto the alignment tool before adhesively coupling the adhesive layer to the optics. The gap filler includes one or more third alignment features. The first alignment features and the third alignment features are substantially vertically aligned. In certain other exemplary embodiments, the first alignment features include openings. In another exemplary embodiment, the method further includes inserting an alignment device into at least one first alignment feature. The alignment device extends through the second alignment features. In another exemplary embodiment, the first alignment features include at least one of a rod, a pin, a dowel, or a protrusion.

Another exemplary embodiment of the present invention includes a method of manufacturing a light module. The method includes providing an alignment tool that includes one or more optical recesses and one or more first alignment features. The method also includes placing an optical assembly into the alignment tool. The optical assembly includes one or more second alignment features and one or more optics coupled to at least an adhesive layer. Each optic is inserted into a corresponding optical recess. The first and second alignment features are substantially vertically aligned. The method also includes adhesively coupling a circuit board that includes one or more third alignment features to the adhesive layer of the optical assembly. The first, second, and third alignment features are substantially vertically aligned. The method also includes compressing the circuit board to at least the optical assembly. In certain other exemplary embodiments, the optical assembly further includes a gap filler. In another exemplary embodiment, the first alignment features include openings. In another exemplary embodiment, the method further includes inserting an alignment device into at least one first alignment feature. The alignment device extends through each of the second and third alignment features. In another exemplary embodiment, the first alignment features include at least one of a rod, a pin, a dowel, and a protrusion. In another exemplary embodiment, the method further includes removing the adhesively coupled circuit board and optical assembly from the alignment tool. The method further includes placing the adhesively coupled circuit board and optical assembly on a compression tool. In certain other exemplary embodiments, the compression tool is fabricated using a compressible material.

Another exemplary embodiment of the present invention includes an alignment tool. The alignment tool includes a platform having a top surface. The platform includes one or more alignment features positioned on the top surface. The platform also includes one or more optical recesses positioned along the top surface. The one or more optical recesses are configured to receive an optic. In another exemplary embodiment, the alignment features include openings. Each opening is configured to receive an alignment device. In another exemplary embodiment, the alignment features include at least one of a rod, a dowel, a pin, and a protrusion that extends substantially perpendicularly to the top surface.

Although each exemplary embodiment has been described in detail, it is to be construed that any features and modifications that are applicable to one embodiment are also applicable to the other embodiments. Furthermore, although the invention has been described with reference to specific embodiments, these descriptions are not meant to be construed in a limiting sense. Various modifications of the disclosed embodiments, as well as alternative embodiments of the invention will become apparent to persons of ordinary skill in the art upon reference to the description of the exemplary embodiments. It should be appreciated by those of ordinary skill in the art that the conception and the specific embodiments disclosed may be readily utilized as a basis for modifying or designing other structures or methods for carrying out the same purposes of the invention. It should also be realized by those of ordinary skill in the art that such equivalent constructions do not depart from the spirit and scope of the invention as set forth in the appended claims. It is therefore, contemplated that the claims will cover any such modifications or embodiments that fall within the scope of the invention.

What is claimed is:

1. A light module, comprising:
    a plurality of light emitting diodes (LEDs) coupled to a circuit board;
    at least one lens, each lens disposed over at least one LED of the plurality of LEDs, wherein the lens includes a flange extending from at least one side of the lens; and
    an adhesive layer between the circuit board and the lens, wherein the adhesive layer fixes the lens in an optical alignment over the corresponding LED, and wherein the adhesive layer comprises a gas-permeable layer.

2. The light module of claim 1, wherein the adhesive layer comprises a deposited adhesive material.

3. The light module of claim 2, wherein the adhesive material is silicone.

4. The light module of claim 1, wherein the plurality of LEDs comprise an array of LED die packages.

5. The light module of claim 4, wherein the light module is coupled to a light fixture housing.

6. The light module of claim 1, further comprising a cover, the cover comprising one or more apertures, each aperture allowing at least a portion of the at least one lens to extend therethrough.

7. The light module of claim 1, wherein the adhesive layer comprises:

a first adhesive material disposed on the bottom side; and
a second adhesive material disposed on the top side,
wherein the gas-permeable layer comprises a top side and a bottom side, and is disposed between the circuit board and each lens.

8. The light module of claim 1, wherein the adhesive layer comprises at least one of a silicone adhesive material and an acrylic adhesive material.

9. A light module, comprising:
a plurality of light emitting diodes (LEDs) coupled to a circuit board;
at least one lens, each lens disposed over at least one LED of the plurality of LEDs, wherein the lens includes a flange extending from at least one side of the lens; and
an adhesive layer between the circuit board and the lens, wherein the adhesive layer fixes the lens in an optical alignment over the corresponding LED;
wherein the lens comprises a mirror portion.

10. A light module, comprising:
a plurality of light emitting diodes (LEDs) coupled to a circuit board;
at least one lens, each lens disposed over at least one LED of the plurality of LEDs, wherein the lens includes a flange extending from at least one side of the lens;
an adhesive layer between the circuit board and the lens, wherein the adhesive layer fixes the lens in an optical alignment over the corresponding LED; and
a gap filler, wherein the gap filler is coupled to the adhesive layer and surrounds the flange portion extending from at least one side of the lens.

11. A light module, comprising:
a plurality of light emitting diodes (LEDs) coupled to a circuit board;
at least one lens, each lens disposed over at least one LED of the plurality of LEDs, wherein the lens includes a flange extending from at least one side of the lens; and
an adhesive layer between the circuit board and the lens, wherein the adhesive layer fixes the lens in an optical alignment over the corresponding LED;
wherein the adhesive layer comprises:
a tape layer comprising a top side and a bottom side, the tape layer disposed between the circuit board and each lens;
a first adhesive material disposed on the bottom side; and
a second adhesive material disposed on the top side.

12. The light module of claim 11, wherein the tape layer further comprises a first portion and a second portion, the second portion extending longitudinally along a generally central portion of the light module, the first portion disposed along each longitudinal side of the second portion and along each longitudinal edge of the light module, the first portion being more gas-permeable than the second portion.

13. The light module of claim 11, wherein the adhesive layer further comprises:
a second layer between each LED and lens; and
a third adhesive material disposed above the second layer,
wherein the tape layer further comprises:
a plurality of first openings, each first opening configured to be disposed around at least a portion of one of the LEDs; and
a plurality of first apertures, each first aperture in fluid communication with one of the first openings and extending outside of a footprint of the lens disposed over the associated first opening;
wherein the second layer further comprises:
a plurality of second openings, each second opening configured to be disposed around at least a portion of one of the LEDs and substantially vertically aligned with one of the plurality of first openings; and
a plurality of third openings, each third opening vertically aligned with and in fluid communication with at least one of the first apertures;
wherein the first adhesive material is disposed between the tape layer and the circuit board, and adheres the tape layer to the circuit board; and
wherein the second adhesive material is disposed between the tape layer and the second layer, and adheres the tape layer to the second layer.

14. A method of manufacturing a light module, comprising:
providing a plurality of light emitting diode (LED) die packages coupled to a circuit board, wherein the LED die package comprises an LED and a primary lens;
providing at least one secondary lens, each secondary lens disposed over at least one LED of the plurality of LEDs, wherein the secondary lens includes a flange extending from at least one side of the secondary lens;
providing an adhesive layer between the circuit board and the secondary lens, wherein the adhesive layer fixes the secondary lens in an optical alignment over the LED die package.

15. The method of claim 14, wherein the adhesive layer comprises a gas-permeable layer.

16. A light module, comprising:
a plurality of light emitting diodes (LEDs) coupled to a circuit board;
at least one lens, each lens disposed over at least one LED of the plurality of LEDs, wherein the lens includes a flange extending from at least one side of the lens; and
a gas-permeable layer disposed between the circuit board and each lens, wherein the gas-permeable layer further comprises a top side and a bottom side, the bottom side comprising a first adhesive material and the top side comprising a second adhesive material;
wherein the first adhesive material on the bottom side adheres the gas-permeable layer to the circuit board and the second adhesive material on the top side fixes the lens in an optical alignment over the corresponding LED.

17. The light module of claim 16, wherein the gas-permeable layer comprises silicone.

18. The light module of claim 16, wherein the first adhesive material and the second adhesive material are the same.

19. The light module of claim 16, further comprising a gap filler disposed adjacent at least a portion of the flange extending from at least one side of the lens and adhered to the second adhesive material on the top side of the gas-permeable layer.

20. The light module of claim 19, wherein the gap filler is high density polyethylene film.

21. The light module of claim 19, wherein the gap filler is gas-permeable.

22. The light module of claim 16, wherein the gas-permeable layer comprises a deposited adhesive silicone material.

23. The light module of claim 16, wherein the plurality of LEDs comprise an array of LED die packages.

24. The light module of claim 16, wherein the light module is coupled to a light fixture housing.

25. The light module of claim 16, further comprising a cover, the cover comprising one or more apertures, each aperture allowing at least a portion of one or more lenses to extend therethrough.

26. The light module of claim 16, wherein at least one of the first adhesive material and the second adhesive material comprises at least one of a silicone adhesive material and an acrylic adhesive material.

27. A light module, comprising:
- a plurality of light emitting diodes (LEDs) coupled to a circuit board;
- at least one lens, each lens disposed over at least one LED of the plurality of LEDs, wherein the lens includes a flange extending from at least one side of the lens; and
- a tape layer disposed between the circuit board and each lens, wherein the tape layer further comprises a top side and a bottom side, the bottom side comprising a first adhesive material and the top side comprising a second adhesive material;
- wherein the first adhesive adheres the tape layer to the circuit board.

28. The light module of claim 27, wherein the tape layer comprises a first portion and a second portion, wherein the first portion is more gas-permeable than the second portion.

29. The light module of claim 28, wherein the second portion extends longitudinally along a generally central portion of the light module and wherein the first portion is disposed along each longitudinal side of the second portion and along each longitudinal edge of the light module.

30. The light module of claim 28, wherein the first portion comprises gas-permeable tape.

31. The light module of claim 30, wherein the first portion comprises TESA tape.

32. The light module of claim 28, wherein the first portion comprises non-woven fabric tape.

33. The light module of claim 28, wherein the second portion comprises glass fiber tape.

34. The light module of claim 27, further comprising a gap filler disposed adjacent at least a portion of the flange extending from at least one side of the lens and adhered to the second adhesive material on the top side of the tape layer.

35. The light module of claim 34, wherein the gap filler comprises high density polyethylene film.

36. The light module of claim 34, wherein the gap filler is gas-permeable.

37. The light module of claim 27, wherein at least one of the first adhesive material and the second adhesive material comprises at least one of a silicone adhesive material and an acrylic adhesive material.

38. The light module of claim 37, wherein the second adhesive material comprises a deposited adhesive silicone material.

39. The light module of claim 27, wherein the tape layer comprises non-woven fabric tape.

40. The light module of claim 27, wherein the tape layer comprises gas-permeable tape.

41. The light module of claim 40, wherein the gas-permeable tape comprises TESA tape.

42. A light module, comprising:
- a circuit board comprising a top surface;
- a plurality of light emitting diodes (LEDs) coupled to the circuit board;
- at least one lens, each lens disposed over at least one LED of the plurality of LEDs, wherein the lens comprises a lens cavity;
- an adhesive layer disposed between the circuit board and each lens, wherein the adhesive layer comprises a plurality of first openings, each first opening configured to be disposed substantially around at least a portion of one of the LEDs; and
- at least one air channel formed substantially along the top surface of the circuit board, the air channels extending from at least one lens cavity to an edge of the light module, the air channels providing fluid communication between at least one lens cavity and an outside environment located exterior to the light module.

43. The light module of claim 42, wherein one or more air channels are etched into the circuit board.

44. The light module of claim 42, further comprising a conformal coating applied to a portion of the top surface of the circuit board, wherein the application of the coating to only a portion of the circuit board creates at least one of the air channels on the top surface of the circuit board.

45. The light module of claim 42, wherein at least one of the air channels is formed in the adhesive layer and extends from at least one of the first openings to an edge of the adhesive layer.

* * * * *